US012588337B2

(12) United States Patent
Bok et al.

(10) Patent No.: US 12,588,337 B2
(45) Date of Patent: Mar. 24, 2026

(54) DISPLAY DEVICE AND TILED DISPLAY DEVICE

(71) Applicant: Samsung Display Co., LTD., Yongin-si (KR)

(72) Inventors: Seung Lyong Bok, Hwaseong-si (KR); Hyun Joon Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 659 days.

(21) Appl. No.: 17/964,540

(22) Filed: Oct. 12, 2022

(65) Prior Publication Data

US 2023/0246147 A1 Aug. 3, 2023

(30) Foreign Application Priority Data

Jan. 28, 2022 (KR) ........................ 10-2022-0013404
Mar. 22, 2022 (KR) ........................ 10-2022-0035150

(51) Int. Cl.
| | |
|---|---|
| *H10H 20/857* | (2025.01) |
| *G09F 9/302* | (2006.01) |
| *G09F 9/33* | (2006.01) |
| *H01L 25/075* | (2006.01) |
| *H10H 20/831* | (2025.01) |
| *H10H 29/14* | (2025.01) |

(52) U.S. Cl.
CPC ......... *H10H 20/857* (2025.01); *G09F 9/3026* (2013.01); *G09F 9/33* (2013.01); *H01L 25/0753* (2013.01); *H10H 20/8312* (2025.01); *H10H 29/142* (2025.01)

(58) Field of Classification Search
CPC .............................. G09G 3/3233; G09G 3/32
See application file for complete search history.

(56) References Cited

U.S. PATENT DOCUMENTS

| | | | | |
|---|---|---|---|---|
| 7,592,975 B2 * | 9/2009 | Yamazaki | ............ | G09G 3/3233 |
| | | | | 345/67 |
| 8,598,582 B2 | 12/2013 | Choi et al. | | |
| 8,760,374 B2 * | 6/2014 | Osame | ................ | G09G 3/3283 |
| | | | | 345/82 |
| 10,902,770 B2 | 1/2021 | Iguchi et al. | | |

(Continued)

FOREIGN PATENT DOCUMENTS

| | | |
|---|---|---|
| CN | 110570809 A | 12/2019 |
| CN | 113920887 A | 1/2022 |

(Continued)

OTHER PUBLICATIONS

Partial European Search Report dated Jun. 26, 2023 for corresponding European Application No. EP 23152182.4 (15 pages).

*Primary Examiner* — Kevin M Nguyen
(74) *Attorney, Agent, or Firm* — Womble Bond Dickinson (US) LLP

(57) ABSTRACT

A display device includes a plurality of sub-pixels, wherein a sub-pixel of the plurality of sub-pixels includes: a first pad electrode and a second pad electrode on the substrate and spaced from each other in a plan view; a light emitting device on the first pad electrode and the second pad electrode; and a first inspection transistor overlapping the first pad electrode in a thickness direction of the substrate, wherein the first inspection transistor overlaps the light emitting device in the thickness direction of the substrate.

28 Claims, 53 Drawing Sheets

REL: PSUB, NSEM, MQW, PSEM, AE, CE

(56)     References Cited

U.S. PATENT DOCUMENTS

| | | | |
|---|---|---|---|
| 10,937,815 | B2 | 3/2021 | Kang et al. |
| 11,004,753 | B2 | 5/2021 | Liu et al. |
| 2020/0395348 | A1 | 12/2020 | Kwag et al. |
| 2021/0004105 | A1 | 1/2021 | Afentakis |
| 2021/0005588 | A1 | 1/2021 | Chung et al. |
| 2021/0358897 | A1 | 11/2021 | Iguchi |

FOREIGN PATENT DOCUMENTS

| | | | |
|---|---|---|---|
| KR | 10-2020-0135069 | A | 12/2020 |
| KR | 10-2228084 | B1 | 3/2021 |

* cited by examiner

T16: T161, 162

REL: PSUB, NSEM, MQW, PSEM, AE, CE

REL: PSUB, NSEM, MQW, PSEM, AE, CE

REL: PSUB, NSEM, MQW, PSEM, AE, CE

REL: PSUB, NSEM, MQW, PSEM, AE, CE

REL: PSUB, NSEM, MQW, PSEM, AE, CE

REL: PSUB, NSEM, MQW, PSEM, AE, CE

REL: PSUB, NSEM, MQW, PSEM, AE, CE

DISPLAY DEVICE AND TILED DISPLAY DEVICE

CROSS-REFERENCE TO RELATED APPLICATION

This application claims priority to and the benefit of Korean Patent Application No. 10-2022-0013404 filed on Jan. 28, 2022 and Korean Patent Application No. 10-2022-0035150 filed on Mar. 22, 2022 in the Korean Intellectual Property Office (KIPO), the entire contents of both of which are incorporated by reference herein.

BACKGROUND

1. Field

The present disclosure relates to a display device and a tiled device.

2. Description of the Related Art

With the advance of information-oriented society, more and more demands are placed on display devices for displaying images in various ways. When the display device is manufactured in a large size, the defect rate of a light emitting device may increase due to an increase in the number of pixels, and productivity or reliability may decrease. To solve this problem, a tiled display device in which a large screen is realized by connecting a plurality of display devices having a relatively small size has been developed.

The display device may be a flat panel display device such as a liquid crystal display, a field emitting display and a light emitting display. The light emitting display device may include an organic light emitting diode (OLED) display including an organic light emitting diode as a light emitting element or a light emitting diode display including an inorganic light emitting diode such as a light emitting diode (LED) as a light emitting element. In the case of the light emitting diode display, when an inorganic light emitting diode device is bonded to a display panel, a pad electrode may be damaged by bonding pressure.

SUMMARY

Aspects and features of embodiments of the present disclosure provide a display device capable of inspecting damage to pad electrodes.

Aspects and features of embodiments of the present disclosure provide a tiled display device capable of inspecting damage to pad electrodes.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a plurality of sub-pixels. A sub-pixel of the plurality of sub-pixels includes a first pad electrode and a second pad electrode on the substrate and spaced from each other in a plan view, a light emitting device on the first pad electrode and the second pad electrode, and a first inspection transistor overlapping the first pad electrode in a thickness direction of the substrate. The first inspection transistor overlaps the light emitting device in the thickness direction of the substrate.

The sub-pixel may further include a second inspection transistor overlapping the second pad electrode in the thickness direction of the substrate. The second inspection transistor may overlap the light emitting device in the thickness direction of the substrate.

A gate electrode of the first inspection transistor and a gate electrode of the second inspection transistor may be connected to an inspection enable signal line.

A gate electrode of the first inspection transistor may be connected to a first inspection enable signal line, and the gate electrode of the second inspection transistor may be connected to a second inspection enable signal line.

A first electrode of the first inspection transistor and a first electrode of the second inspection transistor may be connected to a first horizontal power supply line configured to receive a first power voltage.

The display device may further include a first data line connected to the sub-pixel and configured to receive a first data voltage, and a second data line connected to the sub-pixel and configured to receive a second data voltage. The sub-pixel may further include a first pixel driver including a first transistor configured to control a control current according to the first data voltage of the first data line, a second pixel driver including a second transistor configured to control a driving current flowing from a first power supply line configured to receive the first power voltage to the light emitting device according to the second data voltage of the second data line, and a third pixel driver including a third transistor configured to adjust a period in which the driving current is applied to the light emitting device according to the control current of the first pixel driver.

A second electrode of the first inspection transistor and a second electrode of the second inspection transistor may be connected to a second horizontal power supply line configured to receive a second power voltage.

A first electrode of the light emitting device may be connected to the first pad electrode, a second electrode of the light emitting device may be connected to the second pad electrode, and the second pad electrode may be connected to a second power supply line configured to receive the second power voltage.

A first electrode of the first inspection transistor may be connected to a horizontal voltage line, and a second electrode of the first inspection transistor may be connected to a sense line.

The horizontal voltage line is configured to receive a predetermined voltage.

A first electrode of the second inspection transistor may be connected to the horizontal voltage line, and a second electrode may be connected to the sensing line.

The light emitting device may be a flip chip type micro light emitting diode device.

According to one or more embodiments of the present disclosure, there is provided a display device including a plurality of sub-pixels. A sub-pixel of the plurality of sub-pixels includes a first pad electrode and a second pad electrode on the substrate and spaced from each other in a plan view; a light emitting device on the first pad electrode and the second pad electrode, and a first resistor unit overlapping the first pad electrode in a thickness direction of the substrate. The first resistor unit overlaps the light emitting device in the thickness direction of the substrate.

The display device may further include a first horizontal voltage line connected to one end of the first resistor unit, and a first sensing line connected to other end of the first resistor unit.

The sub-pixel may further include an inspection transistor overlapping the second pad electrode in the thickness direction of the substrate. The inspection transistor may overlap the light emitting device in the thickness direction of the substrate.

A gate electrode of the inspection transistor may be connected to an inspection enable signal line, and a first electrode of the inspection transistor may be connected to a horizontal voltage line, and a second electrode of the inspection transistor is connected to a sense line.

The sub-pixel may further include a second resistor unit overlapping the second pad electrode in a thickness direction of the substrate. The second resistor unit may overlap the light emitting device in a thickness direction of the substrate.

The display device may further include a second horizontal voltage line connected to one end of the second resistor unit, and a second sensing line connected to other end of the second resistor unit.

A same voltage may be supplied to the first horizontal voltage line and the second horizontal voltage line.

According to one or more embodiments of the present disclosure, there is provided a display device including a plurality of sub-pixels. A sub-pixel of the plurality of sub-pixels includes a first pad electrode and a second pad electrode on the substrate and spaced from each other in a plan view, a light emitting device on the first pad electrode and the second pad electrode, and a first dummy transistor overlapping the first pad electrode in a thickness direction of the substrate. The first dummy transistor overlaps the light emitting device in the thickness direction of the substrate. A gate electrode of the first dummy transistor is connected to a floating line or a gate-off voltage line configured to receive a gate-off voltage.

The sub-pixel may further include a second dummy transistor overlapping the second pad electrode in the thickness direction of the substrate. The second dummy transistor may overlap the light emitting device in the thickness direction of the substrate.

A gate electrode of the second dummy transistor may be connected to the floating line or the gate-off voltage line.

The light emitting device may be a flip chip type micro light emitting diode device.

According to one or more embodiments of the present disclosure, there is provided a tiled display device including a plurality of display devices, and a connection member between the plurality of display devices. A first display device from among the plurality of display devices includes a plurality of sub-pixels. A sub-pixel of the plurality of sub-pixels includes a first pad electrode and a second pad electrode on the substrate and spaced from each other in a plan view, a light emitting device on the first pad electrode and the second pad electrode, a first thin film transistor overlapping the first pad electrode in a thickness direction of the substrate, a second thin film transistor overlapping the second pad electrode in the thickness direction of the substrate. Each of the first thin film transistor and the second thin film transistor overlaps the light emitting device in the thickness direction of the substrate.

The light emitting device may be a flip chip type micro light emitting diode device.

The first display device may further include a board, a pad on a first surface of the substrate, and a side line on the first surface of the substrate, a second surface opposite to the first surface, and one side between the first surface and the second surface, and connected to the pad.

The substrate may include glass.

The first display device may further include a connection line on the second surface of the substrate, and a flexible film connected to the connection line through a conductive adhesive member. The side line may be connected to the connection line.

The plurality of display devices may be arranged in a matrix in M (M is a positive integer) number of rows and N (N is a positive integer) number of columns.

According to the aforementioned and other embodiments of the present disclosure, by arranging the test transistor to overlap the light emitting device, the pad electrode that may occur when a predetermined pressure is applied to the light emitting device to attach the light emitting device to the pad electrode. It can be inspected for damage.

According to the aforementioned and other embodiments of the present disclosure, it may be inspected whether the pad electrode is damaged, which may occur when a predetermined pressure is applied to the light emitting device to attach the light emitting device to the pad electrode by arranging the variable resistor to overlap the light emitting device.

BRIEF DESCRIPTION OF THE DRAWINGS

The above and other embodiments and features of the present disclosure will become more apparent by describing embodiments thereof with reference to the attached drawings, in which:

FIG. 47 is a plan view illustrating a front surface of a first display device according to one or more embodiments.

FIG. 48 is a plan view illustrating a bottom of the first display device according to one or more embodiments.

FIG. 49 is a cross-sectional view illustrating an example of the first display device taken along the line N-N' of FIGS. 47 and 48.

DETAILED DESCRIPTION

Figure 1:
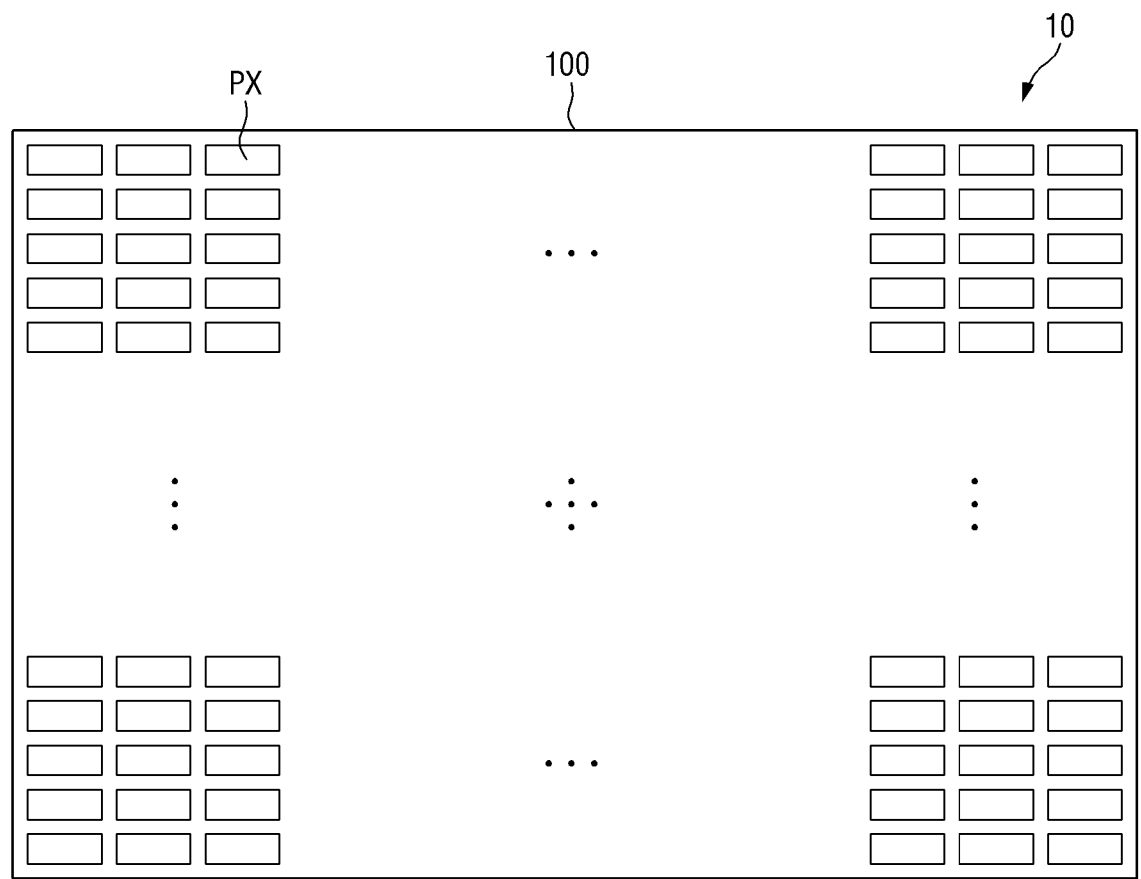
FIG. 1 is a layout diagram illustrating a display device according to one or more embodiments.
Figure 1:
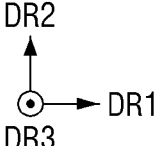

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
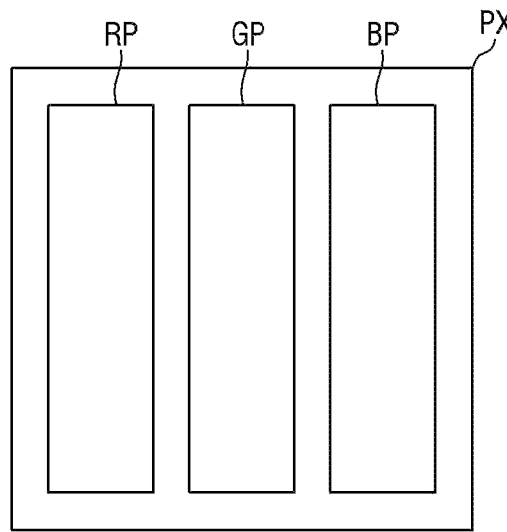
FIG. 2 is a diagram illustrating an example of the pixel of FIG. 1.
Figure 2:
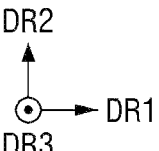
Figure 3:
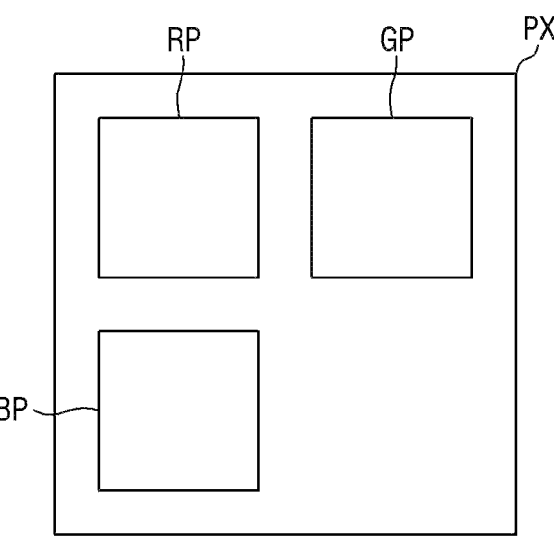
FIG. 3 is a diagram illustrating another example of the pixel of FIG. 1.
Figure 3:
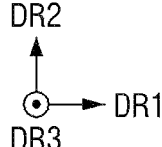

FIG. 1 is a layout diagram illustrating a display device according to one or more embodiments. FIG. 2 is a diagram illustrating an example of the pixel of FIG. 1. FIG. 3 is a diagram illustrating another example of the pixel of FIG. 1.

Referring to FIGS. 1 to 3, a display device 10 is a device for displaying a moving image or a still image. The display device may be used as a display screen of various products such as televisions, laptop computers, monitors, billboards and the Internet of Things (IOT) as well as portable electronic devices such as mobile phones, smart phones, tablet personal computer (tablet PC), smart watches, watch phones, mobile communication terminals, electronic notebooks, electronic books, portable multimedia players (PMPs), navigation systems and ultra mobile PCs (UMPCs).

A display panel 100 may be formed in a rectangular plane having a long side in a first direction DR1 and a short side in a second direction DR2 intersecting the first direction DR1. A corner where a long side of the first direction DR1 and a short side of the second direction DR2 meet may be rounded to have a suitable curvature (e.g., a predetermined curvature) or may be formed at a right angle. A flat shape of the display panel 100 is not limited to a quadrangle, and may be formed in other polygons, circles, or ovals. The display panel 100 may be formed to be flat but is not limited thereto. For example, the display panel 100 is formed at left and right ends and may include curved portions having a constant curvature or a varying curvature. In addition, the display panel 100 may be flexibly formed to be curved, crooked, bent, folded, or rolled.

The display panel 100 may further include pixels PXs, scan lines extending in the first direction DR1, and data lines extending in the second direction DR2 to display an image. The pixels PX may be arranged in a matrix form in the first direction DR1 and the second direction DR2. For example, the pixels PX may be arranged along rows and columns of a matrix in the first direction DR1 and the second direction DR2.

Each of the pixels PX may include a plurality of sub-pixels RP, GP, and BP as shown in FIGS. 2 and 3. In FIGS. 2 and 3, it was exemplified that each of the pixels PX includes three sub-pixels RP, GP, and BP, that is, a first sub-pixel RP, a second sub-pixel GP, and a third sub-pixel BP, but the embodiment of the present specification is not limited thereto.

The first sub-pixel RP, the second sub-pixel GP, and the third sub-pixel BP may be connected to one of the data lines and at least one scan line from among the scan lines.

Each of the first sub-pixel RP, the second sub-pixel GP, and the third sub-pixel BP may have a rectangular, square, or rhombus planar shape. For example, each of the first sub-pixel RP, the second sub-pixel GP, and the third sub-pixel BP may have a planar shape of a rectangle having a short side in the first direction DR1 and a long side in the second direction DR2 as shown in FIG. 2. Alternatively, each of the first sub-pixel RP, the second sub-pixel GP, and the third sub-pixel BP may have a planar shape of a square or rhombus including having the same length in the first direction DR1 and the second direction DR2 as shown in FIG. 3.

As shown in FIG. 2, the first sub-pixel RP, the second sub-pixel GP, and the third sub-pixel BP may be arranged along the first direction DR1. Alternatively, one of the second sub-pixel GP and the third sub-pixel BP, and the first sub-pixel RP may be arranged along the first direction DR1, and the other one and the first sub-pixel RP may be arranged along the second direction DR2. For example, as shown in FIG. 3, the first sub-pixel RP and the second sub-pixel GP may be arranged along the first direction DR1, and the first sub-pixel RP and the third sub-pixel BP may be arranged along the second direction DR2.

Alternatively, any one of the first sub-pixel RP and the third sub-pixel BP, and the second sub-pixel GP may be arranged along the first direction DR1, and the other one and the second sub-pixel GP may be arranged along the second direction DR2. Alternatively, any one of the first sub-pixel RP and the second sub-pixel GP, and the third sub-pixel BP may be arranged along the first direction DR1, and the other one and the third sub-pixel BP may be arranged along the second direction DR2.

The first sub-pixel RP may include a first light-emitting device emitting a first light, the second sub-pixel GP may include a second light-emitting device emitting a second light, and the third sub-pixel BP may include a third light emitting device emitting a third light. Here, the first light may be light of a red wavelength band, the second light may be light of a green wavelength band, and the third light may be light of a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm, but embodiments of the present specification are not limited thereto.

Each of the first sub-pixel RP, the second sub-pixel GP, and the third sub-pixel BP is a light-emitting device that emits light and may include an inorganic light-emitting device having an inorganic semiconductor. For example, an inorganic light-emitting device may be a flip chip type micro light emitting diode (LED), but embodiments of the present specification are not limited thereto.

As shown in FIGS. 2 and 3, the area of the first sub-pixel RP, the area of the second sub-pixel GP, and the area of the third sub-pixel BP may be substantially the same, but the embodiment of the present specification is not limited thereto. At least one of the area of the first sub-pixel RP, the area of the second sub-pixel GP, and the area of the third sub-pixel BP may be different from another one. Alternatively, any two of the area of the first sub-pixel RP, the area of the second sub-pixel GP, and the area of the third sub-pixel BP may be substantially the same and the other one may be different from the two. Alternatively, the area of the first sub-pixel RP, the area of the second sub-pixel GP, and the area of the third sub-pixel BP may be different from each other.

Figure 4:
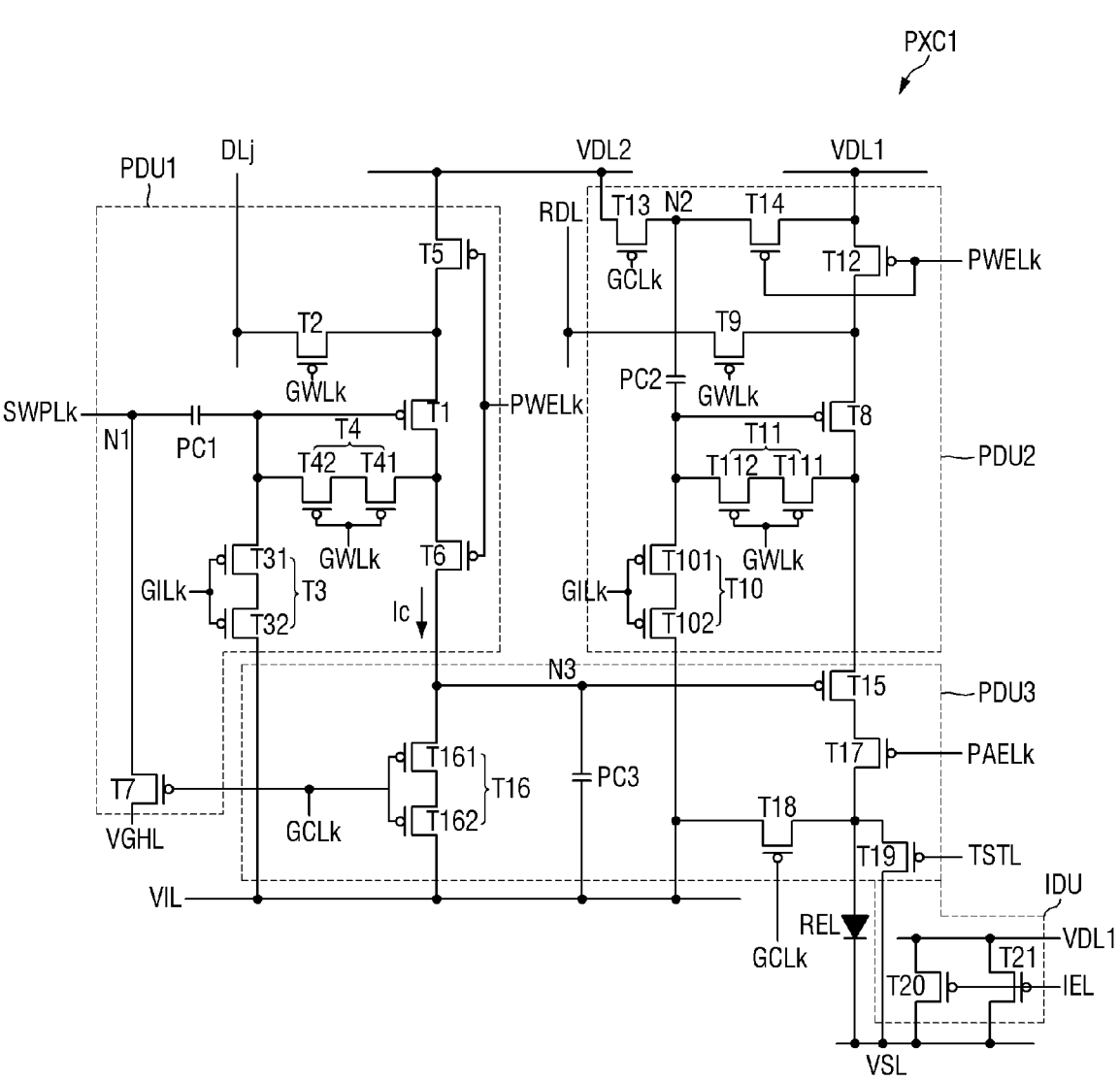
FIG. 4 is a circuit diagram illustrating a first sub-pixel according to one or more embodiments.

FIG. 4 is a circuit diagram illustrating a first sub-pixel according to one or more embodiments.

Referring to FIG. 4, the first sub-pixel RP according to one or more embodiments may be connected to a $k^{th}$ (k is a positive integer) write scan line GWLk, a $k^{th}$ initialization scan line GILk, a $k^{th}$ control scan line GCLK, a $k^{th}$ sweep signal line SWPLK, a $k^{th}$ PWM light emitting line PWELK, a $k^{th}$ PAM light emitting line PAELk and an inspection enable signal line IEL. Further, the first sub-pixel RP according to one or more embodiments may be connected to a $j^{th}$ data line DLj and a first PAM data line RDL. Also, a first sub-circuit unit PXC1 may be connected to a first power supply line VDL1 to which a first power voltage VDD1 is applied, a second power supply line VSL to which a second power voltage VSS is applied, an initialization voltage line VIL to which an initialization voltage VINT is applied, and a gate-off voltage line VGHL to which a gate-off voltage VGH is applied. In one or more embodiments, the first sub-circuit unit PXC1 may be connected to a third power supply line VDL2 to which a third power voltage VDD2 is applied.

The first sub-pixel RP may include a first pixel driver PDU1, a second pixel driver PDU2, a third pixel driver PDU3, an inspection driver IDU, and a first light emitting element REL.

The first light emitting element REL emits light according to a driving current generated by the second pixel driver PDU2. The first light emitting element REL may be disposed between the seventeenth transistor T17 and the second power supply line VSL. A first electrode of the first light emitting element REL may be connected to the second electrode of the seventeenth transistor T17 and the second electrode may be connected to the second power supply line VSL. The first electrode of the first light emitting element REL may be an anode electrode, and the second electrode may be a cathode electrode. A first light emitting element REL may be an inorganic light emitting device including the first electrode, the second electrode, and the inorganic semiconductor disposed between the first electrode and the second electrode. For example, the first light emitting element REL may be a micro light emitting diode formed of the inorganic semiconductor but is not limited thereto.

The first pixel driver PDU1 generates a control current Ic in response to a $j^{th}$ data voltage of the $j^{th}$ data line DLj to control a voltage of a third node N3 of the third pixel driver PDU3. Because a pulse width of the first driving current flowing through the first light emitting element REL may be adjusted by the control current Ic of the first pixel driving unit PDU1, the first pixel driver PDU1 may be a pulse width modulation PWM unit for performing pulse width modulation of the first driving current flowing through the first light emitting element REL.

The first pixel driver PDU1 may include the first to seventh transistors T1 to T7 and a first capacitor PC1.

The first transistor T1 controls the control current Ic flowing between the second electrode and the first electrode of the first transistor T1 in response to the data voltage applied to a gate electrode.

The second transistor T2 is turned-on by a $k^{th}$ write scan signal of a $k^{th}$ write scan line GWLk to supply the data voltage of the $j^{th}$ data line DLj to the first electrode of the first transistor T1.

The third transistor T3 is turned-on by a $k^{th}$ initialization scan signal of the $k^{th}$ initialization scan line GILk to connect the initialization voltage line VIL to the gate electrode of the first transistor T1. Accordingly, during the turned-on period of the third transistor T3, the gate electrode of the first transistor T1 may be discharged to the initialization voltage VINT of the initialization voltage line VIL. The third transistor T3 may include a plurality of transistors connected in series. For example, the third transistor T3 may include a first sub-transistor T31 and a second sub-transistor T32. Because of this, it is possible to reduce or minimize the voltage of the gate electrode of the first transistor T1 from leaking through the third transistor T3.

The fourth transistor T4 is turned-on by the $k^{th}$ write scan signal of the $k^{th}$ write scan line GWLk to connect the gate electrode and the second electrode of the first transistor T1. Because of this, during the turnd-on period of the fourth transistor T4, the first transistor T1 may operate as a diode (e.g., the first transistor T1 may BE diode-connected). The fourth transistor T4 may include a plurality of transistors connected in series. For example, the fourth transistor T4 may include a third sub-transistor T41 and a fourth sub-transistor T42. Because of this it is possible to reduce or minimize the voltage of the gate electrode of the first transistor T1 from leaking through the fourth transistor T4.

The fifth transistor T5 is turned-on by a $k^{th}$ PWM emission signal of a $k^{th}$ PWM emission line PWELK to connect the first electrode of the first transistor T1 to the third power supply line VDL2.

The sixth transistor T6 is turned-on by the $k^{th}$ PWM emission signal of the $k^{th}$ PWM emission line PWELK to connect the second electrode of the first transistor T1 to the third node N3 of the third pixel driver PDU3.

The seventh transistor T7 is turned-on by a $k^{th}$ control scan signal of the $k^{th}$ control scan line GCLk to supply the gate-off voltage VGH of the gate-off voltage line VGHL to a first node N1 connected to the $k^{th}$ sweep signal line SWPLK. Because of this, it is possible to prevent the change in the voltage of the gate electrode of the first transistor T1 from being reflected in the $k^{th}$ sweep signal of the $k^{th}$ sweep signal line SWPLK by the first capacitor PC1 during the period in which the initialization voltage VINT is applied to the gate electrode of the first transistor T1 and the period in which the data voltage of the $j^{th}$ data line DLj and a threshold voltage Vth1 of the first transistor T1 are programmed. The first capacitor PC1 may be disposed between the gate electrode of the first transistor T1 and the first node N1.

The first capacitor PC1 may be disposed between the gate electrode of the first transistor T1 and the first node N1. One electrode of the first capacitor C1 may be connected to the gate electrode of the first transistor T1, and the other electrode thereof may be connected to the first node N1.

The first node N1 may be the contact point of the $k^{th}$ sweep signal line SWPLK, the second electrode of the seventh transistor T7, and the other electrode of the first capacitor PC1.

The second pixel driver PDU2 generates the first driving current applied to the first light emitting element REL in response to the first PAM data voltage of the first PAM data line RDL. The second pixel driver PDU2 may be a pulse amplitude modulation PAM unit for performing pulse amplitude modulation. The second pixel driver PDU2 may be a constant current generator that generates a constant driving current according to the first PAM data voltage.

Also, the second pixel driver PDU2 of each of the first sub-pixels RP may receive the same first PAM data voltage and generate the same driving current regardless of the luminance of the first sub-pixel RP. Similarly, the second pixel driver PDU2 of each of the second sub-pixels GP may receive the same second PAM data voltage and generate the same second driving current regardless of the luminance of the second sub-pixel GP. The third pixel driver PDU3 of each of the third sub-pixels BP may receive the same third PAM data voltage and generate the same third driving current regardless of the luminance of the third sub-pixel BP.

The second pixel driver PDU2 may include eighth to fourteenth transistors T8 to T14 and a second capacitor PC2.

The eighth transistor T8 controls the driving current flowing to the light emitting element REL in response to the voltage applied to the gate electrode.

The ninth transistor T9 is turned-on by a $k^{th}$ scan write signal of a $k^{th}$ scan write line GWLk to supply the first PAM data voltage of the first PAM data line RDL to the first electrode of the eighth transistor T8.

The tenth transistor T10 is turned-on by a $k^{th}$ scan initialization signal of a $k^{th}$ scan initialization line GILk to connect the initialization voltage line VIL to the gate electrode of the eighth transistor T8. Accordingly, during the turned-on period of the tenth transistor T10, the gate electrode of the eighth transistor T8 may be discharged to the initialization voltage VINT of the initialization voltage line VIL. The tenth transistor T10 may include a plurality of transistors connected in series. For example, the tenth transistor T10 may include a fifth sub-transistor T101 and a sixth sub-transistor T102. Accordingly, the voltage of the gate electrode of the eighth transistor T8 may have reduced or minimized leaking through the tenth transistor T10.

The eleventh transistor T11 is turned-on by the $k^{th}$ scan write signal of the $k^{th}$ scan write line GWLk to connect the gate electrode and the second electrode of the eighth transistor T8. Accordingly, during the turned-on period of the eleventh transistor T11, the eighth transistor T8 may operate as a diode (e.g., the eighth transistor T8 may be diode-connected). The eleventh transistor T11 may include a plurality of transistors connected in series. For example, the eleventh transistor T11 may include a seventh sub-transistor T111 and an eighth sub-transistor T112. Accordingly, it is possible to reduce or minimize the voltage of the gate electrode of the eighth transistor T8 from leaking through the eleventh transistor T11.

The twelfth transistor T12 is turned-on by the $k^{th}$ PWM emission signal of the $k^{th}$ PWM emission line PWELK to connect the first electrode of the eighth transistor T8 to a first power supply line VDL1.

The thirteenth transistor T13 is turned-on by the $k^{th}$ scan control signal of a $k^{th}$ scan control line GCLk to connect the third power supply line VDL2 to a second node N2. Accordingly, when the thirteenth transistor T13 is turned-on, a second power voltage VDD2 of a third power supply line VDL2 may be supplied to the second node N2.

The fourteenth transistor T14 is turned-on by the $k^{th}$ PWM emission signal of the $k^{th}$ PWM emission line PWELK to connect the first power supply line VDL1 to the second node N2. Accordingly, when the fourteenth transistor T14 is turned-on, the first power voltage VDD1 of the first power supply line VDL1 may be supplied to the second node N2.

The second capacitor PC2 may be disposed between the gate electrode of the eighth transistor T8 and the second node N2. One electrode of the second capacitor PC2 may be connected to the gate electrode of the eighth transistor T8, and the other electrode thereof may be connected to the second node N2.

The second node N2 may be the contact point of the second electrode of the thirteenth transistor T13, the second electrode of the fourteenth transistor T14, and the other electrode of the second capacitor PC2.

The third pixel driver PDU3 adjusts the period in which the driving current is applied to the first light emitting element REL depending on a voltage of the third node N3.

The third pixel driver PDU3 may include fifteenth to nineteenth transistors T15 to T19 and a third capacitor PC3.

The fifteenth transistor T15 is turned-on or turned-off depending on the voltage of the third node N3. When the fifteenth transistor T15 is turned-on, the driving current of the eighth transistor T8 may be supplied to the first light emitting element REL, and when the fifteenth transistor T15 is turned-off, the driving current of the eighth transistor T8 may not be supplied to the first light emitting element REL. Therefore, the turned-on period of the fifteenth transistor T15 may be substantially the same as the emission period of the first light emitting element REL. The fifteenth transistor T15 may be connected between the eighth transistor T8 and a seventeenth transistor T17.

The sixteenth transistor T16 is turned-on by the $k^{th}$ scan control signal of the $k^{th}$ scan control line GCLk to connect the initialization voltage line VIL to the third node N3. Accordingly, during the turned-on period of the sixteenth transistor T16, the third node N3 may be discharged to the initialization voltage of the initialization voltage line VIL. The sixteenth transistor T16 may include a plurality of transistors connected in series. For example, the sixteenth transistor T16 may include a ninth sub-transistor T161 and a tenth sub-transistor T162. Accordingly, it is possible to reduce or minimize the voltage of the third node N3 from leaking through the sixteenth transistor T16.

The seventeenth transistor T17 is turned-on by a $k^{th}$ PAM emission signal of a $k^{th}$ PAM emission line PAELk to connect the second electrode of the fifteenth transistor T15 to the first electrode of the first light emitting element REL.

The eighteenth transistor T18 is turned-on by the $k^{th}$ scan control signal of the $k^{th}$ scan control line GCLk to connect the initialization voltage line VIL to the first electrode of the first light emitting element REL. Accordingly, during the turned-on period of the eighteenth transistor T18, the first electrode of the first light emitting element REL may be discharged to the initialization voltage of the initialization voltage line VIL.

The nineteenth transistor T19 is turned-on by a test signal of a test signal line TSTL to connect the first electrode of the first light emitting element REL to the second power supply line VSL.

The third capacitor PC3 may be disposed between the third node N3 and the initialization voltage line VIL. One electrode of the third capacitor PC3 may be connected to the third node N3, and the other electrode thereof may be connected to the initialization voltage line VIL.

The third node N3 may be the contact point of the second electrode of the sixth transistor T6, the gate electrode of the fifteenth transistor T15, the first electrode of the ninth sub-transistor T161, and one electrode of the third capacitor PC3.

The inspection driver IDU may include a first test transistor T20 and a second test transistor T21. The first test transistor T20 and the second test transistor T21 are turned-on by the inspection enable signal of the inspection enable signal line IEL and connect the first power supply line VDL1 to the second power supply line VSL.

When a sufficient pressure (e.g., a predetermined pressure) is applied to the first light emitting element REL to attach the first light emitting element REL to the first sub-pixel RP, the first electrode of the first light emitting element REL may be short-circuited to at least one of the first electrode and the second electrode of the first test transistor T20, and the second electrode of the first light emitting element REL may be short-circuited to one of the first electrode and the second electrode of the second test transistor T21. Accordingly, the first light emitting element REL may not emit light as intended. That is, by forming a first test transistor T20 and the second test transistor T21, it may be inspected whether the first electrode or the second electrode of the first light emitting element REL is short-circuited with another electrode or wiring.

Figure 14:
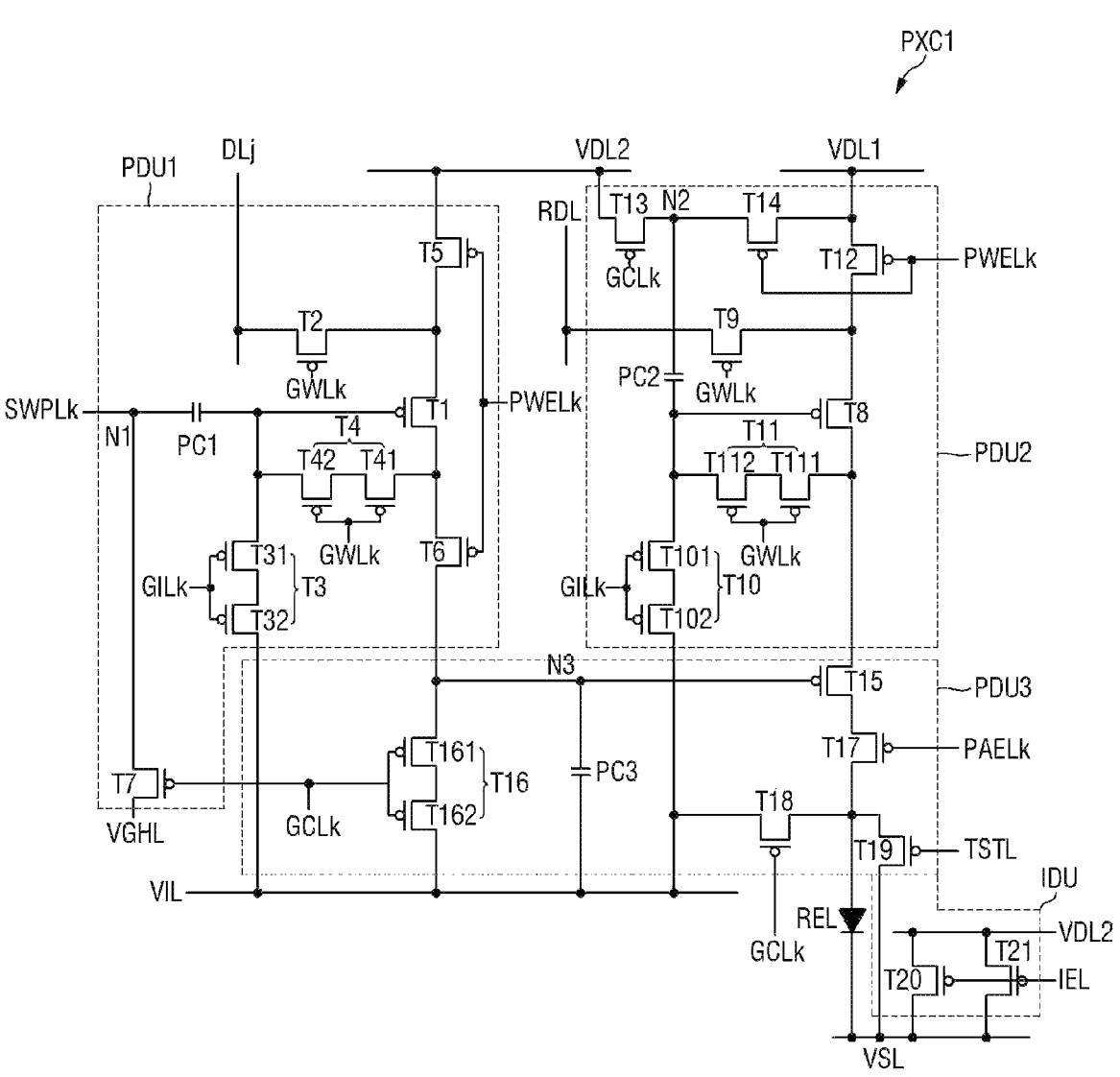
FIG. 14 is a circuit diagram illustrating the first sub-pixel according to one or more embodiments.

In FIG. 4, a source electrode S20 of the first test transistor T20 and a source electrode S21 (e.g., see FIG. 11) of the second test transistor T21 are connected to the first power supply line VDL1, but the present specification is not limited thereto. For example, as shown in FIG. 14, the source electrode S20 of the first test transistor T20 and the source electrode S21 of the second test transistor T21 may be connected to the third power supply line VDL2.

Any one of the first electrode and second electrode of each of the first to nineteenth transistors T1 to T19, the first test transistor T20, and the second test transistor T21 may be a source electrode, and the other may be a drain electrode. The active layer of each of the first to nineteenth transistors T1 to T19, the first test transistor T20, and the second test transistor T21 may be formed of any one of polysilicon, amorphous silicon, and oxide semiconductor. When the active layers of each of the first to nineteenth transistors T1 to T19, the first test transistor T20, and the second test transistor T21 are made of polysilicon, it may be formed by a low temperature polysilicon (LTPS) process.

Further, although FIG. 4 mainly describes the case in which each of the first to nineteenth transistors T1 to T19, the first test transistor T20 and the second test transistor T21 are formed as a P-type MOSFET, the embodiment of the present specification is not limited thereto. For example, each of the first to nineteenth transistors T1 to T19, the first test transistor T20 and the second test transistor T21 may be formed as a N-type MOSFET.

Alternatively, in order to improve a black display capability of the first light emitting element REL by blocking a leakage current, in the first sub-pixel RP, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed as the N-type MOSFET. In this case, the gate electrode of the third sub-transistor T41 and the gate electrode of the fourth sub-transistor T42 of the fourth transistor T4, and the gate electrode of the seventh sub-transistor T111 and the gate electrode of the eighth sub-transistor T112 of the eleventh transistor T11 may be connected to the $k^{th}$ control signal GCLk. The $k^{th}$ initialization scan signal GIk and the $k^{th}$ control signal GCk may have a pulse generated by the gate-off voltage VGH. Further, the active layers of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed of an oxide semiconductor, and the active layers of the other transistors may be formed of polysilicon.

Alternatively, any one of the first sub-transistor T31 and the second sub-transistor T32 of the third transistor T3 may be formed as the N-type MOSFET and the other may be formed as the P-type MOSFET. In this case, between the first sub-transistor T31 and the second sub-transistor T32 of the third transistor T3, the transistor formed as the N-type MOSFET may be formed of an oxide semiconductor, and the transistor formed as the P-type MOSFET may be formed of polysilicon.

Alternatively, any one of the third sub-transistor T41 and the fourth sub-transistor T42 of the fourth transistor T4 may be formed as the N-type MOSFET, and the other may be formed as the P-type MOSFET. In this case, between the third sub-transistor T41 and the fourth sub-transistor T42 of the fourth transistor T4, the transistor formed as the N-type MOSFET may be formed of an oxide semiconductor, and the transistor formed as the P-type MOSFET may be formed of polysilicon.

Alternatively, any one of the fifth sub-transistor T101 and the sixth sub-transistor T102 of the tenth transistor T10 may be formed as the N-type MOSFET, and the other may be formed as the P-type MOSFET. In this case, between the fifth sub-transistor T101 and the sixth sub-transistor T102 of the tenth transistor T10, the transistor formed as the N-type MOSFET may be formed of an oxide semiconductor, and the transistor formed as the P-type MOSFET may be formed of polysilicon.

Alternatively, any one of the seventh sub-transistor T111 and the eighth sub-transistor T112 of the eleventh transistor T11 may be formed as the N-type MOSFET, and the other may be formed as the P-type MOSFET. In this case, between the seventh sub-transistor T111 and the eighth sub-transistor T112 of the eleventh transistor T11, the transistor formed as the N-type MOSFET may be formed of an oxide semiconductor, and the transistor formed as the P-type MOSFET may be formed of polysilicon.

The second sub-pixel GP and the third sub-pixel BP according to one or more embodiments may be substantially the same as the first pixel driver PXC1 described with reference to FIG. 4. Therefore, descriptions of the second pixel driver PXC2 and the third pixel driver PXC3 according to one or more embodiments will be omitted.

Figure 5:
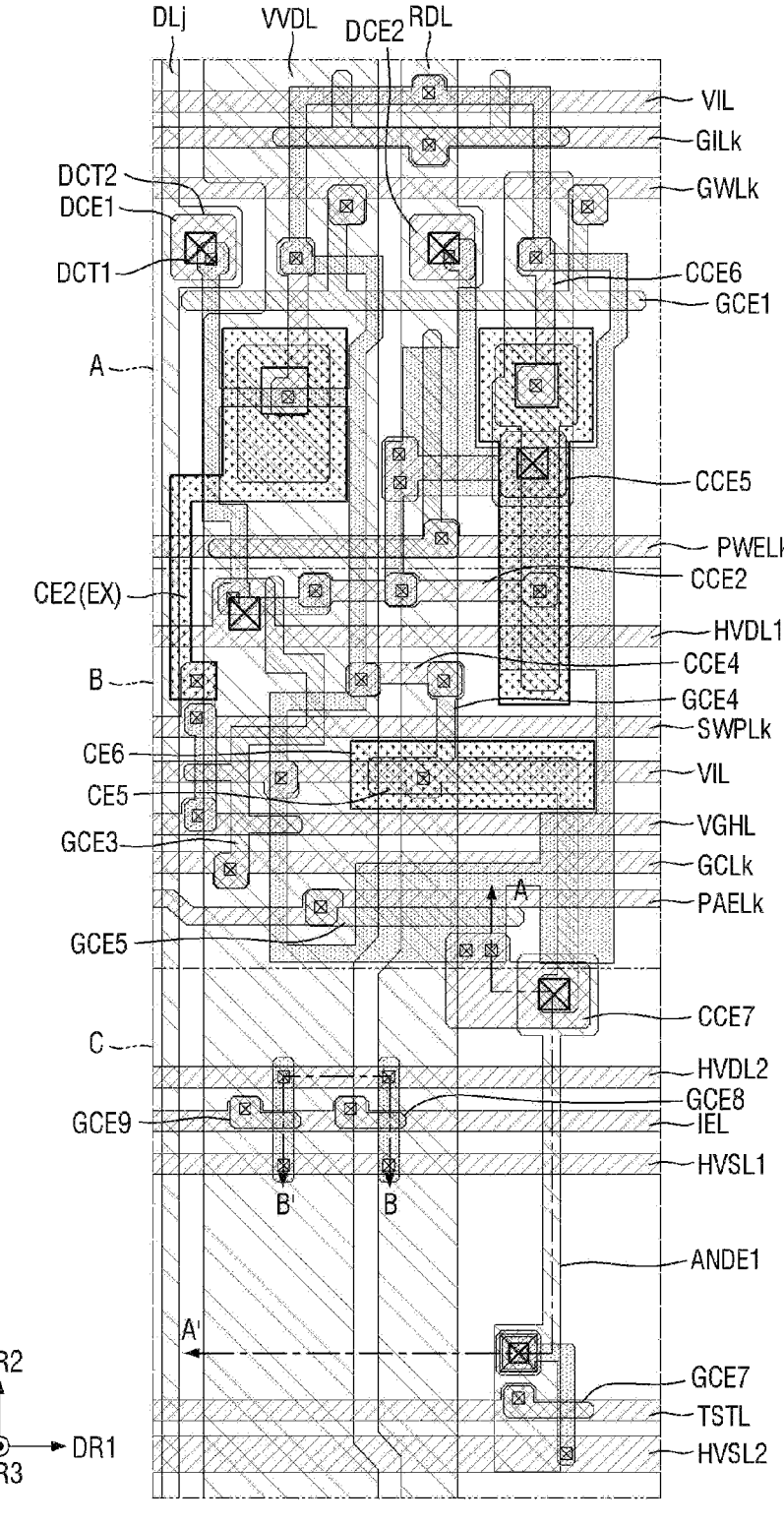
FIG. 5 is a layout diagram illustrating a lower metal layer, an active layer, a first gate metal layer, a second gate metal layer, a first source metal layer, and a second source metal layer of the first sub-pixel according to one or more embodiments.
Figure 6:
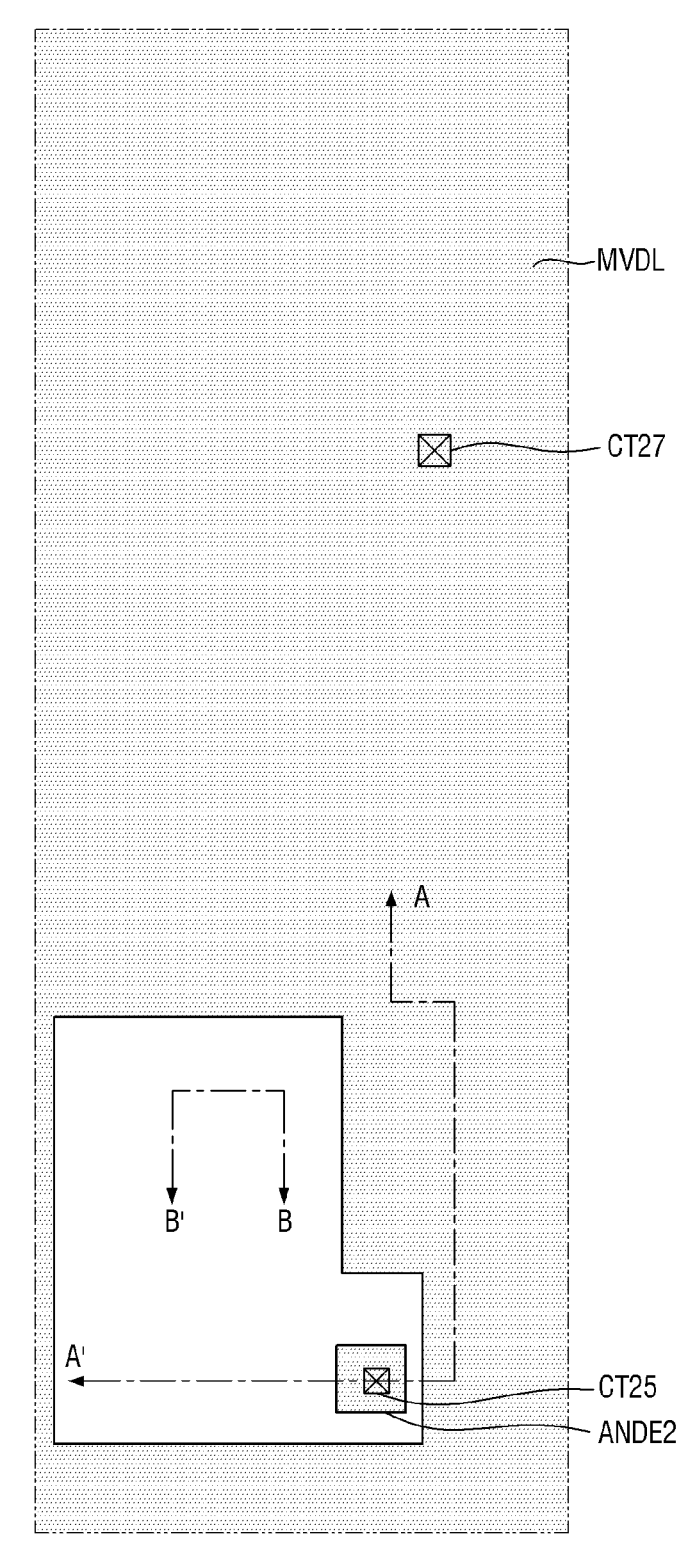
FIG. 6 is a layout diagram illustrating a third source metal layer of the first sub-pixel according to one or more embodiments.
Figure 7:
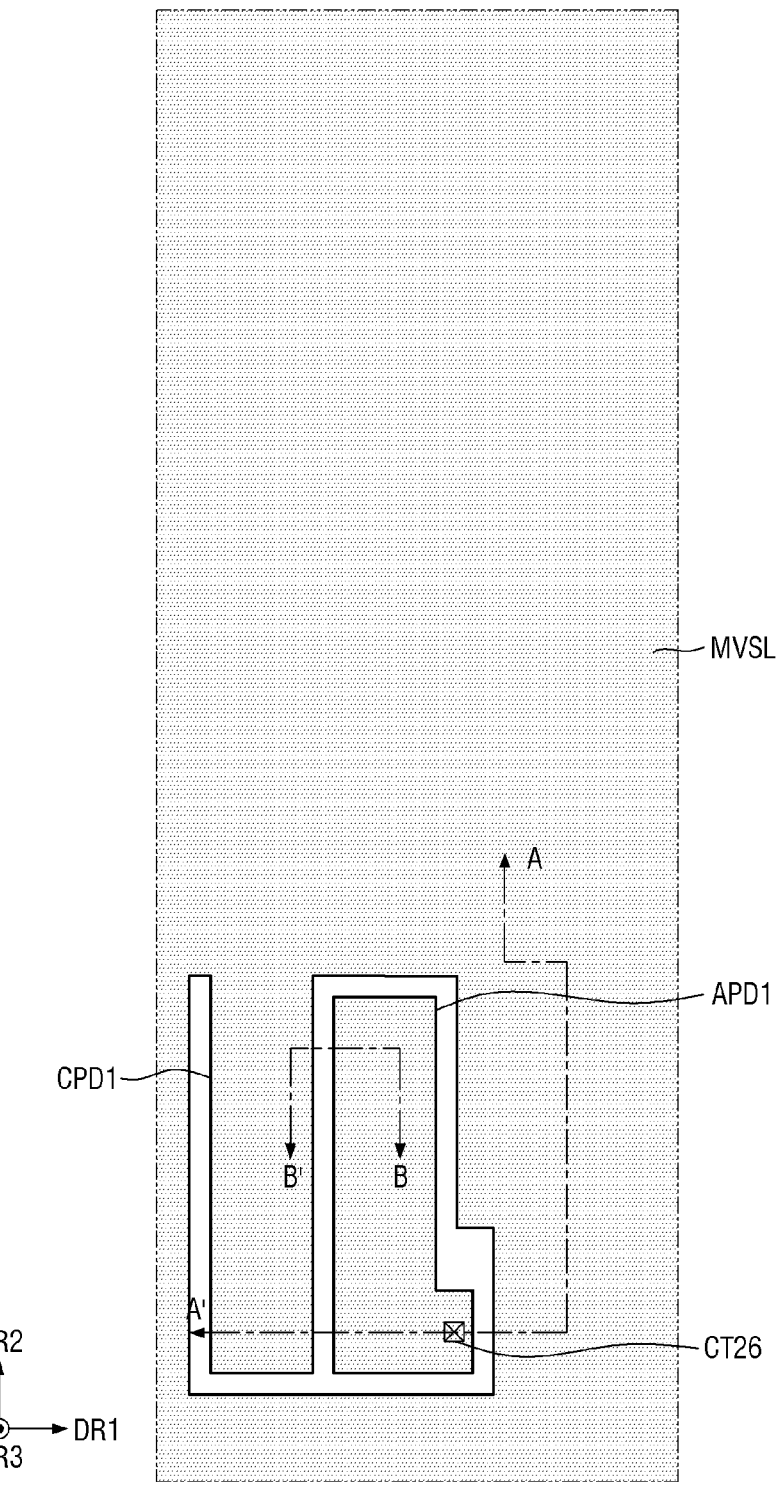
FIG. 7 is a layout diagram illustrating a fourth source metal layer of the first sub-pixel according to one or more embodiments.
Figure 8:
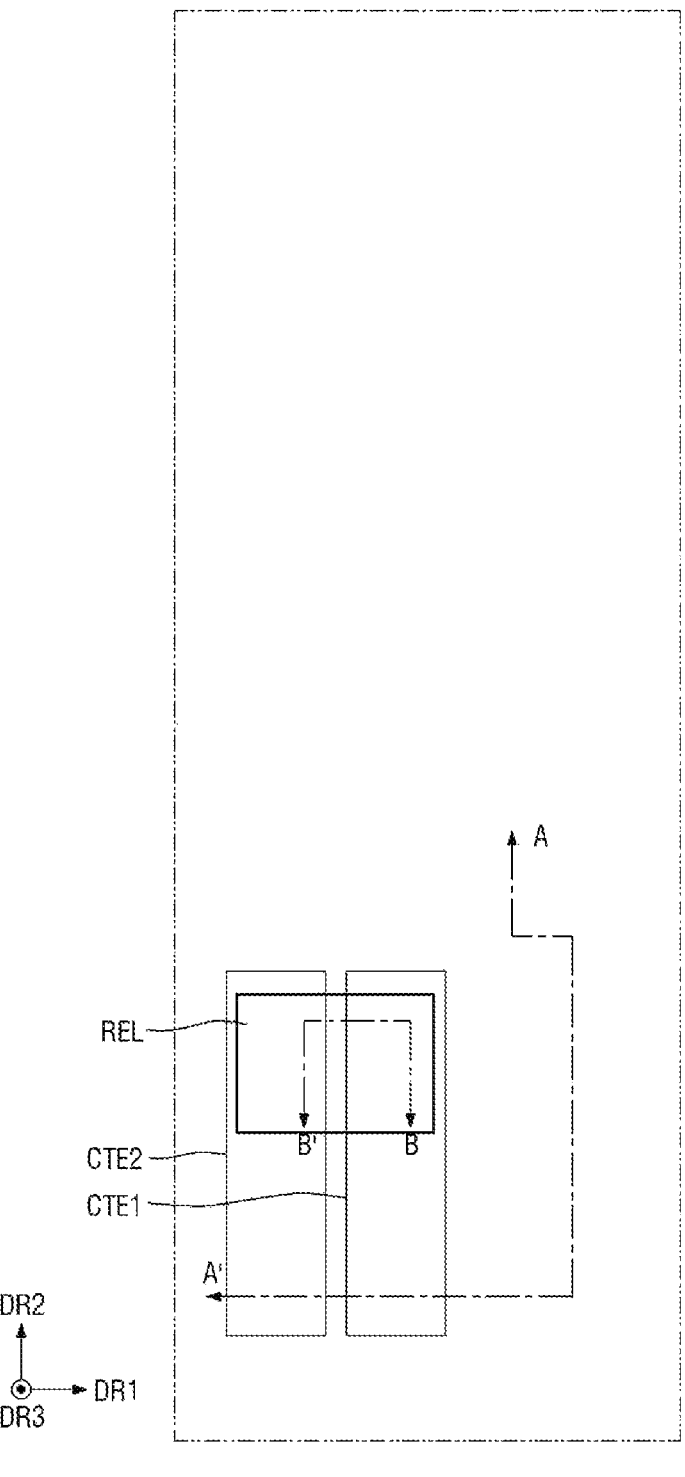
FIG. 8 is a layout diagram illustrating a transparent electrode layer of the first sub-pixel and a first light emitting device according to one or more embodiments.
Figure 9:
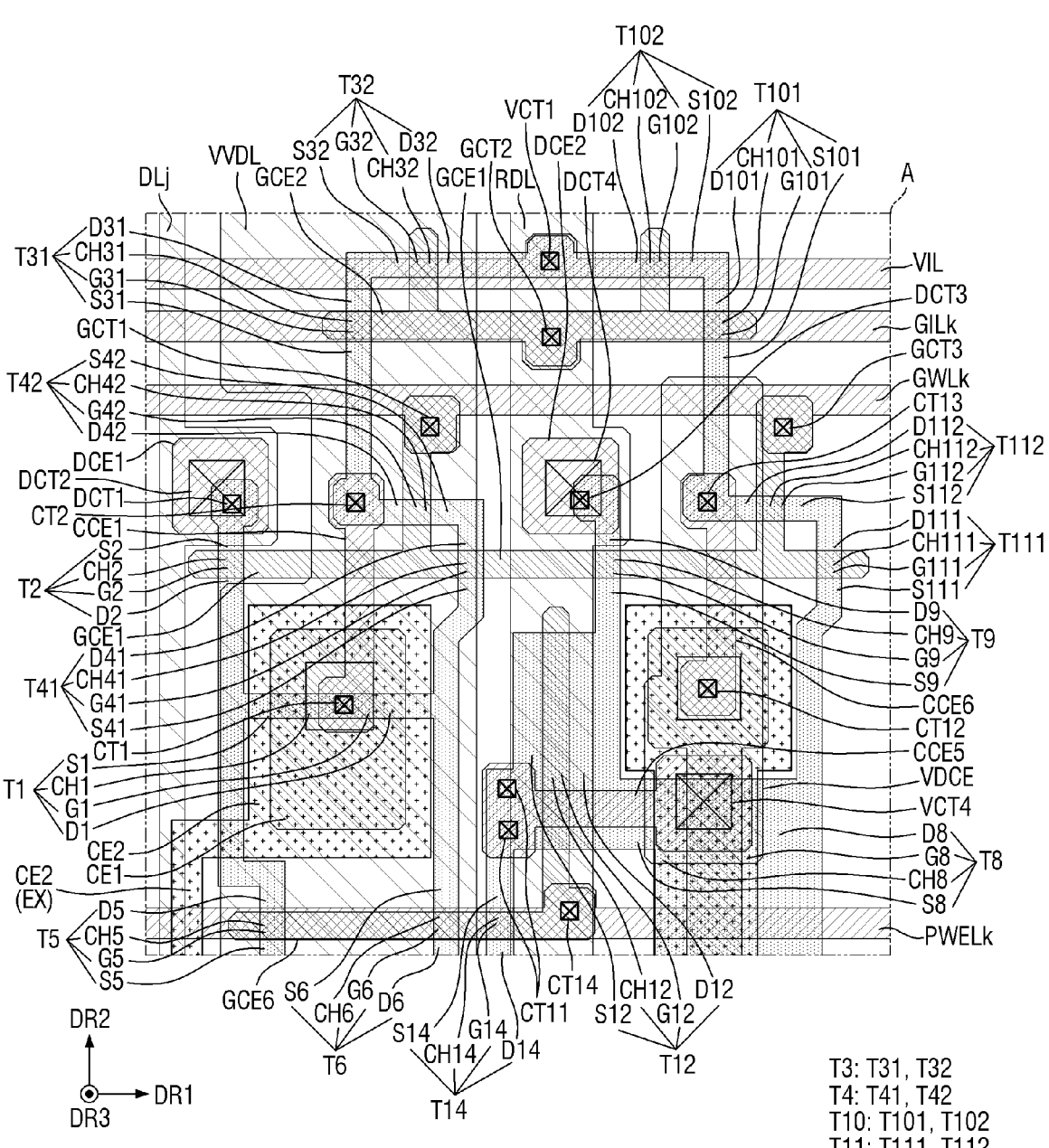
FIG. 9 is an enlarged layout diagram illustrating an area A of FIG. 5 in detail.
Figure 10:
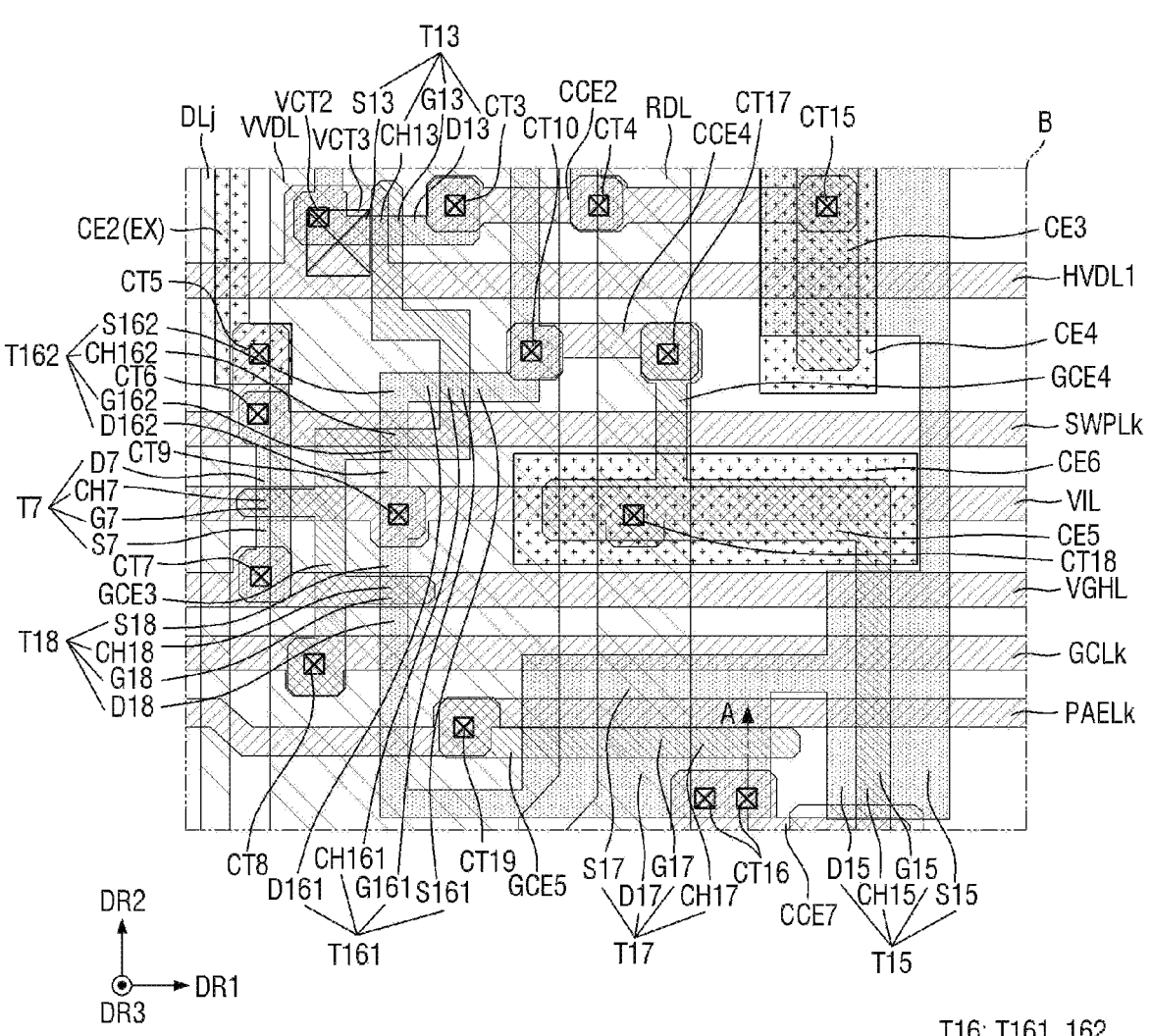
FIG. 10 is an enlarged layout diagram illustrating an area B of FIG. 5. in detail.
Figure 11:
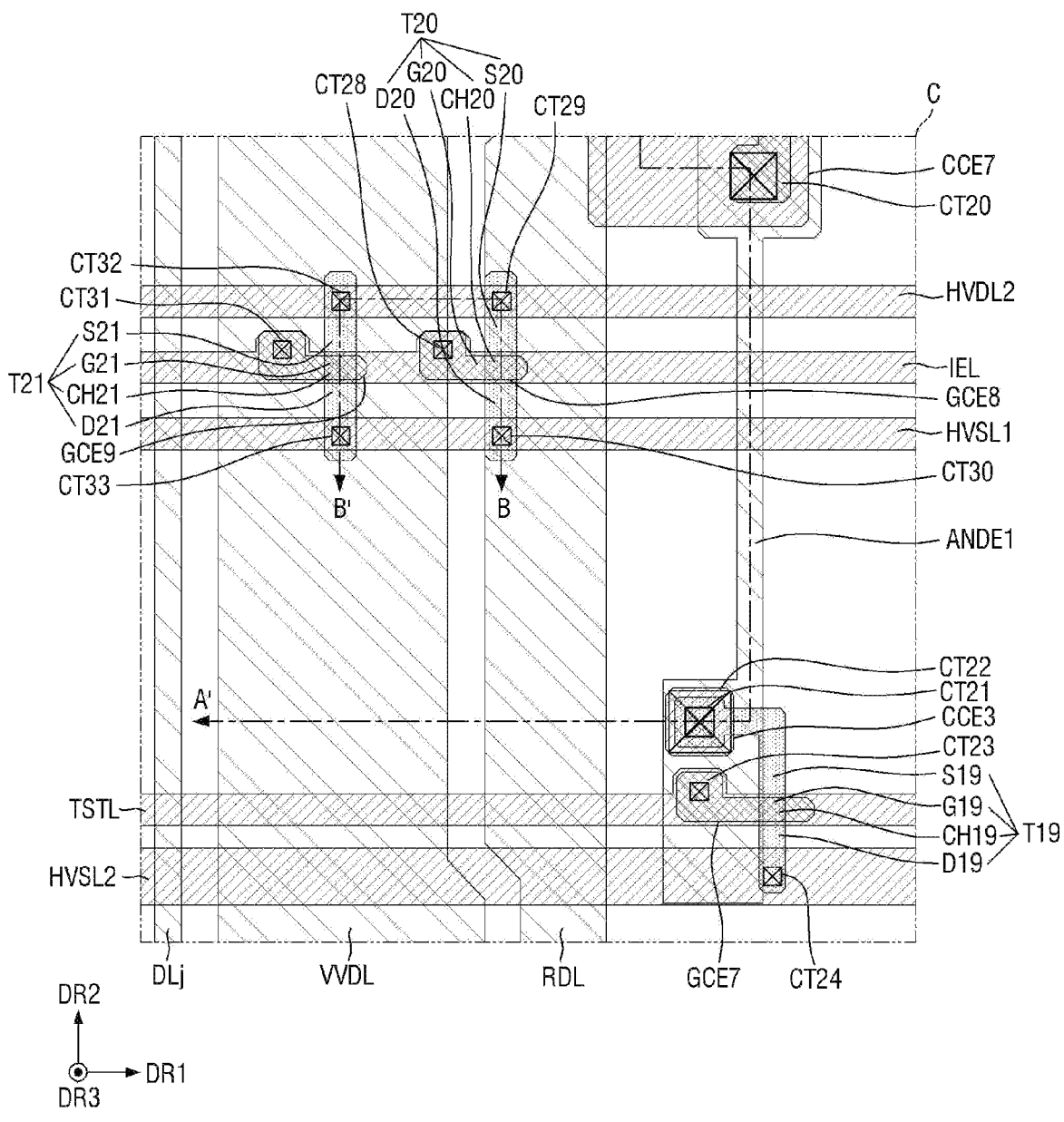
FIG. 11 is an enlarged layout diagram illustrating an area C of FIG. 5 in detail.

FIG. 5 is a layout diagram illustrating a lower metal layer, an active layer, a first gate metal layer, a second gate metal layer, a first source metal layer, and a second source metal layer of the first sub-pixel according to one or more embodiments. FIG. 6 is a layout diagram illustrating a third source metal layer of the first sub-pixel according to one or more embodiments. FIG. 7 is a layout diagram illustrating a fourth source metal layer of the first sub-pixel according to one or more embodiments. FIG. 8 is a layout diagram illustrating a transparent electrode layer of the first sub-pixel and a first light emitting device according to one or more embodiments. FIG. 9 is an enlarged layout diagram illustrating an area A of FIG. 5 in detail. FIG. 10 is an enlarged layout diagram illustrating an area B of FIG. 5. in detail. FIG. 11 is an enlarged layout diagram illustrating an area C of FIG. 5 in detail.

Referring to FIGS. 5 to 11, the initialization voltage line VIL, the $k^{th}$ initialization scan line GILk, the $k^{th}$ write scan line GWLk, the $k^{th}$ PWM light emitting line PWELK, a first horizontal power supply line HVDL1, a second horizontal power supply line HVDL2, a third horizontal power supply line HVSL1, a fourth horizontal power supply line HVSL2, the gate-off voltage line VGHL, the $k^{th}$ sweep signal line SWPLK, the $k^{th}$ control scan line GCLk, the $k^{th}$ PAM light emitting line PAELk, and the test signal line TSTL, and a second power supply line VSL may be extended in the first direction DR1 and may be spaced apart from each other in the second direction DR2. The $j^{th}$ data line DLj, a vertical power supply line VVDL, and the first PAM data line RDL may be extended in the second direction DR2 and may be spaced from each other in the first direction DR1.

The first power supply line VDL1 may include a first main power supply line MVDL and a second horizontal power supply line HVDL2. The first main power supply line MVDL and the second horizontal power supply line HVDL2 may receive the first power voltage.

The second power supply line VSL may include a second main power supply line MVSL, a third horizontal power supply line HVSL1, and a fourth horizontal power supply line HVSL2. The second main power supply line MVSL, the third horizontal power supply line HVSL1, and the fourth horizontal power supply line HVSL2 may receive the second power voltage.

The third power supply line VDL2 may include the vertical power supply line VVDL and a first vertical power supply line HVDL1. The vertical power supply line VVDL and the first vertical power supply line HVDL1 may receive the third power voltage.

The first sub-pixel RP includes the first to nineteenth transistors T1 to T19, the first and second test transistors T20 and T21, the first to sixth capacitor electrodes CE1 to CE6, the first to seventh gate connection electrodes GCE1 to GCE7, the first and second data connection electrodes DCE1 and DCE2, the first to seventh connection electrodes CCE1 to CCE7, a first pad connection electrode ANDE1, a second pad connection electrode ANDE2, a third pad connection electrode APD1, a fourth pad connection electrode CPD1, a first pad electrode CTE1, and a second pad electrode CTE2.

The first transistor T1 includes a first channel CH1, a first gate electrode G1, a first source electrode S1, and a first drain electrode D1. The first channel CH1 may overlap the first gate electrode G1 in a third direction DR3 (e.g., a thickness direction of the substrate). The first gate electrode G1 may be connected to a first connection electrode CCE1 through a first contact hole CT1. The first gate electrode G1 may be integrally formed with a first capacitor electrode CE1. The first gate electrode G1 may overlap a second capacitor electrode CE2 in the third direction DR3. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may overlap the second capacitor electrode CE2 in the third direction DR3.

The second transistor T2 includes a second channel CH2, a second gate electrode G2, a second source electrode S2, and the second drain electrode D2. The second channel CH2 may overlap the second gate electrode G2 in the third direction DR3. The second gate electrode G2 may be integrally formed with a first gate connection electrode GCE1. The second source electrode S2 may be connected to a first data connection electrode DCE1 through a first data contact hole DCT1. The second drain electrode D2 may be connected to the first source electrode S1.

A first sub-transistor T31 of the third transistor T3 includes a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integrally formed with a second gate connection electrode GCE2. The first sub-source electrode S31 may be connected to a fourth sub-drain electrode D42, and the first sub-drain electrode D31 may be connected to a second sub-source electrode S32. The first sub-source electrode S31 may overlap the k$^{th}$ write scan line GWLk in the third direction DR3. A first sub-drain electrode D31 may overlap the initialization voltage line VIL in the third direction DR3.

A second sub-transistor T32 of the third transistor T3 includes a second sub-channel CH32, a second sub-gate electrode G32, the second sub-source electrode S32, and a second sub-drain electrode D32. The second sub-channel CH32 may overlap the second sub-gate electrode G32 in the third direction DR3. The second sub-gate electrode G32 may be integrally formed with the second gate connection electrode GCE2. The second sub-source electrode S32 may be connected to the first sub-drain electrode D31, and the second sub-drain electrode D32 may be connected to the initialization voltage line VIL through a first power contact hole VCT1. The second sub-source electrode S32 and the second sub-drain electrode D32 may overlap the initialization voltage line VIL in the third direction DR3.

A third sub-transistor T41 of the fourth transistor T4 includes a third sub-channel CH41, a third sub-gate electrode G41, a third sub-source electrode S41, and a third sub-drain electrode D41. The third sub-channel CH41 may overlap a third sub-gate electrode G41 in the third direction DR3. The third sub-gate electrode G41 may be integrally formed with the first gate connection electrode GCE1. The third sub-source electrode S41 may be connected to the first drain electrode D1, and the third sub-drain electrode D41 may be connected to a fourth sub-source electrode S42.

A fourth sub-transistor T42 of the fourth transistor T4 includes a fourth sub-channel CH42, a fourth sub-gate electrode G42, the fourth sub-source electrode S42, and the fourth sub-drain electrode D42. The fourth sub-channel CH42 may overlap the fourth sub-gate electrode G42 in the third direction DR3. The fourth sub-gate electrode G42 may be integrally formed with the first gate connection electrode GCE1. The fourth sub-source electrode S42 may be connected to a third sub-drain electrode D41, and the fourth sub-drain electrode D42 may be connected to the first sub-source electrode S31.

A fifth transistor T5 includes a fifth channel CH5, a fifth gate electrode G5, a fifth source electrode S5, and a fifth drain electrode D5. The fifth channel CH5 may overlap the fifth gate electrode G5 in the third direction DR3. The fifth gate electrode G5 may be integrally formed with a sixth gate connection electrode GCE6. The fifth source electrode S5 may be connected to a first horizontal power supply line HVDL1 through a second power contact hole VCT2. The fifth drain electrode D5 may be connected to the first source electrode S1. The fifth drain electrode D5 may overlap an extension portion EX of the second capacitor electrode CE2 in the third direction DR3.

The sixth transistor T6 includes a sixth channel CH6, a sixth gate electrode G6, the sixth source electrode S6, and a sixth drain electrode D6. The sixth channel CH6 may overlap the sixth gate electrode G6 in the third direction DR3. The sixth gate electrode G6 may be integrally formed with the sixth gate connection electrode GCE6. The sixth source electrode S6 may be connected to the first drain electrode D1. The sixth drain electrode D6 may be connected to a fourth connection electrode CCE4 through a tenth contact hole CT10. The sixth drain electrode D6 may overlap a second connection electrode CCE2 and the first horizontal power supply line HVDL1 in the third direction DR3.

The seventh transistor T7 includes a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integrally formed with a third gate connection electrode GCE3. The seventh gate electrode G7 may overlap the initialization voltage line VIL in the third direction DR3. The seventh source electrode S7 may be connected to the gate-off voltage line VGHL through a seventh contact hole CT7. The seventh drain electrode D7 may be connected to the k$^{th}$ sweep signal line SWPLk through a sixth contact hole CT6.

The eighth transistor T8 includes an eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may be extended in the second direction DR2. The eighth gate electrode G8 may be integrally formed with a third capacitor electrode CE3. The eighth source electrode S8 may be connected to a ninth drain electrode D9 and a twelfth drain electrode D12. The eighth drain electrode D8 may be connected to a seventh sub-source electrode S111.

The ninth transistor T9 includes a ninth channel CH9, a ninth gate electrode G9, a ninth source electrode S9, and a ninth drain electrode D9. The ninth channel CH9 may overlap the ninth gate electrode G9 in the third direction DR3. The ninth gate electrode G9 may be extended in the second direction DR2. The ninth gate electrode G9 may be integrally formed with the first gate connection electrode GCE1. The ninth drain electrode D9 may be connected to a second data connection electrode DCE2 through a third data contact hole DCT3. The ninth source electrode S9 may be connected to an eighth source electrode D8.

A fifth sub-transistor T101 of the tenth transistor T10 includes a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integrally formed with the second gate connection electrode GCE2. The fifth sub-source electrode S101 may be connected to an eighth sub-drain electrode D112, and the fifth sub-drain electrode D101 may be connected to a sixth sub-source electrode S102. The fifth sub-source electrode S101 may overlap the k$^{th}$ write scan line GWLk in the third direction DR3. The fifth sub-drain electrode D102 may overlap the initialization voltage line VIL in the third direction DR3.

The sixth sub-transistor T102 of the tenth transistor T10 includes a sixth sub-channel CH102, a sixth sub-gate electrode G102, the sixth sub-source electrode S102, and a sixth sub-drain electrode D102. The sixth sub-channel CH102 may overlap the sixth sub-gate electrode G102 in the third direction DR3. The sixth sub-gate electrode G102 may be integrally formed with the second gate connection electrode GCE2. The sixth sub-source electrode S102 may be connected to the fifth sub-drain electrode D101, and the sixth sub-drain electrode D102 may be connected to the initialization voltage line VIL through the first power contact hole VCT1. The sixth sub-source electrode S102 and the sixth sub-drain electrode D102 may overlap the initialization voltage line VIL in the third direction DR3.

A seventh sub-transistor T111 of the eleventh transistor T11 includes a seventh sub-channel CH111, a seventh sub-gate electrode G111, a seventh sub-source electrode S111, and a seventh sub-drain electrode D111. The seventh sub-channel CH111 may overlap the seventh sub-gate electrode G111 in the third direction DR3. The seventh sub-gate electrode G111 may be integrally formed with the first gate connection electrode GCE1. The seventh sub-source electrode S111 may be connected to the eighth drain electrode D8, and the seventh sub-drain electrode D111 may be connected to an eighth sub-source electrode S112.

An eighth sub-transistor T112 of the eleventh transistor T11 includes an eighth sub-channel CH112, an eighth sub-gate electrode G112, the eighth sub-source electrode S112, and the eighth sub-drain electrode D112. The eighth sub-channel CH112 may overlap the eighth sub-gate electrode G112 in the third direction DR3. The eighth sub-gate electrode G112 may be integrally formed with the first gate connection electrode GCE1. The eighth sub-source electrode S112 may be connected to the seventh sub-drain electrode D111, and the eighth sub-drain electrode D112 may be connected to the fifth sub-source electrode S101.

The twelfth transistor T12 includes a twelfth channel CH12, a twelfth gate electrode G12, a twelfth source electrode S12, and the twelfth drain electrode D12. The twelfth channel CH12 may overlap the twelfth gate electrode G12 in the third direction DR3. The twelfth gate electrode G12 may be integrally formed with the sixth gate connection electrode GCE6. The twelfth source electrode S12 may be connected to a fifth connection electrode CCE5 through an eleventh contact holes CT11.

The thirteenth transistor T13 includes a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integrally formed with the third gate connection electrode GCE3. The thirteenth source electrode S13 may be connected to the first horizontal power supply line HVDL1 through the second power contact hole VCT2. The thirteenth drain electrode D13 may be connected to the second connection electrode CCE2 through a third contact hole CT3.

The fourteenth transistor T14 includes a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integrally formed with the sixth gate connection electrode GCE6. The fourteenth source electrode S14 may be connected to the fifth connection electrode CCE5 through the eleventh contact holes CT11. The fourteenth drain electrode D14 may be connected to the second connection electrode CCE2 through a fourth contact hole CT4.

The fifteenth transistor T15 includes a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integrally formed with a fifth capacitor electrode CE5. The fifteenth source electrode S15 may be connected to a ninth drain electrode D9. The fifteenth drain electrode D15 may be connected to a seventeenth source electrode S17.

A ninth sub-transistor T161 of the sixteenth transistor T16 includes a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be integrally formed with the third gate connection electrode GCE3. The ninth sub-source electrode S161 may be connected to the fourth connection electrode CCE4 through the tenth contact hole CT10, and the ninth sub-drain electrode D161 may be connected to a tenth sub-source electrode S162.

A tenth sub-transistor T162 of the sixteenth transistor T16 includes a tenth sub-channel CH162, a tenth sub-gate electrode G162, the tenth sub-source electrode S162, and a tenth sub-drain electrode D162. The tenth sub-channel CH162 may overlap the tenth sub-gate electrode G162 in the third direction DR3. The tenth sub-gate electrode G162 may be integrally formed with the third gate connection electrode GCE3. The tenth sub-source electrode S162 may be connected to the ninth sub-drain electrode D161, and the tenth sub-drain electrode D162 may be connected to the initialization voltage line VIL through a ninth contact hole CT9.

The seventeenth transistor T17 includes a seventeenth channel CH17, a seventeenth gate electrode G17, the seventeenth source electrode S17, and a seventeenth drain electrode D17. The seventeenth channel CH17 may overlap the seventeenth gate electrode G17 in the third direction DR3. The seventeenth gate electrode G17 may be integrally formed with a fifth gate connection electrode GCE5. The seventeenth source electrode S17 may be connected to the fifteenth drain electrode D15. The seventeenth drain electrode D17 may be connected to a seventh connection electrode CCE7 through a sixteenth contact holes CT16.

The eighteenth transistor T18 includes an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integrally formed with the third gate connection electrode GCE3. The eighteenth source electrode S18 may be connected to the initialization voltage line VIL through the ninth contact hole CT9. The eighteenth drain electrode D18 may be connected to the seventh connection electrode CCE7 through the sixteenth contact holes CT16.

The nineteenth transistor T19 includes a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth gate electrode G19 may be integrally formed with a seventh gate connection electrode GCE7. The nineteenth source electrode S19 may be connected to a third connection electrode CCE3 through a twenty-first contact hole CT21. The nineteenth drain electrode D19 may be connected to the fourth horizontal power supply line HVSL2 through a twenty-fourth contact hole CT24.

The first test transistor T20 includes a first inspection channel CH20, a first inspection gate electrode G20, a first inspection source electrode S20, and a first inspection drain electrode D20. The first inspection channel CH20 may overlap the first inspection gate electrode G20 in the third direction DR3. The first inspection gate electrode G20 may be integrally formed with an eighth gate connection electrode GCE8. A first test source electrode S20 may be connected to the second horizontal power supply line HVDL2 through a twenty-ninth contact hole CT29. A first test drain electrode D20 may be connected to the third horizontal power supply line HVSL1 through a thirtieth contact hole CT30.

The second test transistor T21 includes a second test channel CH21, a second test gate electrode G21, a second test source electrode S21, and a second test drain electrode D21. The second test channel CH21 may overlap the second test gate electrode G21 in the third direction DR3. The second test gate electrode G21 may be integrally formed with a ninth gate connection electrode GCE9. A second test source electrode S21 may be connected to the second horizontal power supply line HVDL2 through a thirty-second contact hole CT32. A second test drain electrode D21 may be connected to the third horizontal power supply line HVSL1 through a thirty-third contact hole CT33.

The first capacitor electrode CE1 may be integrally formed with the first gate electrode G1. The second capacitor electrode CE2 may overlap the first capacitor electrode CE1 in the third direction DR3. The first capacitor electrode CE1 may be one electrode of the first capacitor C1, and the second capacitor electrode CE2 may be the other electrode of the first capacitor PC1.

The second capacitor electrode CE2 includes a hole exposing the first gate electrode G1 and the first connection electrode CCE1 may be connected to the first gate electrode G1 through the first contact hole CT1 in the hole.

The second capacitor electrode CE2 may include an extension EX extending in the second direction DR2. The extension EX of the second capacitor electrode CE2 may cross the $k^{th}$ PWM light emitting line PWELK and a first horizontal voltage line HVDL1. The extension EX of the second capacitor electrode CE2 may be connected to the $k^{th}$ sweep signal line SWPLK through a fifth contact hole CT5.

The third capacitor electrode CE3 may be formed integrally with the eighth gate electrode G8. A fourth capacitor electrode CE4 may overlap the third capacitor electrode CE3 in the third direction DR3. The third capacitor electrode CE3 may be one electrode of a second capacitor PC2 and the fourth capacitor electrode CE4 may be the other electrode of the second capacitor PC2.

The fourth capacitor electrode CE4 includes the hole exposing the eighth gate electrode G8 and a sixth connection electrode CCE6 may be connected to the eighth gate electrode G8 through a twelfth contact hole CT12 in the hole.

The fifth capacitor electrode CE5 may be integrally formed with a fourth gate connection electrode GCE4 and the fifteenth gate electrode G15. A sixth capacitor electrode CE6 may overlap the fifth capacitor electrode CE5 in the third direction DR3. The fifth capacitor electrode CE5 may be one electrode of a third capacitor PC3 and the sixth capacitor electrode CE6 may be the other electrode of the third capacitor PC3. The sixth capacitor electrode CE6 may be connected to the initialization voltage line VIL through an eighteenth contact hole CT18.

The first gate connection electrode GCE1 may be connected to the $k^{th}$ write scan line GWLk through a first gate contact hole GCT1 and a third gate contact hole GCT3. The second gate connection electrode GCE2 may be connected to the $k^{th}$ initialization scan line GILk through a second gate contact hole GCT2. The third gate connection electrode GCE3 may be connected to the $k^{th}$ control scan line GCLK through an eighth contact hole CT8. The fourth gate connection electrode GCE4 may be connected to the fourth connection electrode CCE4 through a seventeenth contact hole CT17. The fifth gate connection electrode GCE5 may be connected to the $k^{th}$ PAM light emitting line PAELk through a nineteenth contact hole CT19. The sixth gate connection electrode GCE6 may be connected to the $k^{th}$ PWM light emitting line PWELK through a fourteenth contact hole CT14.

The first data connection electrode DCE1 may be connected to the second source electrode S2 through the first data contact hole DCT1 and may be connected to the $j^{th}$ data line DLj through a second data contact hole DCT2. The second data connection electrode DCE2 may be connected to the ninth source electrode S9 through the third data contact hole DCT3 and may be connected to the first PAM data line RDL through a fourth data contact hole DCT4.

The first connection electrode CCE1 may be extended in the second direction DR2. The first connection electrode CCE1 may be connected to the first gate electrode G1 through the first contact hole CT1 and may be connected to the first sub-source electrode S31 and the fourth sub-drain electrode D42 through a second contact hole CT2.

The second connection electrode CCE2 may be extended in the first direction DR1. The second connection electrode CCE2 may be connected to the twelfth drain electrode D12 through the third contact hole CT3, may be connected to the fourteenth drain electrode D14 through a fourteenth contact hole CT4, and may be connected to the fourth capacitor electrode CE4 through a fifteenth contact hole CT15.

The third connection electrode CCE3 may be connected to the nineteenth source electrode S19 through the twenty-first contact hole CT21 and may be connected to the first pad connection electrode ANDE1 through a twenty-second contact hole CT22.

The fourth connection electrode CCE4 may be extended in the first direction DR1. The fourth connection electrode CCE4 may be connected to the sixth drain electrode D6 and the ninth sub-source electrode S161 through the tenth contact hole CT10 and may be connected to the fourth gate connection electrode GCE4 through the seventeenth contact hole CT17.

The fifth connection electrode CCE5 may be extended in the first direction DR1. The fifth connection electrode CCE5 may be connected to the twelfth source electrode S12 and the fourteenth source electrode S14 through the eleventh contact holes CT11 and may be connected the fourth capacitor electrode CE4 through a fourth power contact hole VDCT4.

The sixth connection electrode CCE6 may be extended in the second direction DR2. The sixth connection electrode CCE6 may be connected to the third capacitor electrode CE3 through the twelfth contact hole CT12 and may be connected to the fifth sub-source electrode S101 and the eighth sub-drain electrode D112 through a thirteenth contact hole CT13.

The seventh connection electrode CCE7 may be connected to the seventeenth drain electrode D17 and the eighteenth drain electrode D18 through the sixteenth contact holes CT16. The seventh connection electrode CCE7 may be connected to the first pad connection electrode ANDE1 through a twentieth contact hole CT20.

A power connection electrode VDCE may be extended in the second direction DR2. The power connection electrode VDCE may be connected to the fifth connection electrode CCE5 through a fourth power contact hole VCT4.

The first pad connection electrode ANDE1 may be extended in the second direction DR2. The first pad connection electrode ANDE1 may be connected to the seventh connection electrode CCE7 through the twentieth contact hole CT20 and may be connected to the third connection electrode CCE3 through the twenty-second contact hole CT22.

Figure 12:
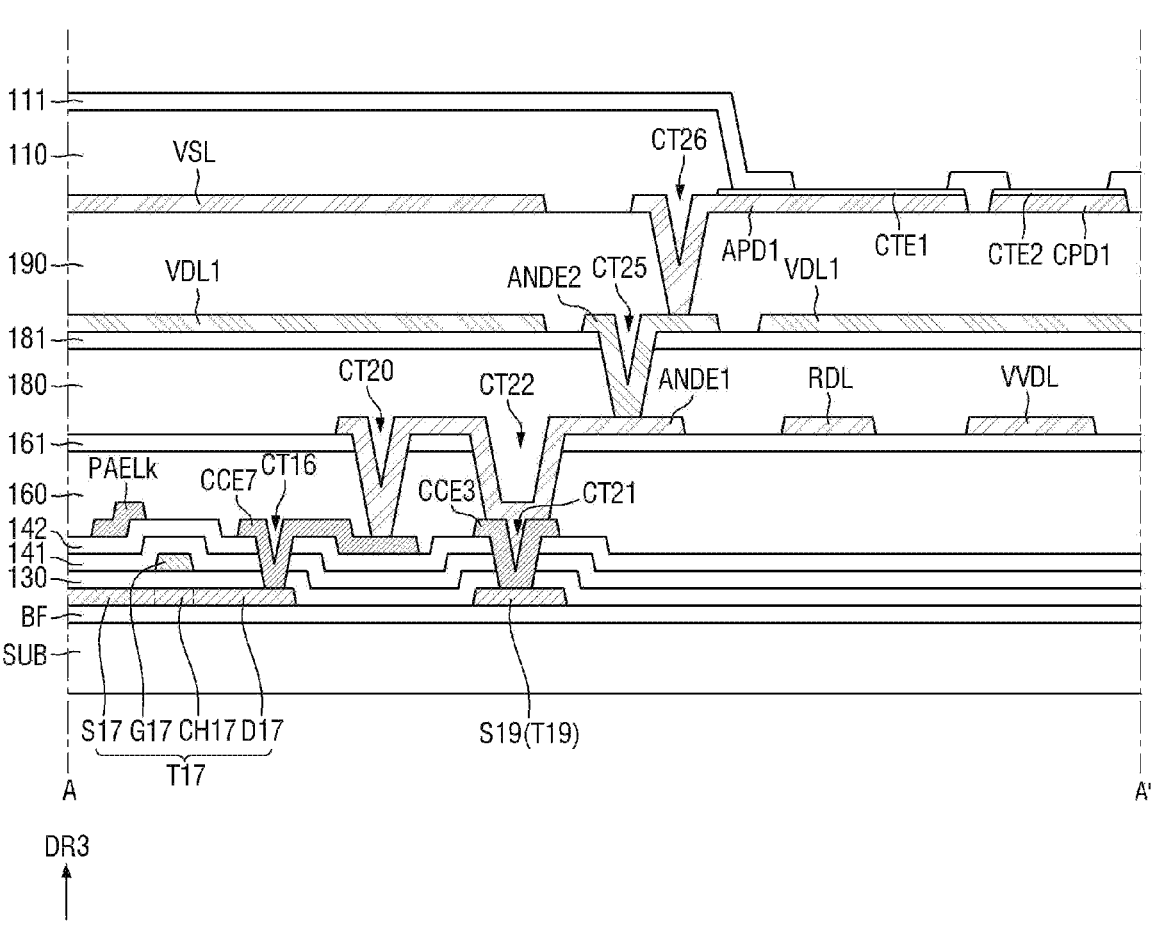
FIG. 12 is a cross-sectional view illustrating an example of the first sub-pixel taken along the line A-A' of FIGS. 5 to 8.

The second pad connection electrode ANDE2 may be connected to the first pad connection electrode ANDE1 through a twenty-fifth contact hole CT25 (e.g., FIG. 12).

The third pad connection electrode APD1 may be connected to the second pad connection electrode ANDE2 through a twenty-sixth contact hole CT26 (e.g., FIG. 12).

In one or more embodiments, a first main power supply line MVDL may be connected to the power connection electrode VDCE through a twenty-seventh contact hole CT27 (e.g., see FIG. 6). The first main power supply line MVDL may overlap the first to nineteenth transistors T1 to T19. The first main power supply line MVDL may not overlap the first and second test transistors T20 and T21.

In one or more embodiments, the second main power supply line MVSL may be connected to a third pad connection electrode APD1. The second main power supply line MVSL may overlap the first main power supply line MVDL. The second main power supply line MVSL may overlap the first to nineteenth transistors T1 to T19. The second main power supply line MVSL may overlap the second test transistor T21 but may not overlap the first test transistor T20.

According to one or more embodiments, a layout of the second sub-pixel GP and a layout of the third sub-pixel BP may be substantially the same as the first sub-pixel RP described with reference to FIGS. 5 to 11. Therefore, the description of the layout of the second sub-pixel GP and the layout of the third sub-pixel BP according to one or more embodiments will be omitted.

Figure 13:
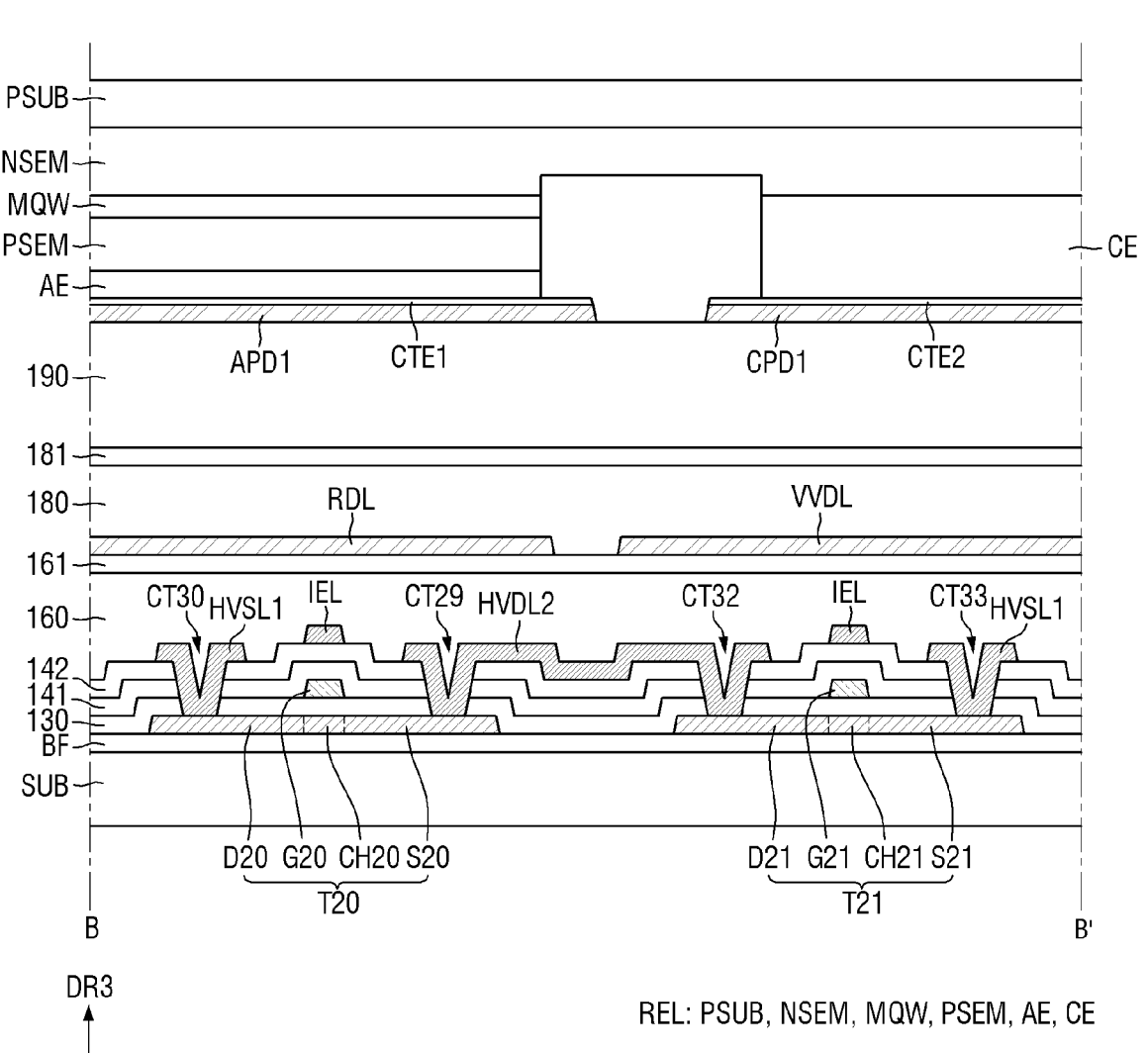
FIG. 13 is a cross-sectional view illustrating an example of the first sub-pixel taken along the line B-B' of FIGS. 5 to 8.

FIG. 12 is a cross-sectional view illustrating an example of the first sub-pixel taken along the line A-A' of FIGS. 5 to 8. FIG. 13 is a cross-sectional view illustrating an example of the first sub-pixel taken along the line B-B' of FIGS. 5 to 8.

Referring to FIGS. 12 and 13, the display panel 100 may include a substrate SUB, a thin film transistor layer, and a light emitting device layer.

The substrate SUB may be made of an insulating material such as glass or polymer resin. For example, when the substrate SUB is made of a polymer resin, it may include polyimide. The substrate SUB may be a flexible substrate capable of bending, folding, rolling, or the like.

A buffer layer BF may be disposed on the substrate SUB. The buffer layer BF may be formed of a plurality of inorganic layers alternately stacked. For example, the buffer layer BF may be formed as a multilayer in which one or more inorganic layers of a silicon nitride layer, a silicon oxynitride layer, a silicon oxide layer, a titanium oxide layer, and an aluminum oxide layer are alternately stacked.

The thin film transistor layer may be disposed on the buffer layer BF. The thin film transistor layer may include the first to nineteenth transistors T1 to T19 and the first and second test transistors T20 and T21.

The active layer may be disposed on the buffer layer BF. The active layer includes channels of the first to nineteenth transistors T1 to T19 and the first and second test transistors T20 and T21, source electrodes, and drain electrodes. The active layer may include polycrystalline silicon, single crystal silicon, low-temperature polycrystalline silicon, amorphous silicon, or an oxide semiconductor.

The channels of the first to nineteenth transistors T1 to T19 and the first and second test transistors T20 and T21 may respectively overlap each of the gate electrodes G1 to G21 in the third direction DR3. The source electrodes and drain electrodes of the first to nineteenth transistors T1 to T19 and the first and second test transistors T20 and T21 may not overlap the gate electrodes G1 to G21 in the third direction DR3. The source electrodes and drain electrodes of the first to nineteenth transistors T1 to T19 and the first and second test transistors T20 and T21 may be conductive areas obtained by doping a silicon semiconductor or an oxide semiconductor with ions.

A gate insulating layer 130 may be disposed on the active layer. The gate insulating layer 130 may be formed of an inorganic layer, for example, a silicon nitride layer, a silicon oxynitride layer, a silicon oxide layer, a titanium oxide layer, or an aluminum oxide layer.

The first gate metal layer may be disposed on the gate insulating layer 130. The first gate metal layer includes the first to nineteenth gate electrodes G1 to G19 of the first to nineteenth transistors T1 to T19, the first and second test gate electrodes G20 and G21 of the first and second test transistors T20 and T21, the first capacitor electrode CE1, the third capacitor electrode CE3, the fifth capacitor electrode CE5 and first to ninth gate connection electrodes GCE1 to GCE9. The first to nineteenth gate electrodes G1 to G19, the first capacitor electrode CE1, the third capacitor electrode CE3, the fifth capacitor electrode CE5, and the first to ninth gate connection electrodes GCE1 to GCE9 may be formed as a single layer or multiple layers made of any one of molybdenum (Mo), aluminum (A1), chromium (Cr), gold (Au), titanium (Ti), nickel (Ni), neodymium (Nd), and copper (Cu) or an alloy thereof.

A first interlayer insulating layer 141 may be disposed on the first gate metal layer. The first interlayer insulating layer 141 may be formed of the inorganic layer, for example, the silicon nitride layer, the silicon oxynitride layer, the silicon oxide layer, the titanium oxide layer, or the aluminum oxide layer.

The second gate metal layer may be disposed on the first interlayer insulating layer 141. The second gate metal layer may include the second capacitor electrode CE2, the fourth capacitor electrode CE4, and the sixth capacitor electrode CE6. The second gate metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second capacitor electrode CE2 may overlap the first capacitor electrode CE1 in the third direction DR3, the fourth capacitor electrode CE4 may overlap the third capacitor electrode CE3 in the third direction DR3, and the sixth capacitor electrode CE6 may overlap the fifth capacitor electrode CE5 in the third direction DR3. Because the first interlayer insulating layer 141 has a dielectric constant (e.g., a suitable dielectric constant, such as, a predetermined dielectric constant), the first capacitor PC1 may be formed by the first capacitor electrode CE1, the second capacitor electrode CE2, and the first interlayer insulating layer 141 disposed therebetween. Further, the second capacitor PC2 may be formed by the third capacitor electrode CE3, the fourth capacitor electrode CE4, and the first interlayer insulating layer 141 disposed therebetween.

A second interlayer insulating layer 142 may be disposed on the second gate metal layer. The second interlayer insulating layer 142 may be formed of an inorganic layer, for example, the silicon nitride layer, the silicon oxynitride layer, the silicon oxide layer, the titanium oxide layer, or the aluminum oxide layer.

The first source metal layer may be disposed on the second interlayer insulating layer 142. The first source metal layer may include an initialization voltage lines VIL, the $k^{th}$ scan initialization line GILk, the $k^{th}$ scan write line GWLk, the $k^{th}$ PWM emission line PWELK, the first horizontal power supply line HVDL1, the second horizontal power supply line HVDL2, the third horizontal power supply line HVSL1, the fourth horizontal power supply line HVSL2, the gate-off voltage line VGHL, the k$^{th}$ sweep signal line SWPLK, the k$^{th}$ scan control line GCLk, a k$^{th}$ PAM emission line PAELK, an inspection enable signal line IEL, and the test signal line TSTL. Further, the first source metal layer may include the first and second data connection electrodes DCE1 and DCE2 and the first to seventh connection electrodes CCE1 to CCE7. The first source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The k$^{th}$ scan write line GWLk may be connected to the fourth sub-gate electrode G42 and the eighth sub-gate electrode G112 through the first gate contact hole GCT1 and the third gate contact hole GCT3, respectively, penetrating the first interlayer insulating layer 141 and the second interlayer insulating layer 142. The k$^{th}$ scan initialization line GILk may be connected to the second gate connection electrode GCE2 through the second gate contact hole GCT2 penetrating the first interlayer insulating layer 141 and the second interlayer insulating layer 142. The k$^{th}$ scan control line GCLk may be connected to the third gate connection electrode GCE3 through the eighth contact hole CT8 penetrating the first interlayer insulating layer 141 and the second interlayer insulating layer 142.

The k$^{th}$ PAM emission line PAELk may be connected to the fifth gate connection electrode GCE5 through the nineteenth contact hole CT19 penetrating the first interlayer insulating layer 141 and the second interlayer insulating layer 142. The test signal line TSTL may be connected to the seventh gate connection electrode GCE7 through a twenty-third contact hole CT23 penetrating the first interlayer insulating layer 141 and the second interlayer insulating layer 142. The inspection enable signal line IEL may be connected to the eighth gate connection electrode GCE8 through a twenty-eighth contact hole CT28 penetrating the first interlayer insulating layer 141 and the second interlayer insulating layer 142. The inspection enable signal line IEL may be connected to the ninth gate connection electrode GCE9 through a thirty-first contact hole CT31 penetrating the first interlayer insulating layer 141 and the second interlayer insulating layer 142.

The initialization voltage line VIL may be connected to the second sub-drain electrode D32 and the sixth sub-drain electrode D102 through the first power contact hole VCT1 penetrating the gate insulating layer 130, the first interlayer insulating layer 141, and the second interlayer insulating layer 142. The initialization voltage line VIL may be connected to the tenth sub-drain electrode D162 and the eighteenth source electrode S18 through the ninth contact hole CT9 penetrating the gate insulating layer 130, the first interlayer insulating layer 141, and the second interlayer insulating layer 142. The initialization voltage line VIL may be connected to the sixth capacitor electrode CE6 through the eighteenth contact hole CT18 penetrating the second interlayer insulating layer 142. The gate-off voltage line VGHL may be connected to the eighth source electrode S8 through the seventh contact hole CT7 penetrating the gate insulating layer 130, the first interlayer insulating layer 141, and the second interlayer insulating layer 142.

The first horizontal power supply line HVDL1 may be connected to the fifth source electrode S5 and the thirteenth source electrode S13 through the second power contact hole VCT2 penetrating the gate insulating layer 130, the first interlayer insulating layer 141, and the second interlayer insulating layer 142. The fourth horizontal power supply line HVSL2 may be connected to the nineteenth drain electrode D19 through the twenty-fourth contact hole CT24 penetrating the gate insulating layer 130, the first interlayer insulating layer 141, and the second interlayer insulating layer 142.

The second horizontal power supply line HVDL2 may be connected to the first inspection source electrode S20 through the twenty-ninth contact hole CT29 penetrating the gate insulating layer 130, the first interlayer insulating layer 141, and the second interlayer insulating layer 142. The second horizontal power supply line HVDL2 may be connected to the second inspection source electrode S21 through the thirty-second contact hole CT32 penetrating the gate insulating layer 130, the first interlayer insulating layer 141, and the second interlayer insulating layer 142.

The third horizontal power wiring HVSL1 may be connected to the first inspection drain electrode D20 through the thirtieth contact hole CT30 penetrating the gate insulating layer 130, the first interlayer insulating layer 141, and the second interlayer insulating layer 142. The third horizontal power supply line HVSL1 may be connected to the second inspection drain electrode D21 through the thirty third contact hole CT33 penetrating the gate insulating layer 130, the first interlayer insulating layer 141, and the second interlayer insulating layer 142.

The first data connection electrode DCE1 may be connected to the second source electrode S2 through the first data contact hole DCT1 penetrating the gate insulating layer 130, the first interlayer insulating layer 141, and the second interlayer insulating layer 142. The second data connection electrode DCE2 may be connected to the ninth source electrode S9 through the third data contact hole DCT3 penetrating the gate insulating layer 130, the first interlayer insulating layer 141, and the second interlayer insulating layer 142.

The first connection electrode CCE1 may be connected to the first gate electrode G1 through the first contact hole CT1 penetrating the first interlayer insulating layer 141 and the second interlayer insulating layer 142 and may be connected to the first sub-source electrode S31 and the fourth sub-drain electrode D42 through the second contact hole CT2 penetrating the gate insulating layer 130, the first interlayer insulating layer 141, and the second interlayer insulating layer 142.

The second connection electrode CCE2 may be connected to the thirteenth drain electrode D13 through the third contact hole CT3 penetrating the gate insulating layer 130, the first interlayer insulating layer 141, and the second interlayer insulating layer 142, may be connected to the fourteenth drain electrode D14 through the fourth contact hole CT4 penetrating the gate insulating layer 130, the first interlayer insulating layer 141, and the second interlayer insulating layer 142, and may be connected to the fourth capacitor electrode CE4 through the fifteenth contact hole CT15 penetrating the second interlayer insulating layer 142.

The third connection electrode CCE3 may be connected to the nineteenth source electrode S19 through the twenty-first contact hole CT21 penetrating the gate insulating layer 130, the first interlayer insulating layer 141, and the second interlayer insulating layer 142.

The fourth connection electrode CCE4 may be connected the sixth drain electrode D6 through the tenth contact hole CT10 penetrating the gate insulating layer 130, the first interlayer insulating layer 141, and the second interlayer insulating layer 142 and may be connected to the fourth gate connection electrode GCE4 through the seventeenth contact hole CT17 penetrating the first interlayer insulating layer 141 and the second interlayer insulating layer 142.

The fifth connection electrode CCE5 may be connected to the twelfth source electrode S12 and the fourteenth source electrode S14 through the eleventh contact holes CT11 penetrating the gate insulating layer 130, the first interlayer insulating layer 141, and the second interlayer insulating layer 142.

The sixth connection electrode CCE6 may be connected to the eighth gate electrode G8 through the twelfth contact hole CT12 penetrating the first interlayer insulating layer 141 and the second interlayer insulating layer 142 and may be connected to the fifth sub-source electrode S101 and the eighth sub-drain electrode D112 through the thirteenth contact hole CT13 penetrating the gate insulating layer 130, the first interlayer insulating layer 141, and the second interlayer insulating layer 142.

The seventh connection electrode CCE7 may be connected to the seventeenth drain electrode D17 and the eighteenth drain electrode D18 through the sixteenth contact holes CT16 penetrating the gate insulating layer 130, the first interlayer insulating layer 141, and the second interlayer insulating layer 142.

A first planarization layer 160 may be disposed on the first source metal layer. The first planarization layer 160 may be formed of an organic layer such as acryl resin, epoxy resin, phenolic resin, polyamide resin, polyimide resin and the like. The first planarization layer 160 may be referred to as a fourth insulating layer.

A first inorganic insulating layer 161 may be disposed on the first planarization layer 160. The first inorganic insulating layer 161 may be formed of the inorganic layer, for example, the silicon nitride layer, the silicon oxynitride layer, the silicon oxide layer, the titanium oxide layer, or the aluminum oxide layer. A second interlayer insulating layer 142 may be referred to as a third insulating layer.

The second source metal layer may be disposed on the first inorganic insulating layer 161. The second source metal layer may include the $j^{th}$ data line DLj, the vertical power supply line VVDL, and the first PAM data line RDL. Further, the second source metal layer may include the first pad connection electrode ANDE1 and the power connection electrode VDCE. The second source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The $j^{th}$ data line DLj may be connected to the first data connection electrode DCE1 through the second data contact hole DCT2 penetrating the first planarization layer 160 and the first inorganic insulating layer 161. The first PAM data line RDL may be connected to the second data connection electrode DCE2 through the fourth data contact hole DCT4 penetrating the first planarization layer 160 and the first inorganic insulating layer 161. The vertical power supply line VVDL may be connected to the first horizontal power supply line HVDL1 through a third power contact hole VCT3 passing through the first planarization layer 160 and the first inorganic insulating layer 161. The third power contact hole VCT3 may overlap the second power contact hole VCT2 in the third direction DR3. The area of the third power contact hole VCT3 may be larger than the area of the second power contact hole VCT2.

The first pad connection electrode ANDE1 is connected to the seventh connection electrode CCE7 through the twentieth contact hole CT20 penetrating the first planarization layer 160 and the first inorganic insulating layer 161 and may be connected to the third connection electrode CCE3 through the twenty-second contact hole CT22 penetrating the first planarization layer 160 and the first inorganic insulating layer 161. The power connection electrode VDCE may be connected to the fifth connection electrode CCE5 through the fourth power contact hole VCT4 penetrating the first planarization layer 160 and the first inorganic insulating layer 161.

A second planarization layer 180 may be disposed on the second source metal layer. The second planarization layer 180 may be formed of the organic layer such as acryl resin, epoxy resin, phenolic resin, polyamide resin, polyimide resin and the like. The second planarization layer 180 may be referred to as a fifth insulating layer.

A second inorganic insulating layer 181 may be disposed on the second planarization layer 180. The second inorganic insulating layer 181 may be formed of the inorganic layer, for example, the silicon nitride layer, the silicon oxynitride layer, the silicon oxide layer, the titanium oxide layer, or the aluminum oxide layer. The second interlayer insulating layer 142 may be referred to as the third insulating layer.

The third source metal layer may be disposed on the second inorganic insulating layer 181. The third source metal layer may include the first main power supply line MVDL and the second pad connection electrode ANDE2. The first main power supply line MVDL may be disposed to cover most of the area of the first sub-pixel RP. The first main power supply line MVDL may be connected to the power connection electrode VDCE through a fifth power contact hole VCT5 penetrating the second planarization layer 180 and the second inorganic insulating layer 181. The second pad connection electrode ANDE2 may be connected to the first pad connection electrode ANDE1 through the twenty-fifth contact hole CT25 penetrating the second planarization layer 180 and the second inorganic insulating layer 181. The third source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A third planarization layer 190 may be disposed on the third source metal layer. The third planarization layer 190 may be formed of the organic layer such as acryl resin, epoxy resin, phenolic resin, polyamide resin, polyimide resin and the like. The third planarization layer 190 may be referred to as a sixth insulating layer.

The fourth source metal layer may be disposed on the third planarization layer 190. The fourth source metal layer may include the second main power supply line MVSL, the third pad connection electrode APD1, and the fourth pad connection electrode CPD1. The second main power supply line MVSL may be connected to the fourth pad connection electrode CPD1. That is, the second main power supply line MVSL and the fourth pad connection electrode CPD1 may be integrally formed. The third pad connection electrode APD1 may be connected to the second pad connection electrode ANDE2 through the twenty-sixth contact hole CT26 penetrating the third planarization layer 190. The fourth source metal layer may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

A transparent metal layer may be disposed on the fourth source metal layer. The transparent metal layer may include the first pad electrode CTE1 and the second pad electrode CTE2. A thickness of the first pad electrode CTE1 and a thickness of the second pad electrode CTE2 may be smaller than a thickness of the third pad connection electrode APD1 and a thickness of the fourth pad connection electrode CPD1.

The first pad electrode CTE1 may be disposed on the third pad connection electrode APD1, and the second pad electrode CTE2 may be disposed on the fourth pad connection electrode CPD1. The first pad electrode CTE1 may be electrically connected to a first electrode of the first light emitting element REL, and the second pad electrode CTE2 may be electrically connected to the second electrode of the first light emitting element REL. The transparent metal layer may be made of a transparent metal material (e.g., transparent conductive oxide (TCO)) such as indium zinc oxide (ITO) and indium tin oxide (IZO).

A fourth planarization layer 110 may be disposed on a portion of the third pad connection electrode APD1. The fourth planarization layer 110 may not be disposed on the first pad electrode CTE1 and the second pad electrode CTE2. That is, the first pad electrode CTE1 and the second pad electrode CTE2 may be exposed without being covered by the fourth planarization layer 110. A fourth planarization film 110 may be formed of an organic film such as acrylic resin, epoxy resin, phenolic resin, polyamide resin, polyimide resin, etc. The fourth planarization layer 110 may be referred to as an organic insulating layer.

A fourth inorganic insulating layer 111 may be disposed on the fourth planarization layer 110. The fourth inorganic insulating layer 111 may not be disposed on the edge of the first pad electrode CTE1 and the edge of the second pad electrode CTE2. Therefore, at least a portion of the first pad electrode CTE1 and at least a portion of the second pad electrode CTE2 may be exposed without being covered by the fourth inorganic insulating layer 111. The fourth inorganic insulating layer 111 may be formed of the inorganic layer, for example, the silicon nitride layer, the silicon oxynitride layer, the silicon oxide layer, the titanium oxide layer, or the aluminum oxide layer. The second interlayer insulating layer 142 may be referred to as the third insulating layer.

The light emitting device layer may be disposed on the first pad electrode CTE1 and the second pad electrode CTE2. The light emitting device layer may include light emitting elements REL.

In FIG. 13, it was exemplified that a flip-chip type micro LED is that a first electrode AE of the first light emitting element REL faces a first contact electrode CTE1, and a second electrode CE of the first light emitting element REL faces a second contact electrode CTE2. The first light emitting element REL may be formed of an inorganic material such as GaN. The length of the first light emitting element REL in the first direction DR1, the second direction DR2, and the third direction DR3 may be each several to several hundred μm. For example, the length of the first light emitting element REL in the first direction DR1, the second direction DR2, and the third direction DR3 may each have a length of about 100 μm or less.

The first light emitting elements REL as well as the second light emitting devices GEL and the third light emitting devices BEL may be grown and formed on a semiconductor substrate such as a silicon wafer. The light emitting elements REL, GEL, and BEL may be directly transferred from the silicon wafer onto a first pad electrodes CTE1 and a second pad electrodes CTE2 of the substrate SUB. Alternatively, the light emitting elements REL, GEL, and BEL may be transferred onto the first pad electrodes CTE1 and the second pad electrodes CTE2 of the substrate SUB through an electrostatic method using an electrostatic head or a stamp method using an elastic polymer material such as PDMS or silicon as a transfer substrate.

The first light emitting element REL may be a light emitting structure including a base substrate PSUB, an n-type semiconductor NSEM, an active layer MQW, a p-type semiconductor PSEM, the first electrode AE, and the second electrode CE.

The base substrate PSUB may be a sapphire substrate, but the embodiment of the present specification is not limited thereto.

The n-type semiconductor NSEM may be disposed on one surface of the base substrate PSUB. For example, the n-type semiconductor NSEM may be disposed on the lower surface of the base substrate PSUB. The n-type semiconductor NSEM may be made of GaN doped with an n-type conductivity-type dopant such as Si, Ge, or Sn.

The active layer MQW may be disposed on a portion of one surface of the n-type semiconductor NSEM. The active layer may include a material having a single or multiple quantum well structure. When the active layer contains a material having a multiple quantum well structure, the active layer may have the structure in which a plurality of well layers and barrier layers are alternately laminated. In this case, the well layer may be formed of InGaN, and the barrier layer may be formed of GaN or AlGaN, but is not limited thereto. Alternatively, the active layer may have a structure in which semiconductor materials having large band gap energy and semiconductor materials having small band gap energy are alternately stacked, and may include other Group III to Group V semiconductor materials according to a wavelength band of the emitted light.

The p-type semiconductor PSEM may be disposed on one surface of the active layer MQW. The p-type semiconductor PSEM may be made of GaN doped with a p-type conductivity-type dopant such as Mg, Zn, Ca, Se, or Ba.

The first electrode AE may be disposed on the p-type semiconductor PSEM, and the second electrode CE may be disposed on another portion of one surface of the n-type semiconductor NSEM. Another portion of one surface of the n-type semiconductor NSEM on which the second electrode CE is disposed may be spaced from a portion of one surface of the n-type semiconductor NSEM on which the active layer MQW is disposed.

The first electrode AE may be adhered to the first pad electrode CTE1 through a conductive adhesive member such as an anisotropic conductive film ACF or an anisotropic conductive paste ACP. Alternatively, the first electrode AE may be adhered to the first pad electrode CTE1 through a soldering process.

The second electrode CE may be adhered to the second pad electrode CTE2 through the conductive adhesive member such as the anisotropic conductive film ACF or the anisotropic conductive paste ACP. Alternatively, the second electrode CE may be adhered to the second pad electrode CTE2 through the soldering process.

In summary, the first test transistor T20 may overlap the first electrode AE, the first pad electrode CTE1, the third pad connection electrode APD1, and the first PAM data line RDL of the first light emitting element REL in the third direction DR3. When a sufficient pressure (e.g., a predetermined pressure) is applied to the first light emitting element REL to attach the first light emitting element REL to the first pad electrode CTE1, the third planarization layer 190 supporting the first pad electrode CTE1 and the third pad connection electrode APD1 and the second planarization layer 180 and the second inorganic insulating layer 181 supporting the first PAM data line RDL may collapse.

Accordingly, the first electrode AE of the first light emitting element REL, the first pad electrode CTE1, the third pad connection electrode APD1, and the first PAM data line RDL may be short-circuited the second horizontal power supply line HVDL2 connected to the source electrode S20 of the first test transistor T20. In this case, because a voltage of a different level than the driving voltage according to the driving current is applied to the first electrode AE of the first light emitting element REL, the first light emitting element REL may not emit light as intended. Alternatively, the first pad electrode CTE1, the third pad connection electrode APD1, and the first PAM data line RDL may be short-circuited the third horizontal power supply line HVSL1 connected to the drain electrodes D20 of the first test transistor T20. In this case, because a voltage of a different level than the driving voltage according to the driving current is applied to the second electrode of the first light emitting element REL, the first light emitting element REL may not emit light as intended. That is, by forming the first test transistor T20 and the second test transistor T21, it may be checked whether the first electrode AE or the second electrode CE are short-circuited with another electrode or wiring due to the damage of the first pad electrode CTE1 and the second pad electrode CTE2.

In addition, the second test transistor T21 may overlap the second electrode CE, the second pad electrode CTE2, the fourth pad connection electrode CPD1, and the vertical power supply line VVDL of the first light emitting element REL in the third direction DR3. When a sufficient pressure (e.g., a predetermined pressure) is applied to the first light emitting element REL to attach the first light emitting element REL to the second pad electrode CTE2, the third planarization layer 190 supporting the second pad electrode CTE2 and the fourth pad connection electrode CPD1, and the second planarization layer 180 supporting the vertical power supply line VVDL, and the second inorganic insulating layer 181 may collapse.

Accordingly, the second electrode CE, the second pad electrode CTE2, the fourth pad connection electrode CPD1, and the vertical power supply line VVDL of the first light emitting element REL may be short-circuited the second horizontal power supply line HVDL2 connected to the source electrode S21 of the second test transistor T21. In this case, because a voltage of a different level than the driving voltage according to the driving current is applied to the second electrode CE of the first light emitting element REL, the first light emitting element REL may not emit light as intended. Alternatively, the second electrode CE, the second pad electrode CTE2, the fourth pad connection electrode CPD1, and the vertical power supply line VVDL of the first light emitting element REL may be short-circuited to the third horizontal power supply line HVSL1 connected to the drain electrode D21 of the second test transistor T21. In this case, because a voltage of a different level than the driving voltage according to the driving current is applied to the second electrode of the first light emitting element REL, the first light emitting element REL may not emit light as intended. That is, by forming the first test transistor T20 and the second test transistor T21, it may be checked whether the first electrode AE or the second electrode CE is short-circuited with another electrode or wiring due to the damage of the first pad electrode CTE1 and the second pad electrode CTE2.

Figure 15:
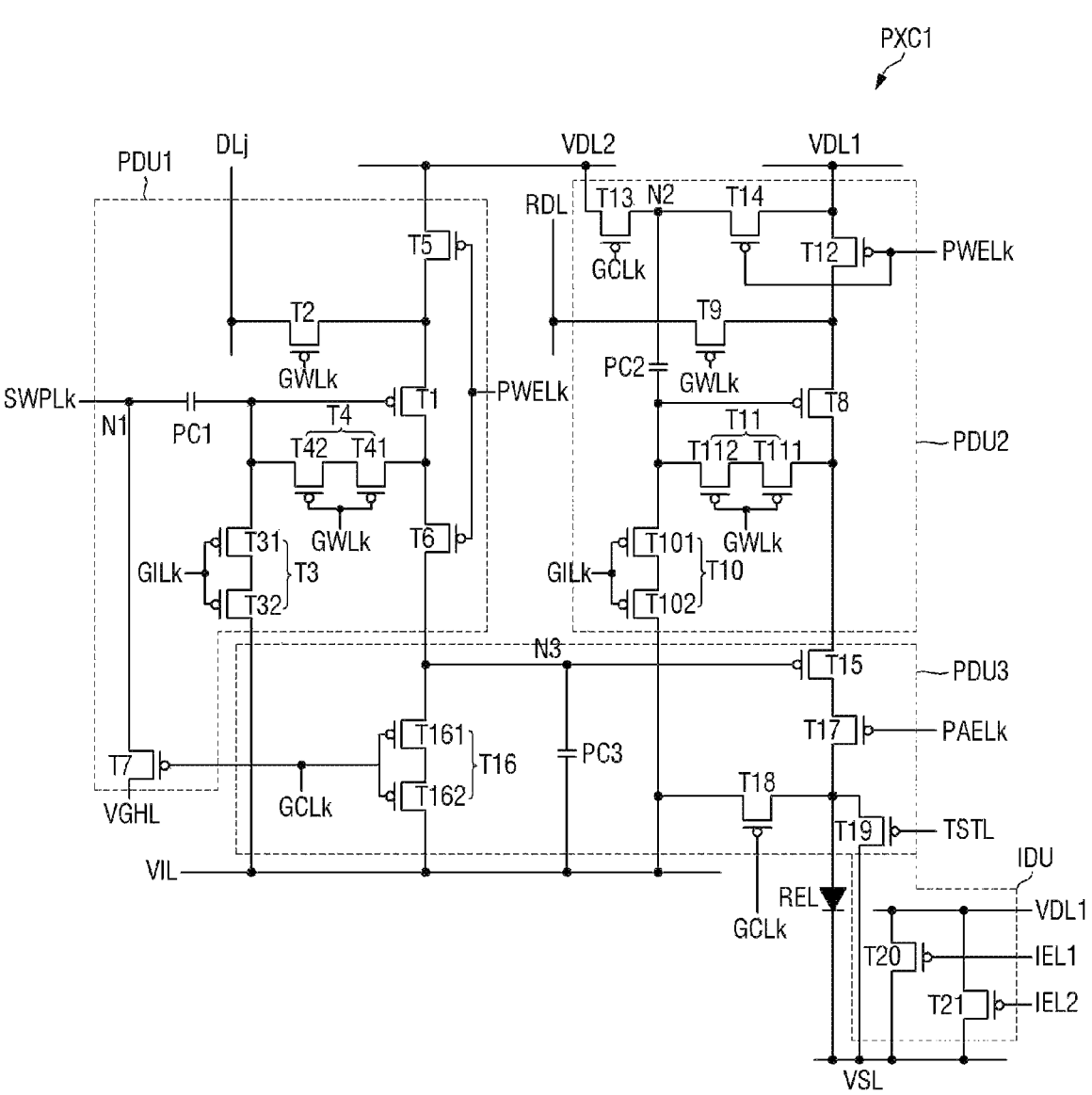
FIG. 15 is a circuit diagram illustrating the first sub-pixel according to one or more embodiments.
Figure 16:
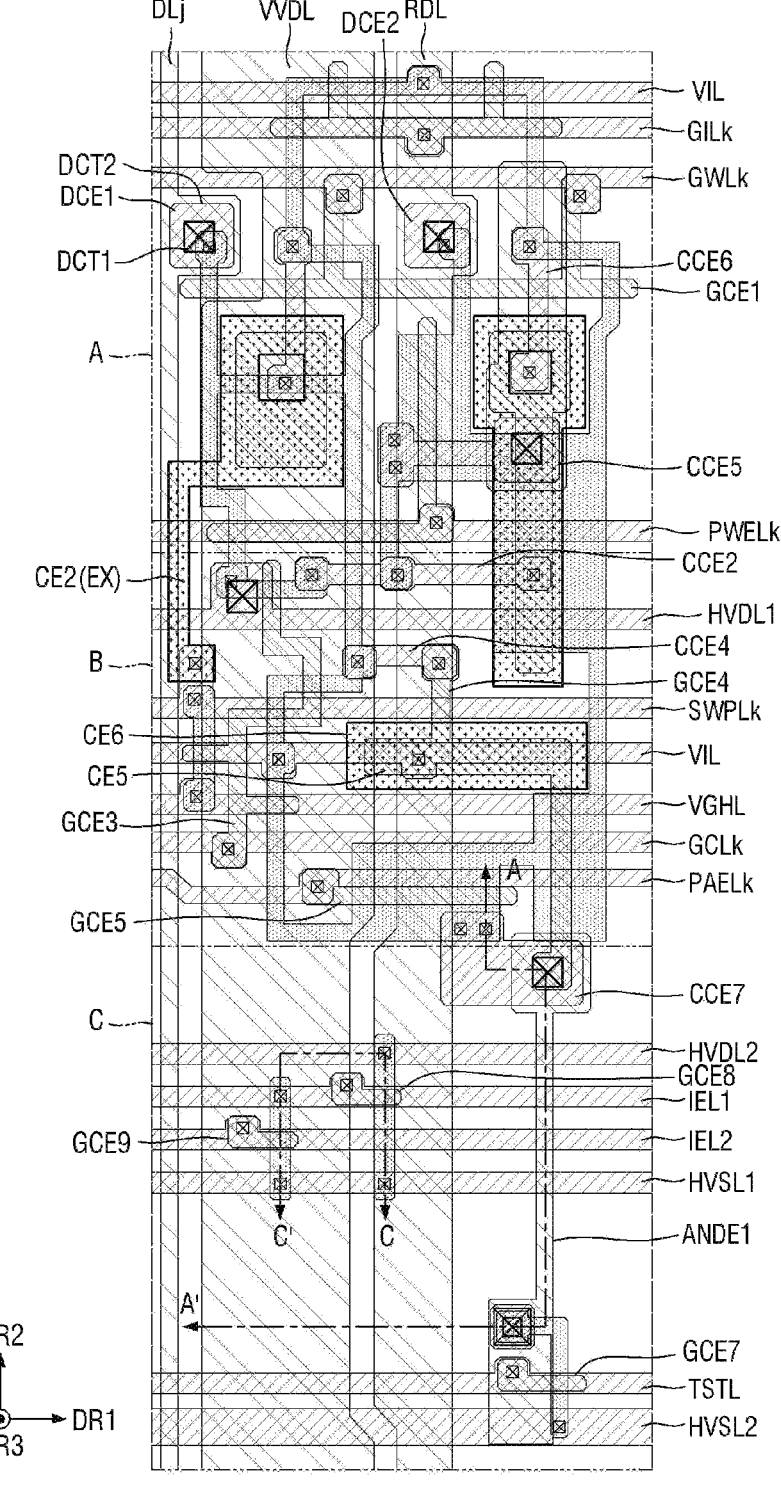
FIG. 16 is a layout diagram illustrating the lower metal layer, the active layer, the first gate metal layer, the second gate metal layer, the first source metal layer, and the second source metal layer of the first sub-pixel according to one or more embodiments.
Figure 17:
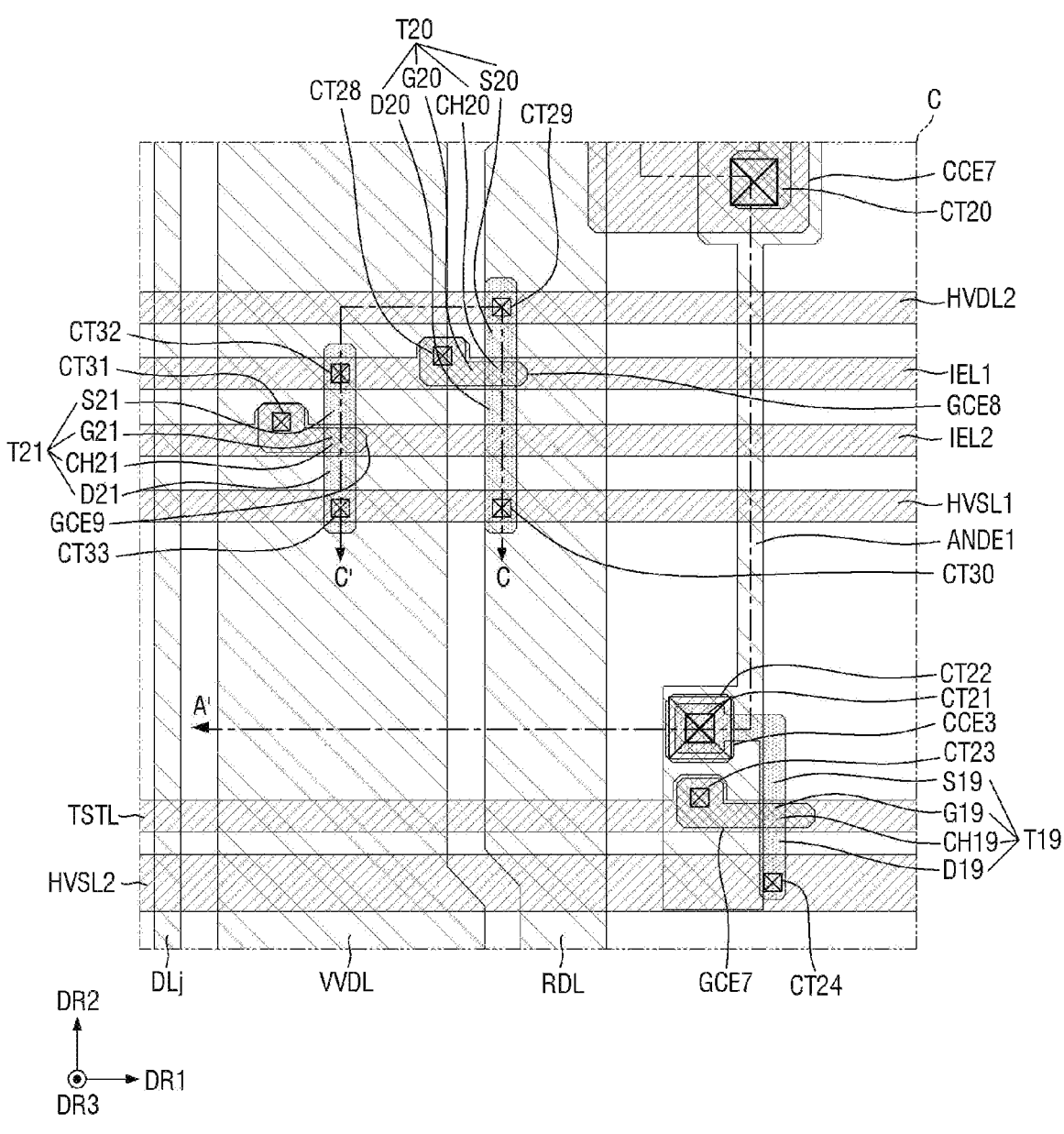
FIG. 17 is an enlarged layout diagram illustrating an area C of FIG. 16 in detail.
Figure 18:
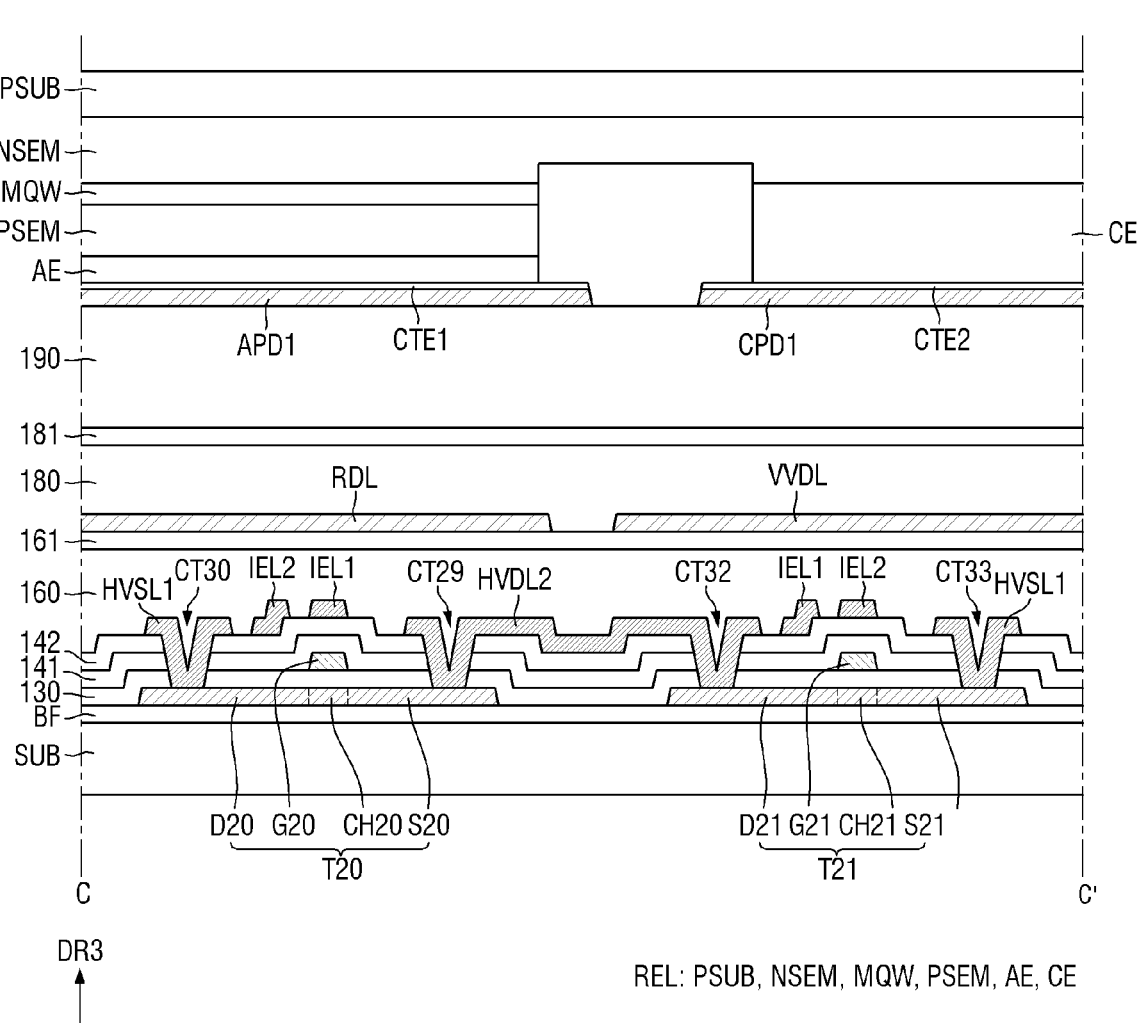
FIG. 18 is a cross-sectional view illustrating an example of the first sub-pixel taken along the line C-C' of FIGS. 16 and 17.

FIG. 15 is a circuit diagram illustrating the first sub-pixel according to one or more embodiments. FIG. 16 is a layout diagram illustrating the lower metal layer, the active layer, the first gate metal layer, the second gate metal layer, the first source metal layer, and the second source metal layer of the first sub-pixel according to one or more embodiments. FIG. 17 is an enlarged layout diagram illustrating an area C of FIG. 16 in detail. FIG. 18 is a cross-sectional view illustrating an example of the first sub-pixel taken along the line C-C' of FIGS. 16 and 17.

The embodiment of FIGS. 15 to 18 is different from the embodiment of FIGS. 4, 5, 11, and 13 in that the first inspection gate electrode G20 of the first test transistor T20 is connected to the first inspection enable signal line IEL1 and the second inspection gate electrode G21 of the second test transistor T21 is connected to the second inspection enable signal line IEL2. In the embodiments of FIGS. 15 to 18, descriptions overlapping those of the embodiments of FIGS. 4, 5, 11, and 13 will be omitted.

Referring to FIG. 15, the first test transistor T20 is turned-on by the first inspection enable signal of the first inspection enable signal line IEL1 to connect the first power supply line VDL1 and the second power supply line VSL. The second test transistor T21 is turned-on by the second inspection enable signal of the second inspection enable signal line IEL2 to connect the first power supply line VDL1 and the second power supply line VSL.

Referring to 16 to 18, the first inspection enable signal line IEL1 and the second inspection enable signal line IEL2 may be extended in the first direction DR1. The first inspection enable signal line IEL1 may be disposed between the second horizontal power supply line HVDL2 and the second inspection enable signal line IEL2 in the second direction DR2. The second inspection enable signal line IEL2 may be disposed between the first inspection enable signal line IEL1 and the third horizontal power supply line HVSL1 in the second direction DR2.

The first inspection enable signal line IEL1 may be connected to the eighth gate connection electrode GCE8 through the twenty-eighth contact hole CT28 penetrating the first interlayer insulating layer 141 and the second interlayer insulating layer 142. The second inspection enable signal line IEL2 may be connected to the ninth gate connection electrode GCE9 through a thirty-first contact hole CT31 penetrating the first interlayer insulating layer 141 and the second interlayer insulating layer 142.

Figure 19:
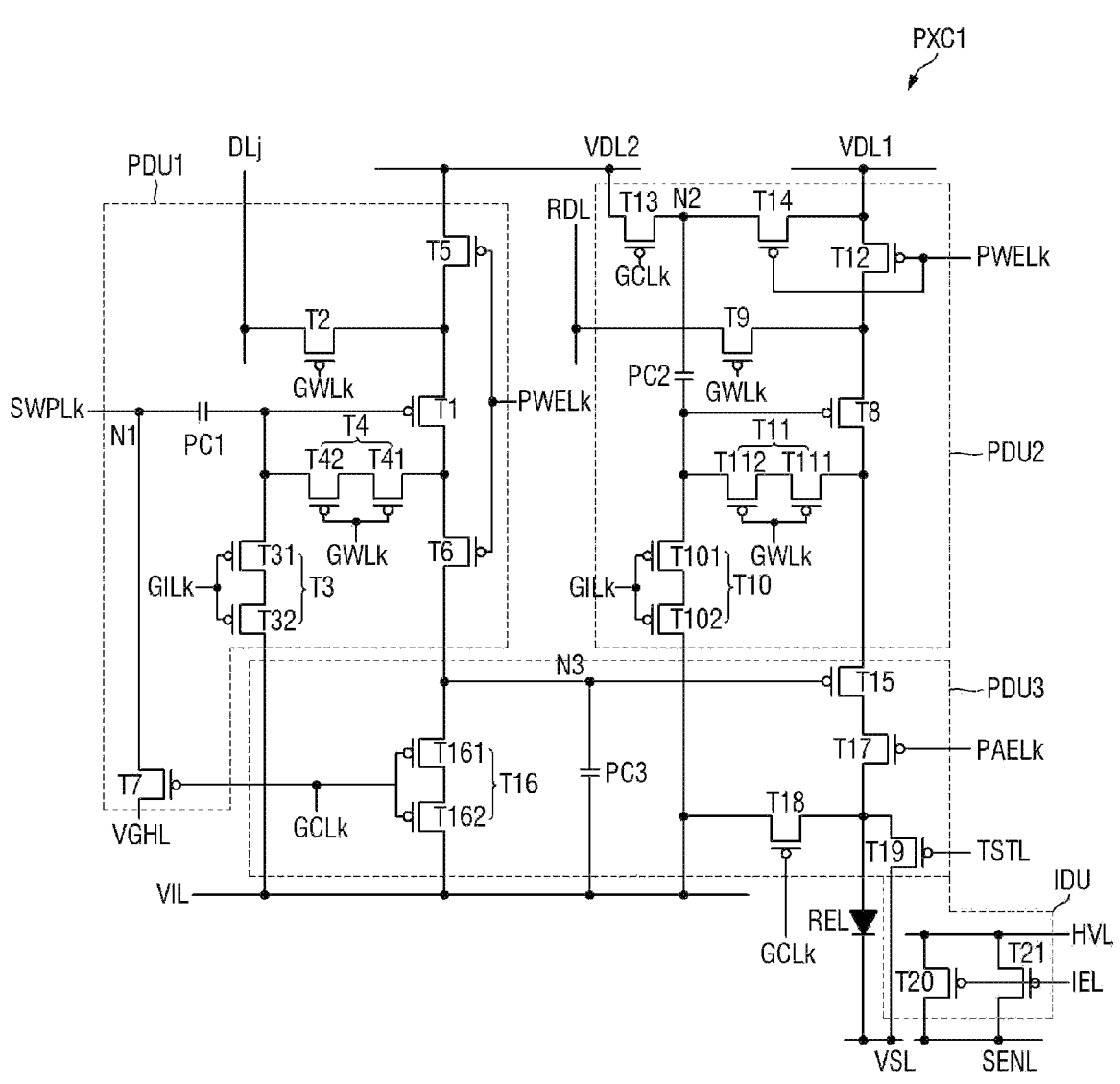
FIG. 19 is a circuit diagram illustrating the first sub-pixel according to one or more embodiments.
Figure 20:
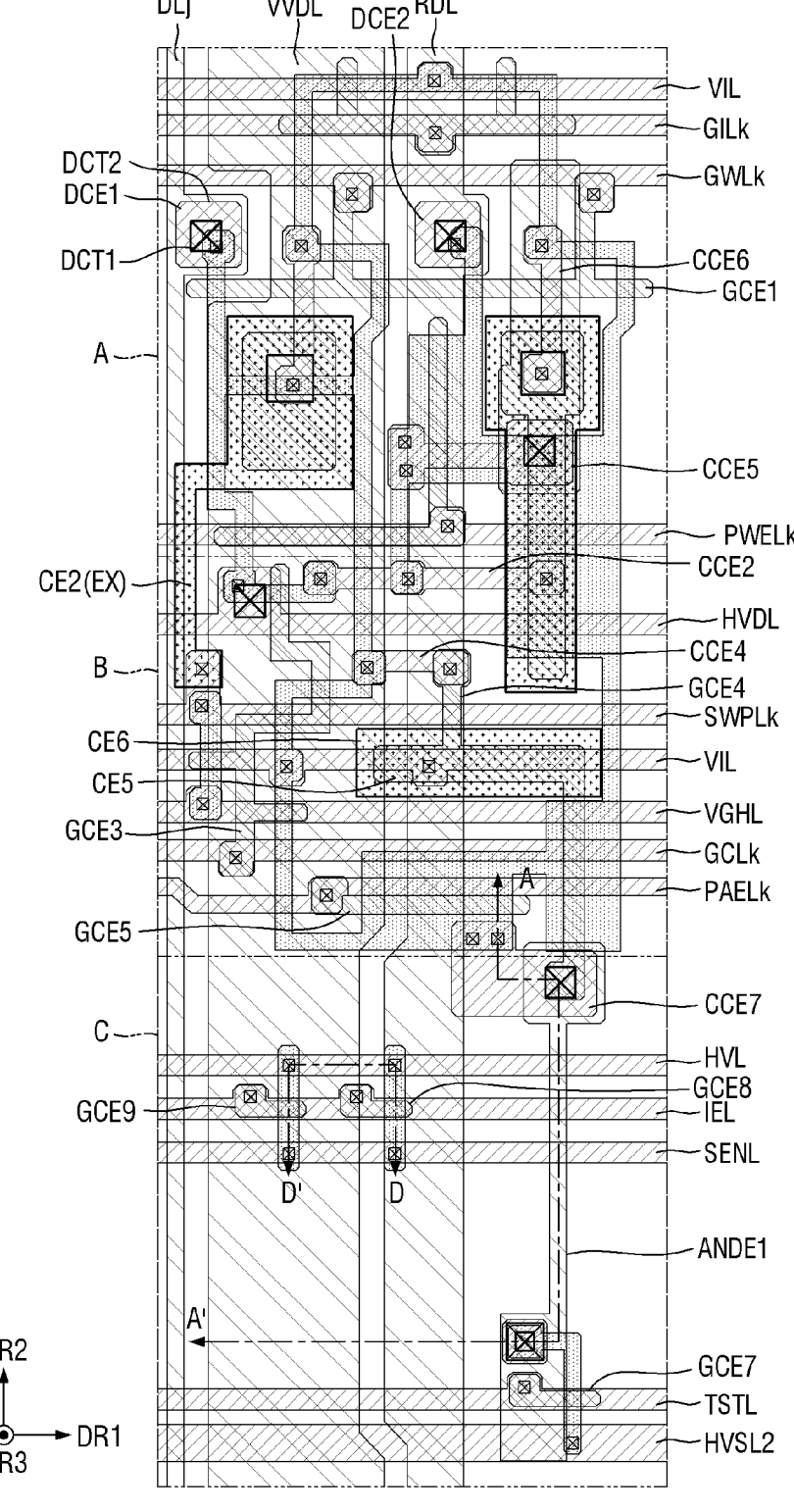
FIG. 20 is a layout diagram illustrating the lower metal layer, the active layer, the first gate metal layer, the second gate metal layer, the first source metal layer, and the second source metal layer of the first sub-pixel according to one or more embodiments.
Figure 21:
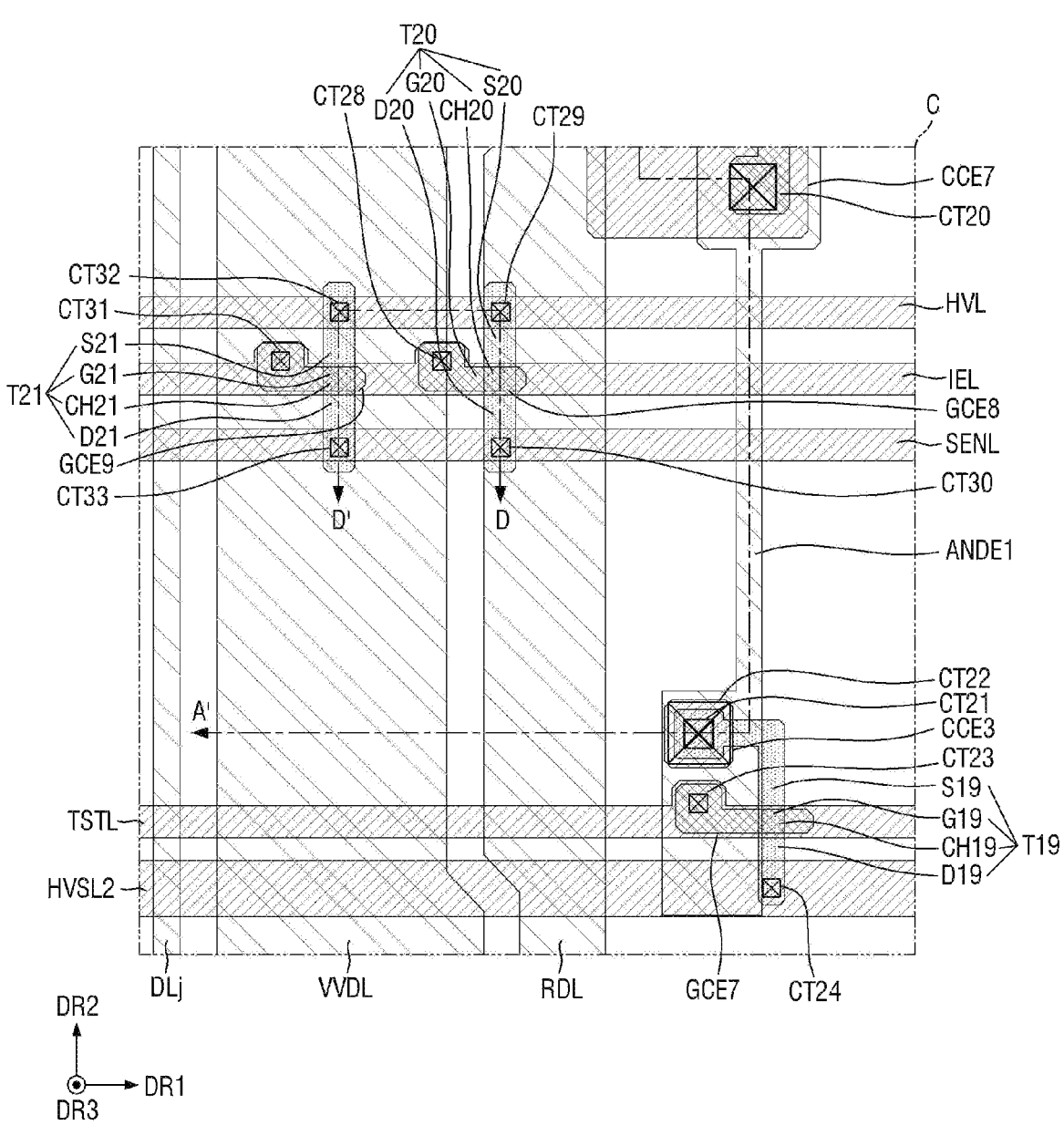
FIG. 21 is an enlarged layout diagram illustrating an area C of FIG. 20 in detail.
Figure 22:
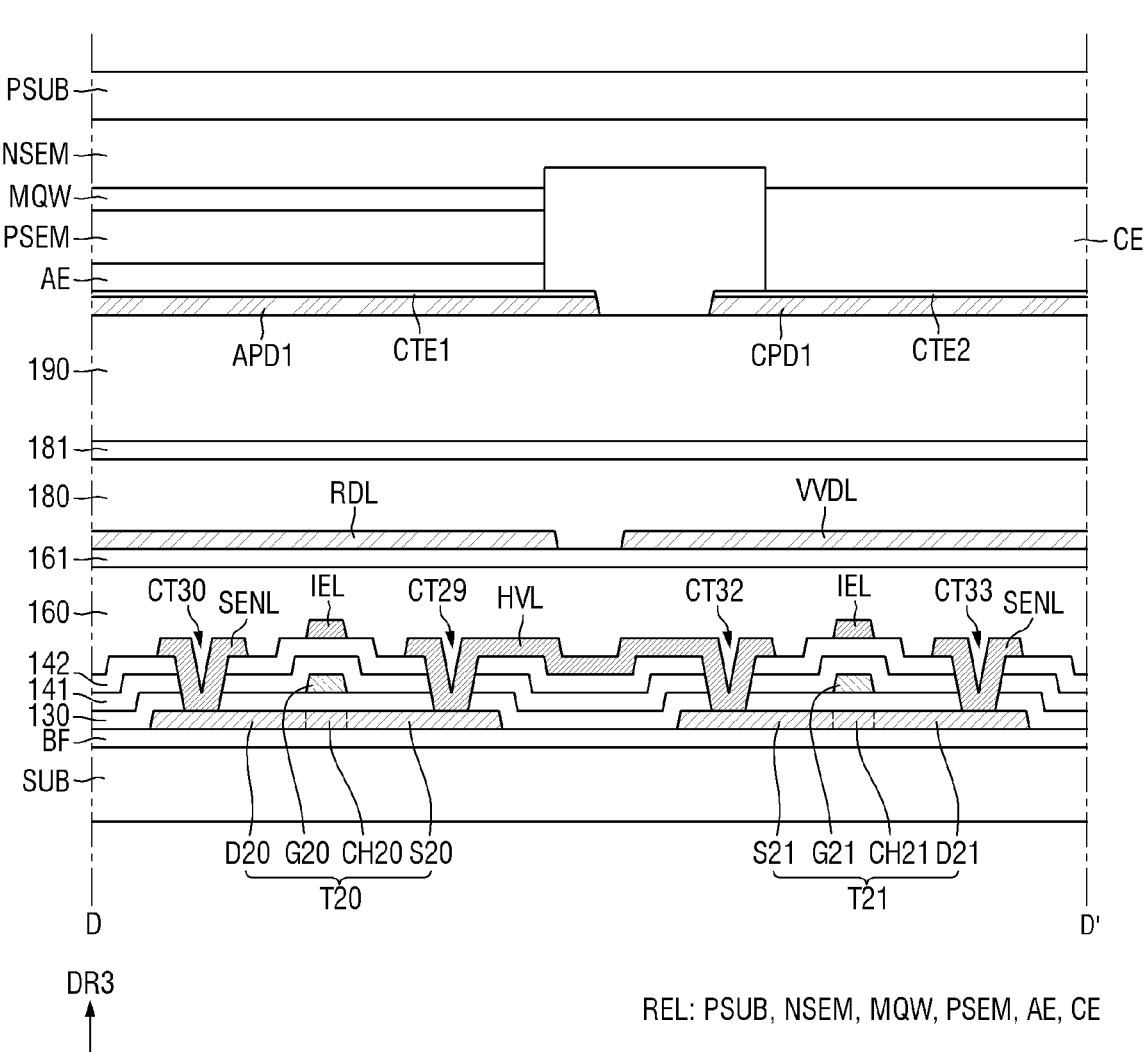
FIG. 22 is a cross-sectional view illustrating an example of the first sub-pixel taken along the line D-D' of FIGS. 20 and 21.

FIG. 19 is a circuit diagram illustrating the first sub-pixel according to one or more embodiments. FIG. 20 is a layout diagram illustrating the lower metal layer, the active layer, the first gate metal layer, the second gate metal layer, the first source metal layer, and the second source metal layer of the first sub-pixel according to one or more embodiments. FIG. 21 is an enlarged layout diagram illustrating an area C of FIG. 20 in detail. FIG. 22 is a cross-sectional view illustrating an example of the first sub-pixel taken along the line D-D' of FIGS. 20 and 21.

The embodiment of FIGS. 19 to 22 is different from the embodiment of FIGS. 4, 5, 11, and 13 in that the first source electrode S20 of the first test transistor T20 and the second source electrode S21 of the second test transistor T21 are connected to a horizontal voltage line HVL to which a suitable voltage (e.g., a predetermined voltage) is applied, and the first drain electrode D20 of the first test transistor T20 and the second drain electrode D21 of the second test transistor T21 are connected to the sensing line SENL. In the embodiment of FIGS. 19 to 22, descriptions overlapping those of the embodiments of FIGS. 4, 5, 11, and 13 will be omitted.

Referring to FIG. 19, the first test transistor T20 and the second test transistor T21 are turned-on by the inspection enable signal of the inspection enable signal line IEL, and then connect the horizontal voltage line HVL to the sensing line SENL. When the first test transistor T20 and the second test transistor T21 are turned-on, a suitable voltage (e.g., a predetermined voltage) of the horizontal voltage line HVL may be sensed by the sensing line SENL. The horizontal voltage line HVL may receive a suitable voltage (e.g., a predetermined voltage). For example, the horizontal voltage line HVL may be supplied a voltage substantially equal to one of the first power voltage of the first power supply line VDL1, the second power voltage of the second power supply line VSL, the third power voltage of the third power supply line VDL2, the gate-off voltage of the gate-off voltage line VGHL, and the initialization voltage of the initialization voltage line VIL.

When a sufficient pressure (e.g., a predetermined pressure) is applied to the first light emitting element REL to attach the first light emitting element REL to the first sub-pixel RP, the first electrode AE of the first light emitting element REL may be short-circuited to at least one of the first electrode and the second electrode of the transistor T20, and the second electrode CE of the first light emitting element REL may be short-circuited to one of the first electrode and the second electrode of the second test transistor T21. In this case, a voltage other than the suitable voltage (e.g., the predetermined voltage) may be sensed by the sensing line SENL. That is, by sensing the voltage of the sensing line SENL through the first test transistor T20 and the second test transistor T21, the first electrode or the second electrode of the first light emitting element REL may be checked for short circuits from the other electrode or wire.

Referring to FIGS. 20 to 22, the horizontal voltage line HVL and the sensing line SENL may be extended in the first direction DR1 and may be disposed to be spaced from each other in the second direction DR2. The inspection enable signal line IEL may be disposed between the horizontal voltage line HVL and the sensing line SENL in the second direction DR2.

The first test source electrode S20 of the first test transistor T20 may be connected to the horizontal voltage line HVL through the twenty-ninth contact hole CT29 penetrating the gate insulating layer 130, the first interlayer insulating layer 141, and the second interlayer insulating layer 142. The first test drain electrode D20 of the first test transistor T20 may be connected to the sensing line SENL through the thirtieth contact hole CT30 penetrating the gate insulating layer 130, the first interlayer insulating layer 141, and the second interlayer insulating layer 142. The second test source electrode S21 of the second test transistor T21 may be connected to the horizontal voltage line HVL through the thirty-second contact hole CT32 penetrating the gate insulating layer 130, the first interlayer insulating layer 141, and the second interlayer insulating layer 142. The second test drain electrode D21 of the second test transistor T21 may be connected to the sensing line SENL through the thirty-third contact hole CT33 penetrating the gate insulating layer 130, the first interlayer insulating layer 141, and the second interlayer insulating layer 142.

Figure 23:
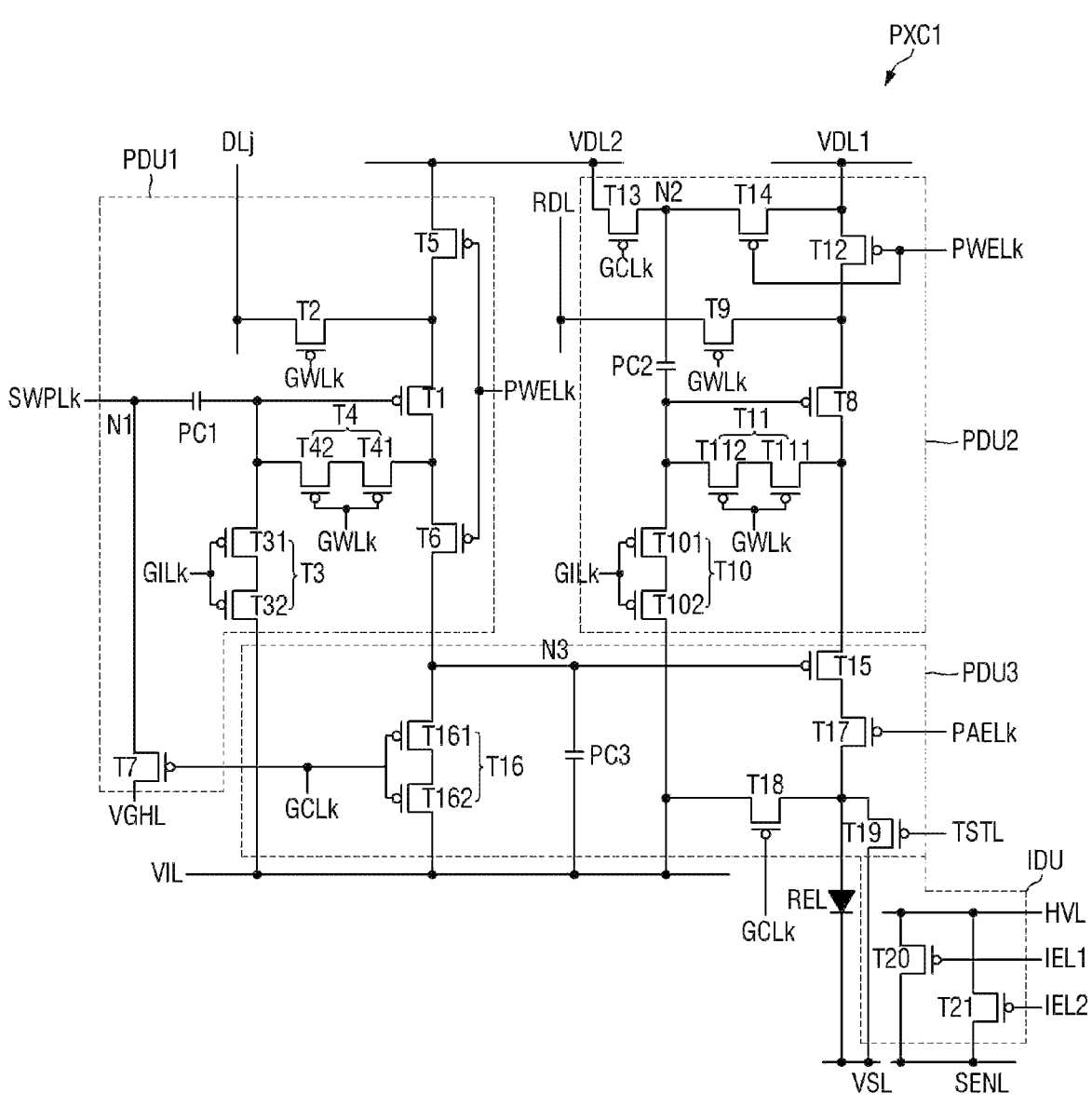
FIG. 23 is a circuit diagram illustrating the first sub-pixel according to one or more embodiments.
Figure 24:
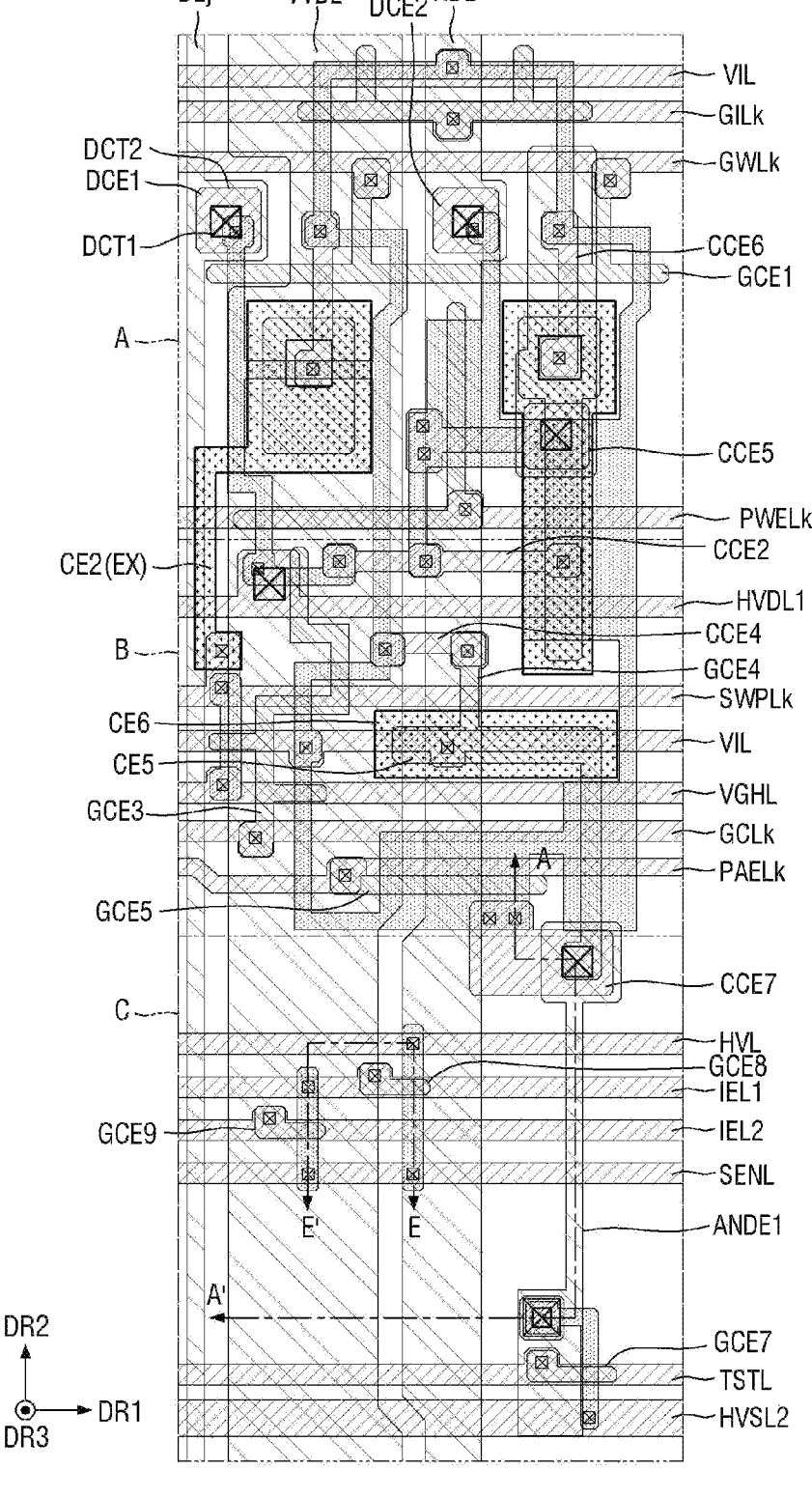
FIG. 24 is a layout diagram illustrating the lower metal layer, the active layer, the first gate metal layer, the second gate metal layer, the first source metal layer, and the second source metal layer of the first sub-pixel according to one or more embodiments.

FIG. 23 is a circuit diagram illustrating the first sub-pixel according to one or more embodiments. FIG. 24 is a layout diagram illustrating the lower metal layer, the active layer, the first gate metal layer, the second gate metal layer, the first source metal layer, and the second source metal layer of a first sub-pixel according to one or more embodiments. FIG.

Figure 25:
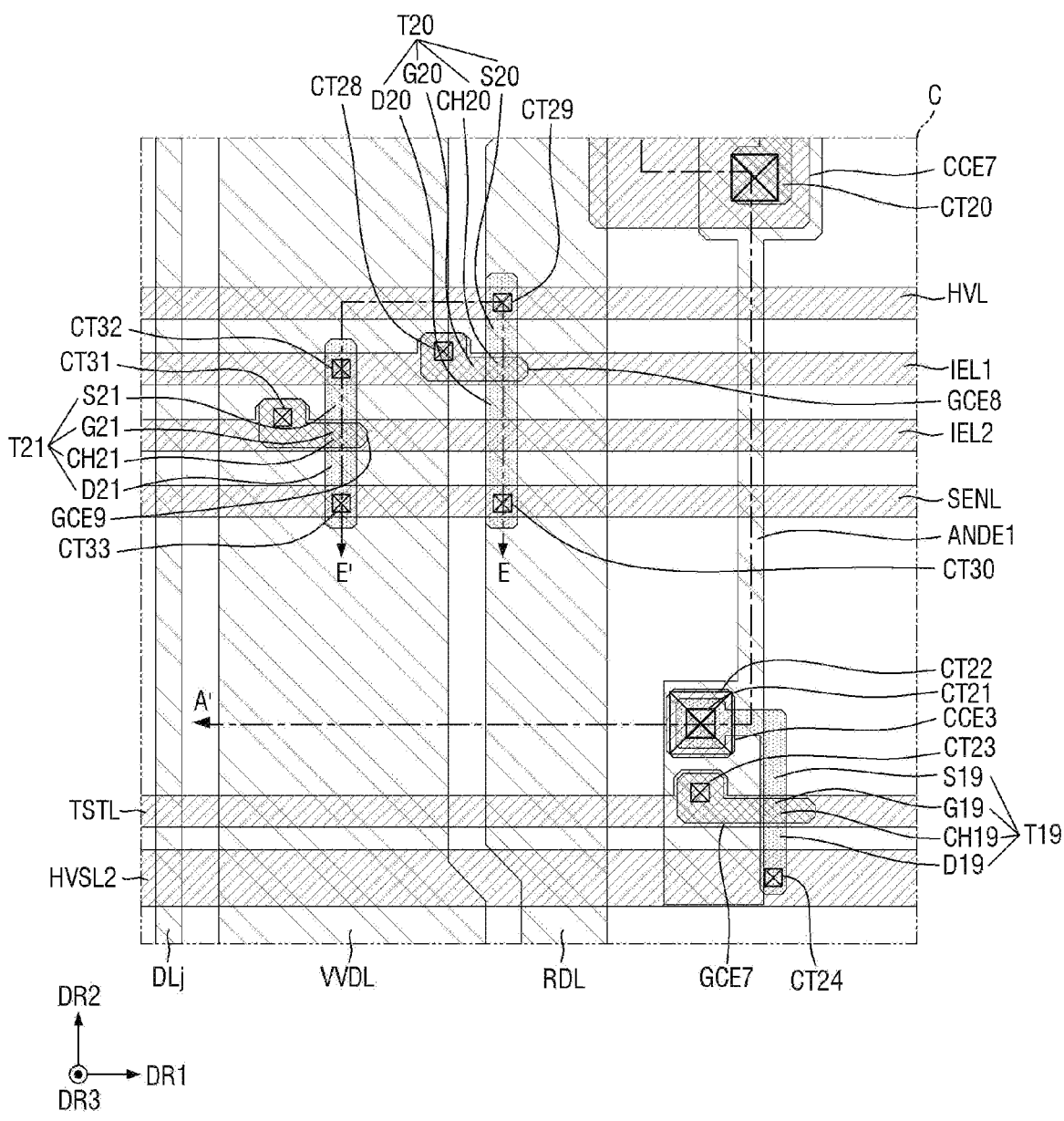
FIG. 25 is an enlarged layout diagram illustrating an area C of FIG. 24 in detail.
Figure 26:
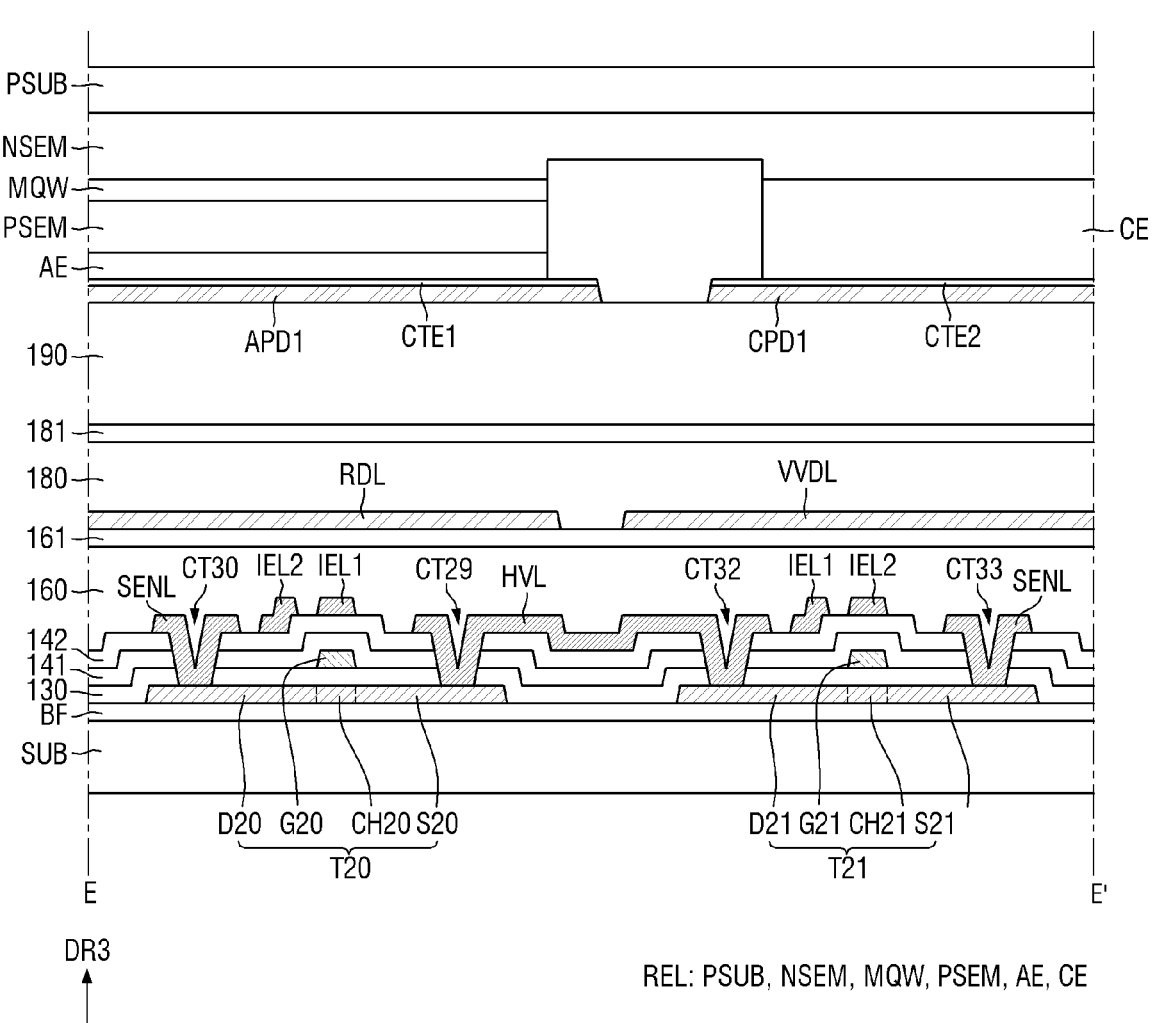
FIG. 26 is a cross-sectional view illustrating an example of the first sub-pixel taken along the line E-E' of FIGS. 24 and 25.

25 is an enlarged layout diagram illustrating an area C of FIG. 24 in detail. FIG. 26 is a cross-sectional view illustrating an example of the first sub-pixel taken along the line E-E' of FIGS. 24 and 25.

The embodiment of FIGS. 23 to 26 is different from the embodiment of FIGS. 15 to 18 in that the first source electrode S20 of the first test transistor T20 and the second source electrode S21 of the second test transistor T21 are connected to the horizontal voltage line HVL to which a suitable voltage (e.g., a predetermined voltage) is applied, and the first drain electrode D20 of the first test transistor T20 and the second drain electrode D21 of the second test transistor T21 are connected to the sensing line SENL. In the embodiment of FIGS. 23 to 26, descriptions overlapping those of the embodiment of FIGS. 15 to 18 will be omitted.

Because the first source electrode S20 of the first test transistor T20 and the second source electrode S21 of the second test transistor T21 are connected to the horizontal voltage line HVL to which a suitable voltage (e.g., a predetermined voltage) is applied, and the first drain electrode D20 of the first test transistor T20 and the second drain electrode D21 of the second test transistor T21 are connected to the sensing line SENL is substantially the same as that described in connection with the embodiment of FIGS. 19 to 22, a description thereof will be omitted.

Figure 27:
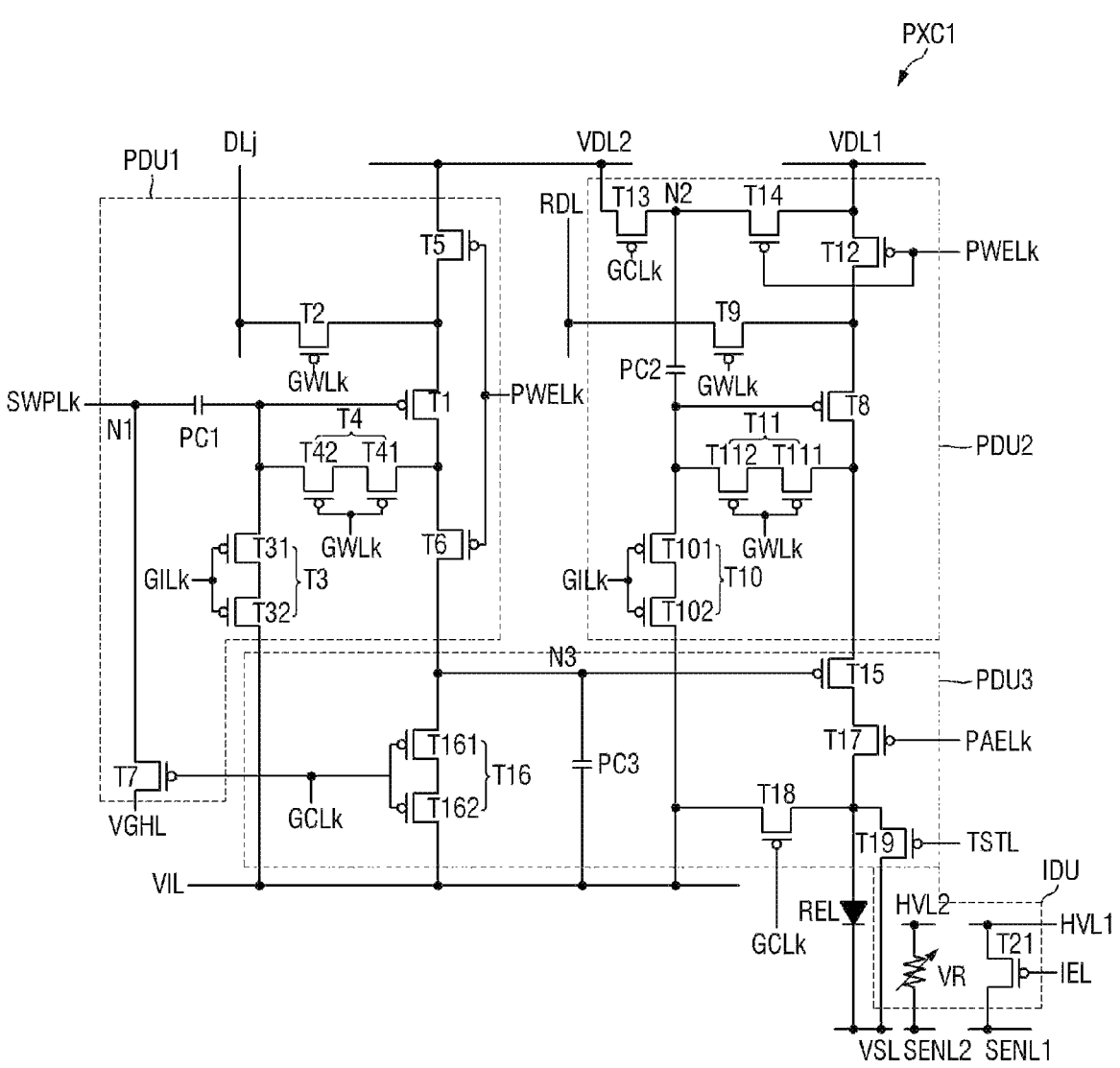
FIG. 27 is a circuit diagram illustrating the first sub-pixel according to one or more embodiments.
Figure 28:
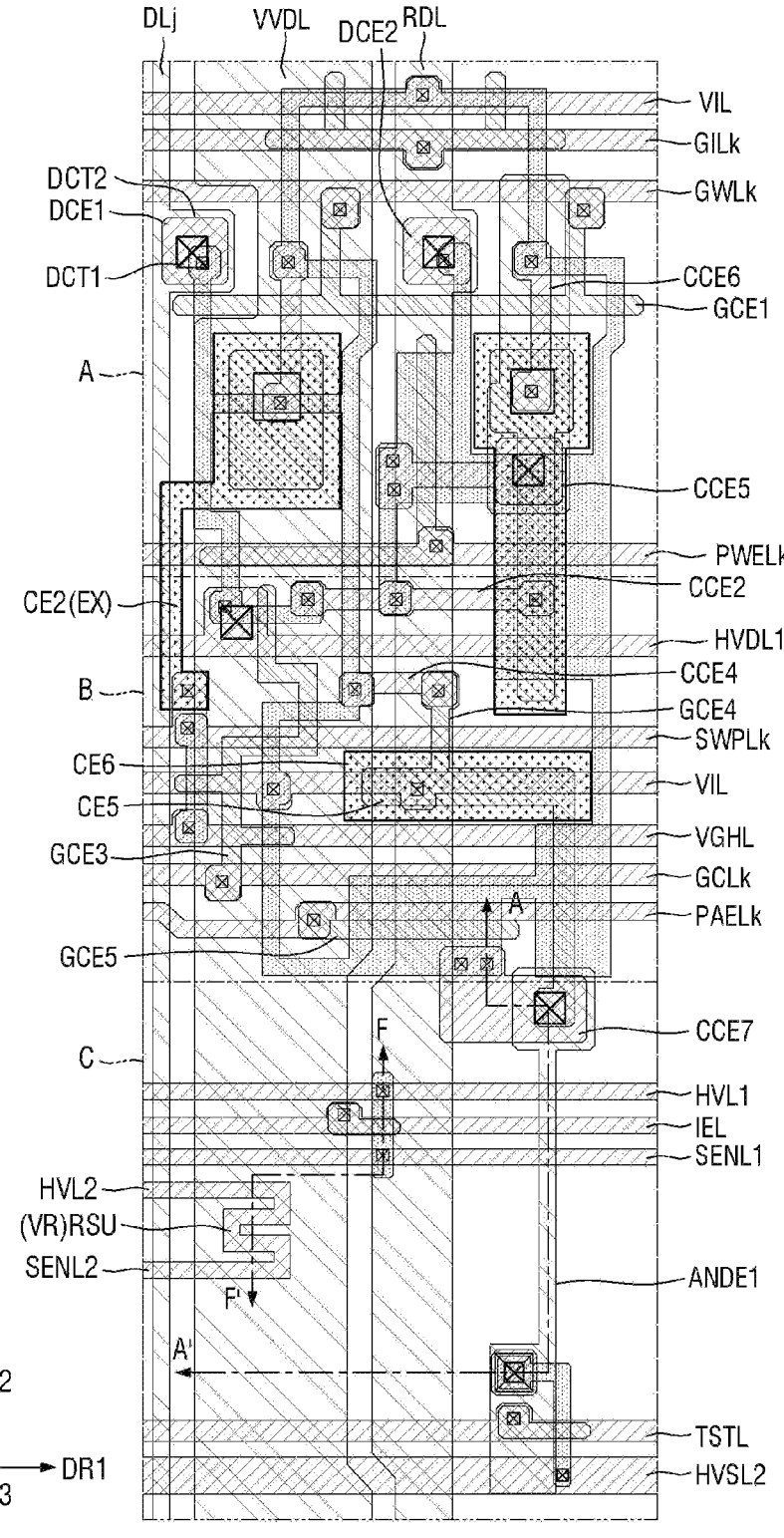
FIG. 28 is a layout diagram illustrating the lower metal layer, the active layer, the first gate metal layer, the second gate metal layer, the first source metal layer, and the second source metal layer of the first sub-pixel according to one or more embodiments.
Figure 29:
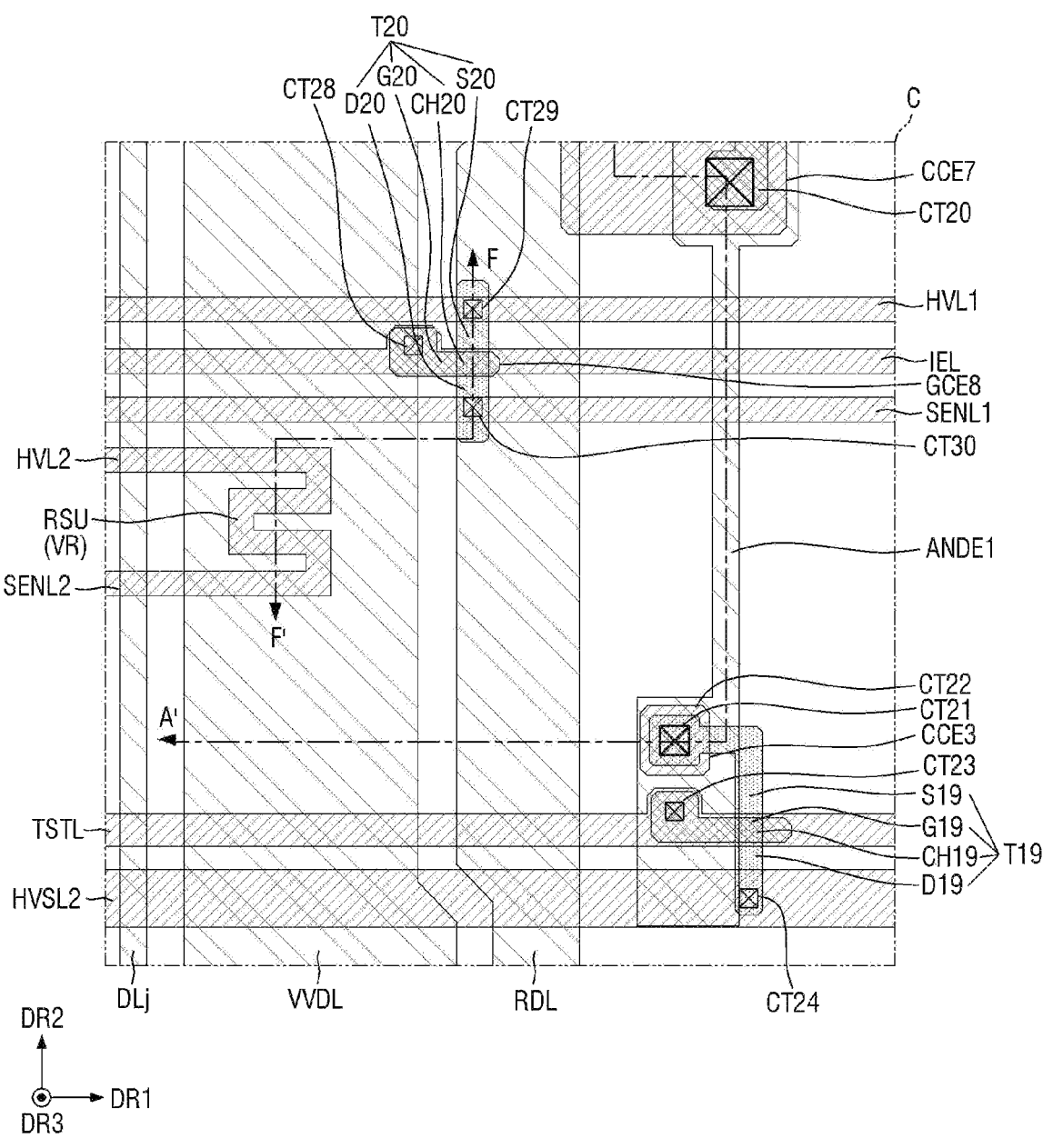
FIG. 29 is an enlarged layout diagram illustrating an area C of FIG. 28 in detail.
Figure 30:
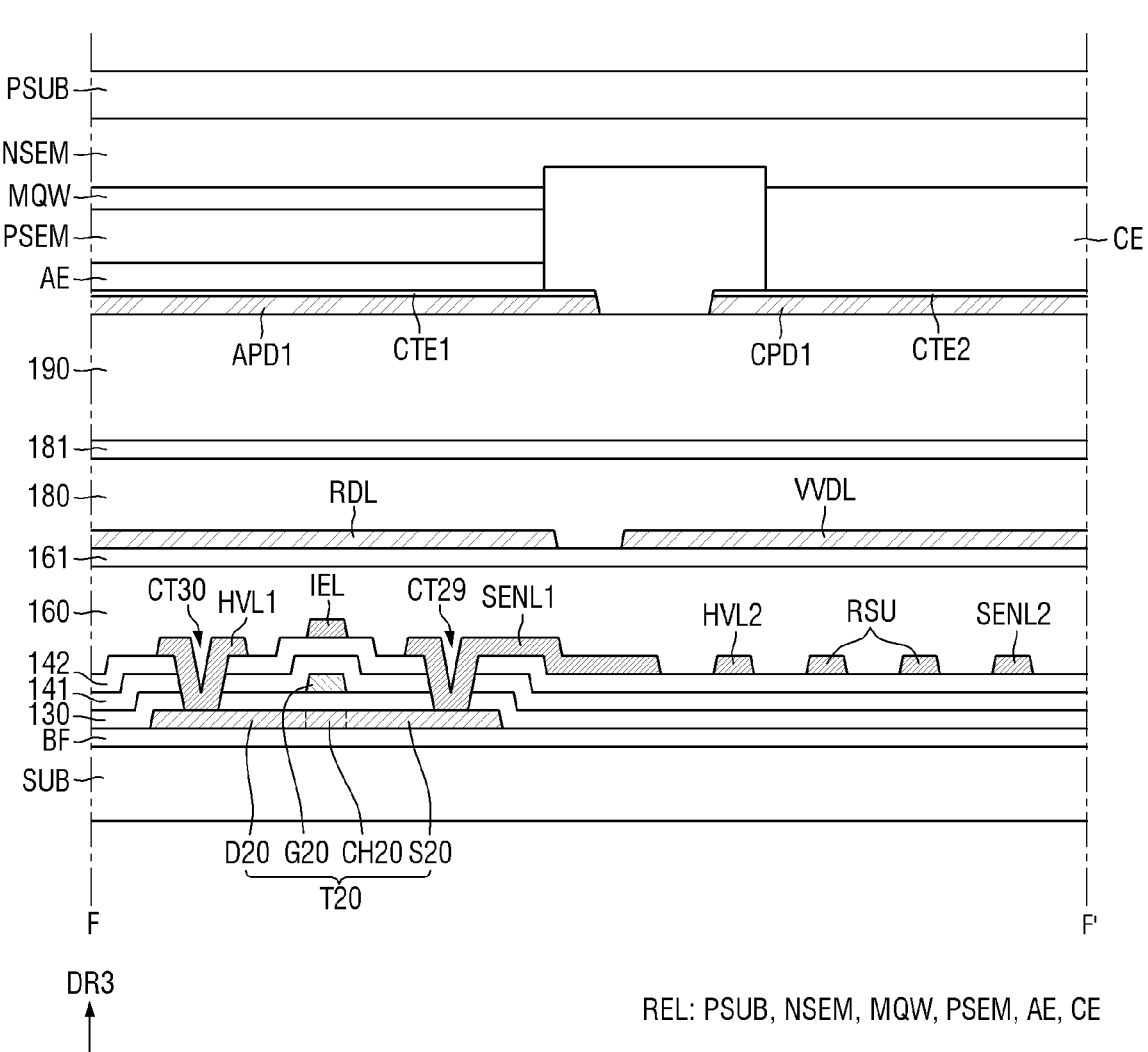
FIG. 30 is a cross-sectional view illustrating an example of the first sub-pixel taken along the line F-F' of FIGS. 28 and 29.

FIG. 27 is a circuit diagram illustrating the first sub-pixel according to one or more embodiments. FIG. 28 is a layout diagram illustrating the lower metal layer, the active layer, the first gate metal layer, the second gate metal layer, the first source metal layer, and the second source metal layer of the first sub-pixel according to one or more embodiments. FIG. 29 is an enlarged layout diagram illustrating an area C of FIG. 28 in detail. FIG. 30 is a cross-sectional view illustrating an example of the first sub-pixel taken along the line F-F' of FIGS. 28 and 29.

The embodiment of FIGS. 27 to 30 is different from the embodiment of FIGS. 19 to 22 in that the first test transistor T20 is omitted and a variable resistor VR is disposed. In the embodiment of FIGS. 27 to 30, descriptions overlapping those of the embodiment of FIGS. 19 to 22 will be omitted.

Referring to FIG. 27, the second sensing transistor T21 may be disposed between a first horizontal voltage line HVL1 and a first sensing line SENL1, and the variable resistor VR may be disposed between a second horizontal voltage line HVL2 and a second sensing lines SENL2. The first horizontal voltage line HVL1 and the second horizontal voltage line HVL2 may receive the same voltage. For example, the first horizontal voltage line HVL1 and the second horizontal voltage line HVL2 may be supplied the voltage substantially equal to one of the first power voltage of the first power supply line VDL1, the second power voltage of the second power supply line VSL, the third power voltage of the third power supply line VDL2, the gate-off voltage of the gate-off voltage line VGHL, and the initialization voltage of the initialization voltage line VIL. Alternatively, the first horizontal voltage line HVL1 and the second horizontal voltage line HVL2 may receive different voltages. For example, the first horizontal voltage line HVL1 may be supplied a voltage substantially equal to one of the first power voltage of the first power supply line VDL1, the second power voltage of the second power supply line VSL, the third power voltage of the third power supply line VDL2, the gate-off voltage of the gate-off voltage line VGHL, and the initialization voltage of the initialization voltage line VIL. In one or more embodiments, the second horizontal voltage line HVL2 may be supplied a voltage different from the voltage supplied to the first horizontal voltage line HVL1 among the first power voltage of the first power supply line VDL1, the second power voltage of the second power supply line VSL, the third power voltage of the third power supply line VDL2, the gate-off voltage of the gate-off voltage line VGHL, and the initialization voltage of the initialization voltage line VIL.

When a sufficient pressure (e.g., a predetermined pressure) is applied to the first light emitting element REL to attach the first light emitting element REL to the first sub-pixel RP, the second electrode CE of the first light emitting element REL is short-circuited with the variable resistor VR or the resistance value of the variable resistor VR may be changed. That is, by sensing the voltage of the second sensing line SENL2 or the resistance value of the variable resistor VR, it may be checked whether the second electrode CE of the first light emitting element REL is short-circuited with another electrode or wiring.

Referring to FIGS. 28 to 30, the first horizontal voltage line HVL1, the second horizontal voltage line HVL2, the first sensing line SENL1, and the second sensing line SENL2 are connected in the first direction DR1, and may be disposed to be spaced from each other in the second direction DR2. The sensing enable signal line IEL may be disposed between the first horizontal voltage line HVL1 and the first sensing line SENL1.

The variable resistor VR may include a resistor unit RSU having a suitable resistance (e.g., a predetermined resistance). The resistance unit RSU may be a strain gage including a winding wiring. One end of the resistor unit RSU may be connected to the second horizontal voltage line HVL2, and the other end may be connected to the second sensing line SENL2. The resistor unit RSU may overlap the second electrode CE, the second pad electrode CTE2, and the fourth pad connection electrode CPD1 of the first light emitting element REL in the third direction DR3.

The first data metal layer may include the resistor unit RSU. The resistor unit RSU may be disposed on the second interlayer insulating layer 142.

In one or more embodiments, a pressure sensing layer overlapping the resistor unit RSU may be additionally disposed. The pressure sensing layer may include fine metal particles such as Quantum Tunneling Composite (QTC). For example, the pressure sensing layer may be disposed on the second interlayer insulating layer 142 and the resistor unit RSU may be disposed on the pressure sensing layer, but embodiments of the present specification may not be limited thereto.

Figure 31:
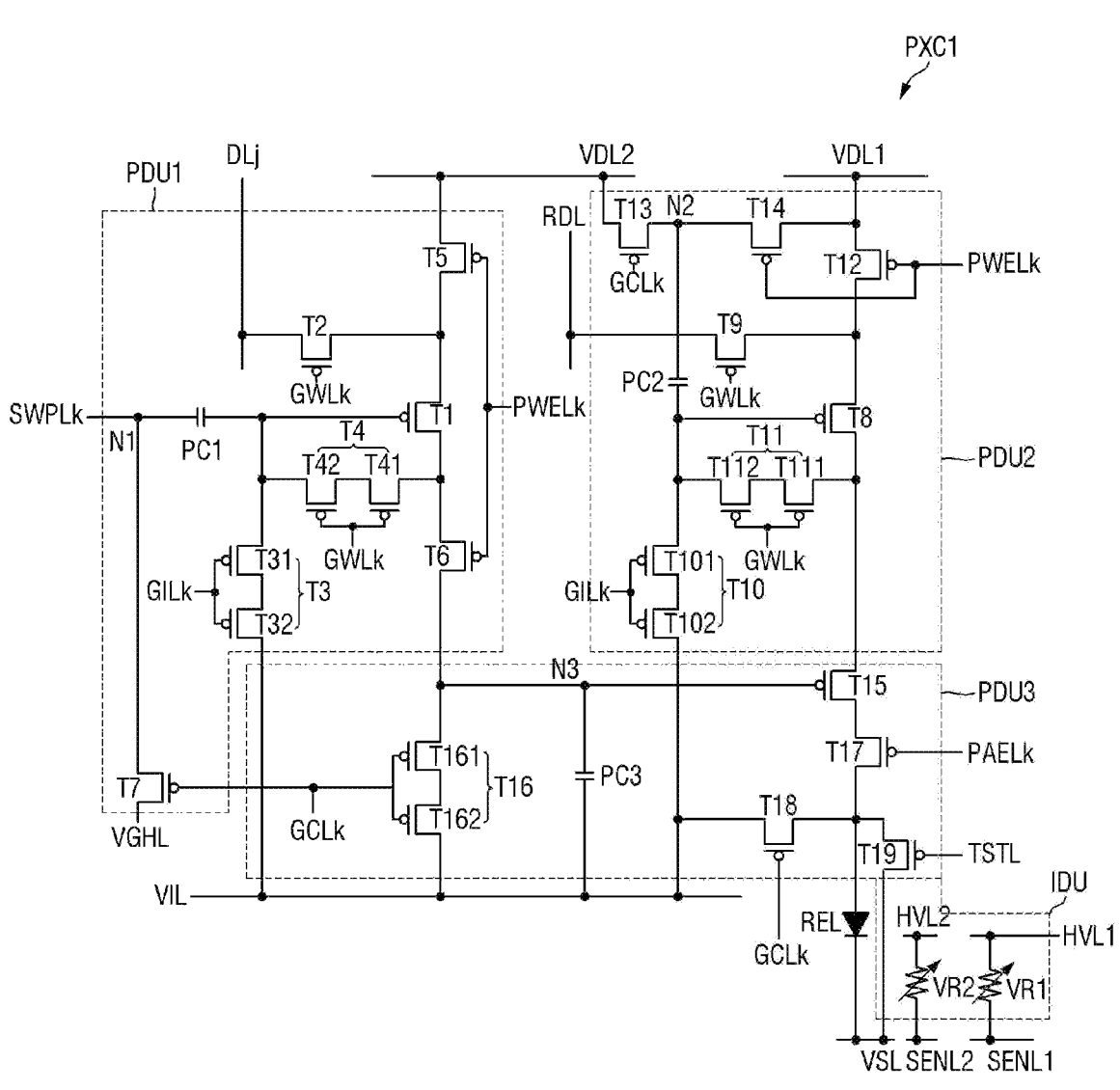
FIG. 31 is a circuit diagram illustrating the first sub-pixel according to one or more embodiments.
Figure 32:
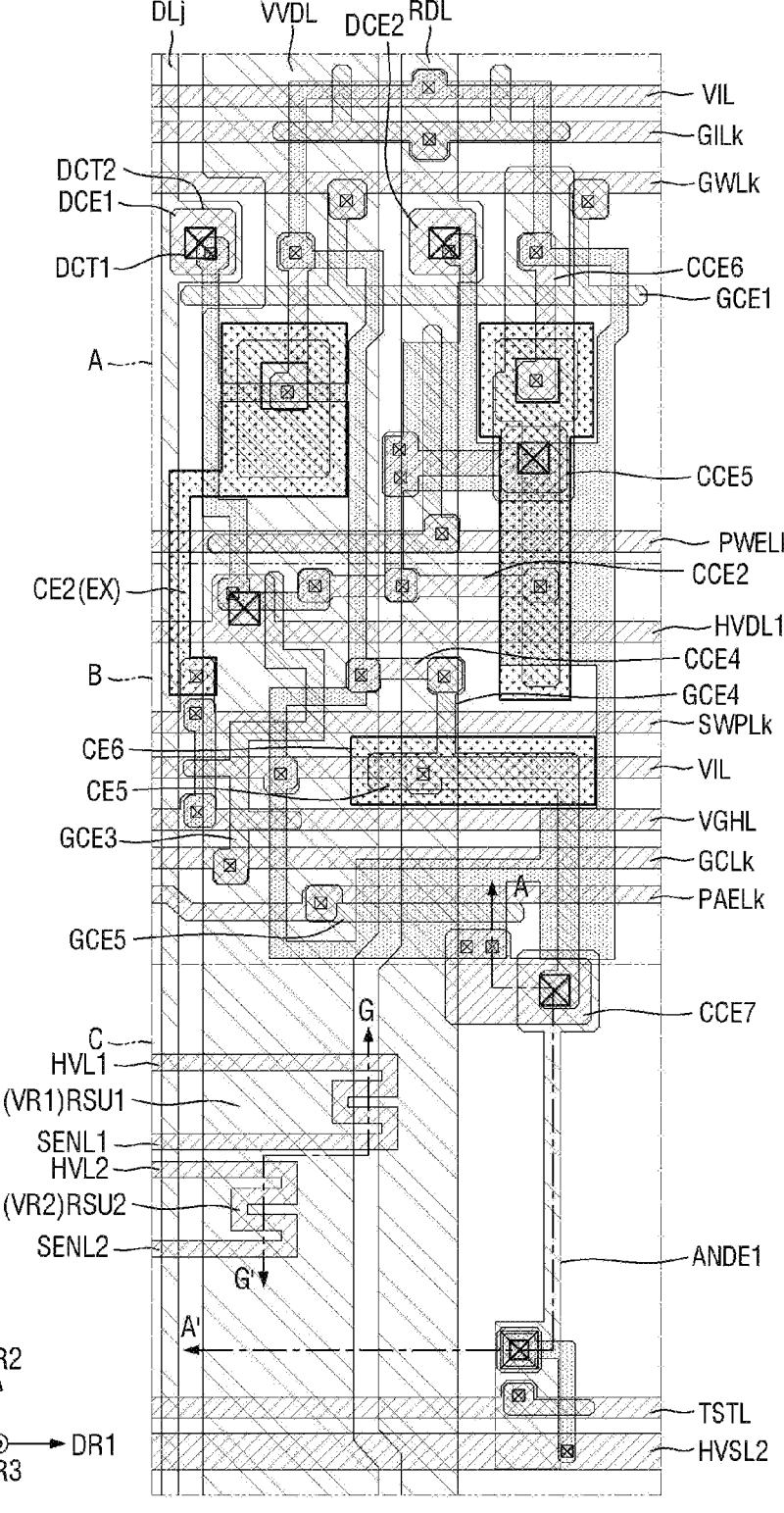
FIG. 32 is a layout diagram illustrating the lower metal layer, the active layer, the first gate metal layer, the second gate metal layer, the first source metal layer, and the second source metal layer of the first sub-pixel according to one or more embodiments.
Figure 33:
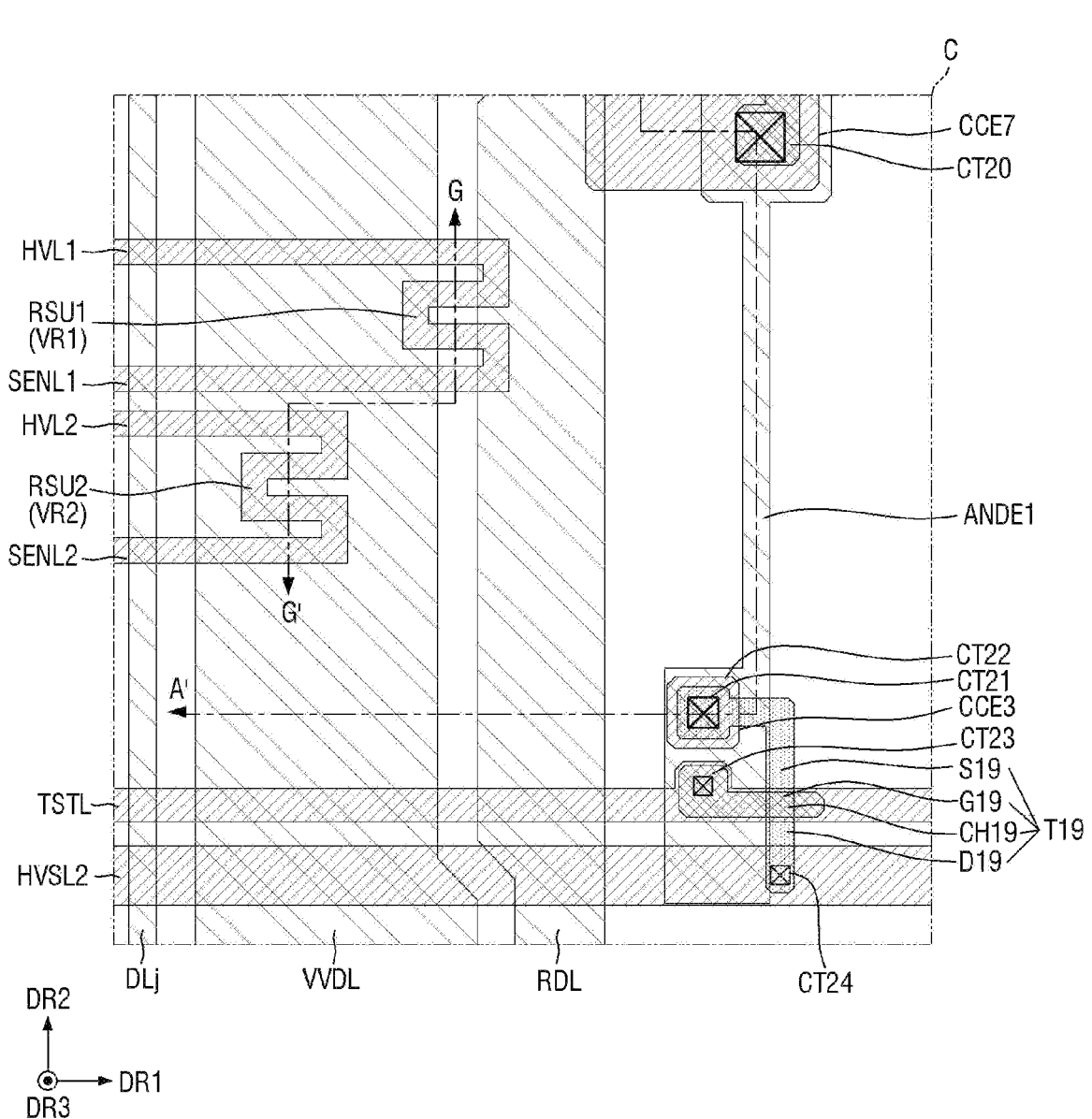
FIG. 33 is an enlarged layout diagram showing an area C of FIG. 32 in detail.
Figure 34:
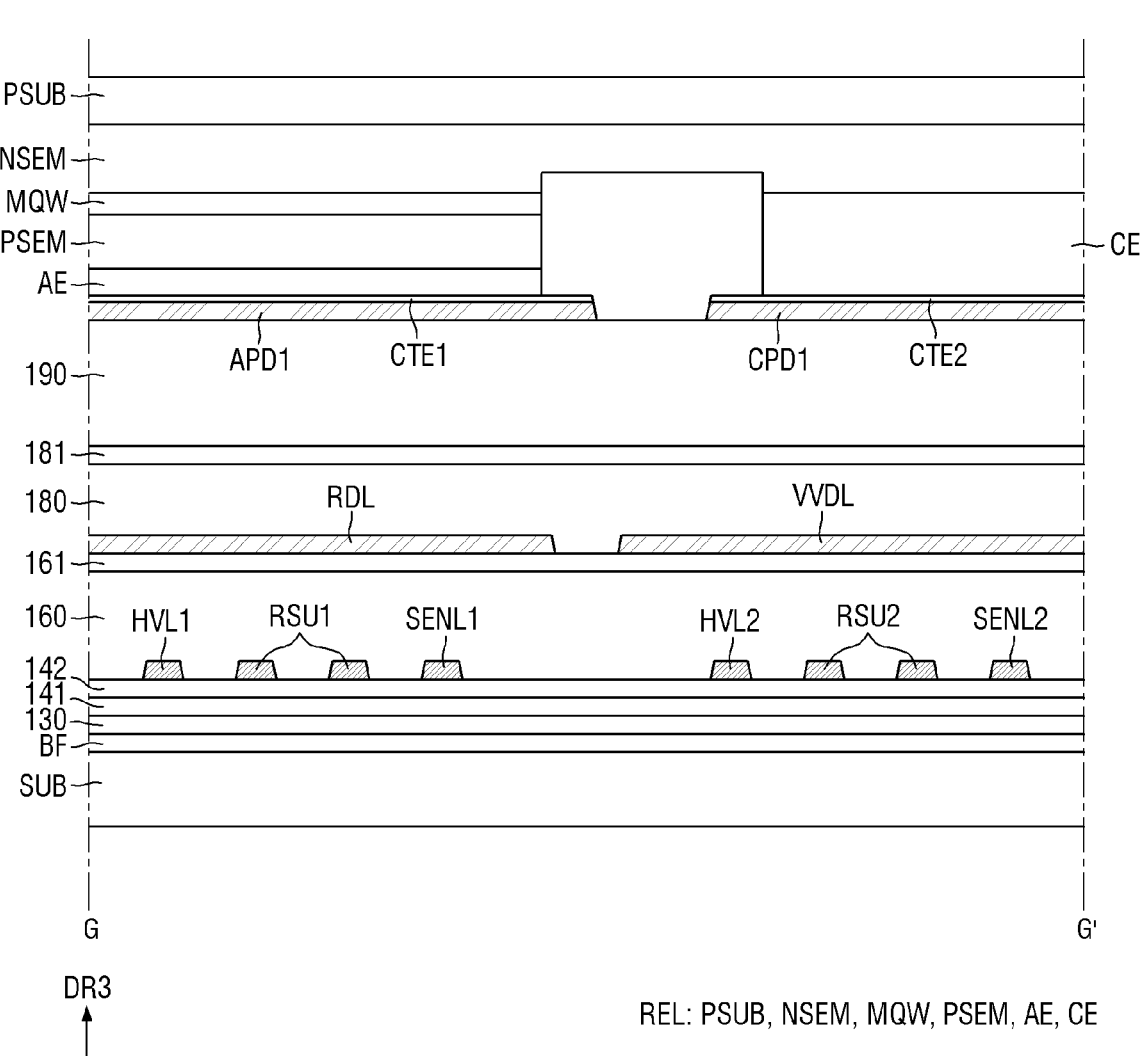
FIG. 34 is a cross-sectional view illustrating an example of the first sub-pixel taken along the line G-G' of FIGS. 32 and 33.

FIG. 31 is a circuit diagram illustrating the first sub-pixel according to one or more embodiments. FIG. 32 is a layout diagram illustrating the lower metal layer, the active layer, the first gate metal layer, the second gate metal layer, the first source metal layer, and the second source metal layer of the first sub-pixel according to one or more embodiments. FIG. 33 is an enlarged layout diagram showing an area C of FIG. 32 in detail. FIG. 34 is a cross-sectional view illustrating an example of the first sub-pixel taken along the line G-G' of FIGS. 32 and 33.

The embodiment of FIGS. 31 to 34 is different from the embodiment of FIGS. 19 to 22 in that the first and second test transistors T20 and T21 are deleted and the first and second variable resistors VR1 and VR2 are disposed. In the embodiment of FIGS. 27 to 30, descriptions overlapping those of the embodiment of FIGS. 19 to 22 will be omitted.

Referring to FIG. 31, the first variable resistor VR1 may be disposed between the first horizontal voltage line HVL1 and the first sensing line SENL1, and the second variable resistor VR2 may be disposed between the second horizontal voltage line HVL2 and the second sensing line SENL2. The first horizontal voltage line HVL1 and the second horizontal voltage line HVL2 may receive the same voltage. For example, the first horizontal voltage line HVL1 and the second horizontal voltage line HVL2 may be supplied a voltage substantially equal to one of the first power voltage of the first power supply line VDL1, the second power voltage of the second power supply line VSL, the third power voltage of the third power supply line VDL2, the gate-off voltage of the gate-off voltage line VGHL, and the initialization voltage of the initialization voltage line VIL. Alternatively, the first horizontal voltage line HVL1 and the second horizontal voltage line HVL2 may receive different voltages. For example, the first horizontal voltage line HVL1 may be supplied a voltage substantially equal to one of the first power voltage of the first power supply line VDL1, the second power voltage of the second power supply line VSL, the third power voltage of the third power supply line VDL2, the gate-off voltage of the gate-off voltage line VGHL, and the initialization voltage of the initialization voltage line VIL. In one or more embodiments, the second horizontal voltage line HVL2 may be supplied a voltage different from the voltage supplied to the first horizontal voltage line HVL1 from among the first power voltage of the first power supply line VDL1, the second power voltage of the second power supply line VSL, the third power voltage of the third power supply line VDL2, the gate-off voltage of the gate-off voltage line VGHL, and the initialization voltage of the initialization voltage line VIL.

When a sufficient pressure (e.g., a predetermined pressure) is applied to the first light emitting element REL to attach the first light emitting element REL to the first sub-pixel RP, the first electrode AE of the first light emitting element REL is short-circuited with the first variable resistor VR1 or the second electrode CE of the first light emitting element REL may be short-circuited with the second variable resistor VR2. Accordingly, the resistance value of the first variable resistor VR1 or the resistance value of the second variable resistor VR2 may be changed. That is, by sensing the voltage of the first sensing line SENL1 or the resistance value of the first variable resistor VR1, it may be checked whether the first electrode AE of the first light emitting element REL is short-circuited with another electrode or wiring. Also, by sensing the voltage of the second sensing line SENL2 or the resistance value of the second variable resistor VR2, it may be checked whether the second electrode CE of the first light emitting element REL is short-circuited with another electrode or wiring.

Referring to FIGS. 32 to 34, the first horizontal voltage line HVL1, the second horizontal voltage line HVL2, the first sensing line SENL1, and the second sensing line SENL2 may be extended in the first direction DR1, and may be disposed to be spaced from each other in the second direction DR2.

The first variable resistor VR1 may include a first resistor unit RSU1 having a suitable resistance (e.g., a predetermined resistance), and the second variable resistor VR2 may include a second resistor unit RSU2 having a suitable resistance (e.g., a predetermined resistance). Each of the first resistance unit RSU1 and the second resistance unit RSU2 may be the strain gage including a serpentine wire.

One end of the first resistor unit RSU1 may be connected to the first horizontal voltage line HVL1, and the other end may be connected to the first sensing line SENL1. The first resistor unit RSU1 may overlap the first electrode AE of the first light emitting element REL, the first pad electrode CTE1, and the third pad connection electrode APD1 in the third direction DR3.

One end of the second resistor unit RSU2 may be connected to the second horizontal voltage line HVL2, and the other end may be connected to the second sensing line SENL2. The second resistor unit RSU2 may overlap the second electrode CE of the first light emitting element REL, the second pad electrode CTE2, and the fourth pad connection electrode CPD1 in the third direction DR3.

The first data metal layer may include the first resistor unit RSU1 and the second resistor unit RSU2. The first resistor unit RSU1 and the second resistor unit RSU2 may be disposed on the second interlayer insulating layer 142.

In one or more embodiments, a first pressure sensing layer overlapping the first resistance unit RSU1 and a second pressure sensing layer overlapping the second resistance unit RSU2 may be additionally disposed. Each of the first pressure sensing layer and the second pressure sensing layer may include fine metal particles such as Quantum Tunneling Composite (QTC). For example, each of the first pressure sensing layer and the second pressure sensing layer is disposed on the second interlayer insulating layer 142, the first resistor unit RSU1 is disposed on the first pressure sensing layer, and the second resistor unit RUS2 may be disposed on the second pressure sensing layer, but embodiments of the present specification may not be limited thereto.

Figure 35:
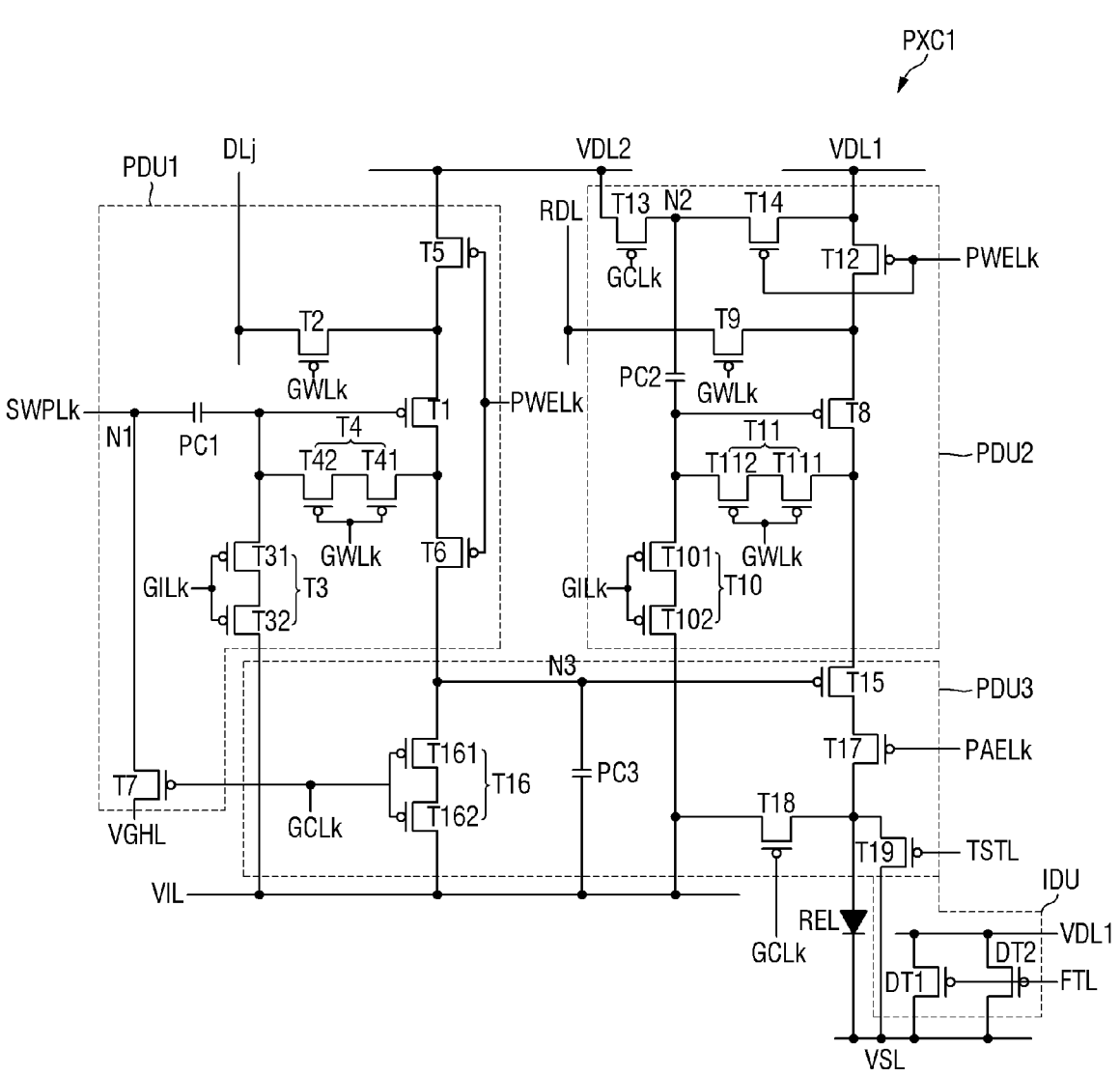
FIG. 35 is a circuit diagram illustrating the first sub-pixel according to one or more embodiments.
Figure 36:
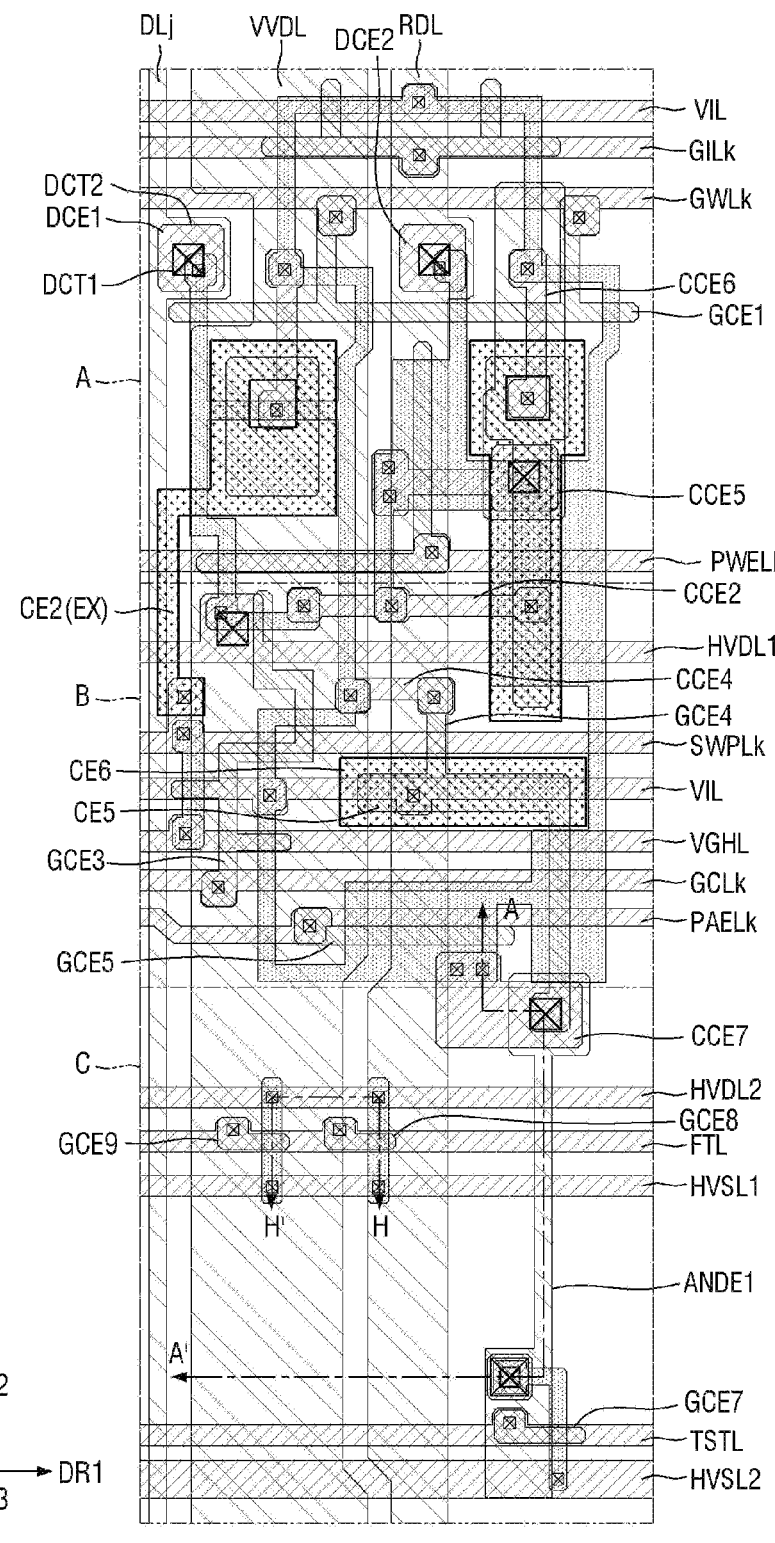
FIG. 36 is a layout diagram illustrating the lower metal layer, the active layer, the first gate metal layer, the second gate metal layer, the first source metal layer, and the second source metal layer of the first sub-pixel according to one or more embodiments.
Figure 37:
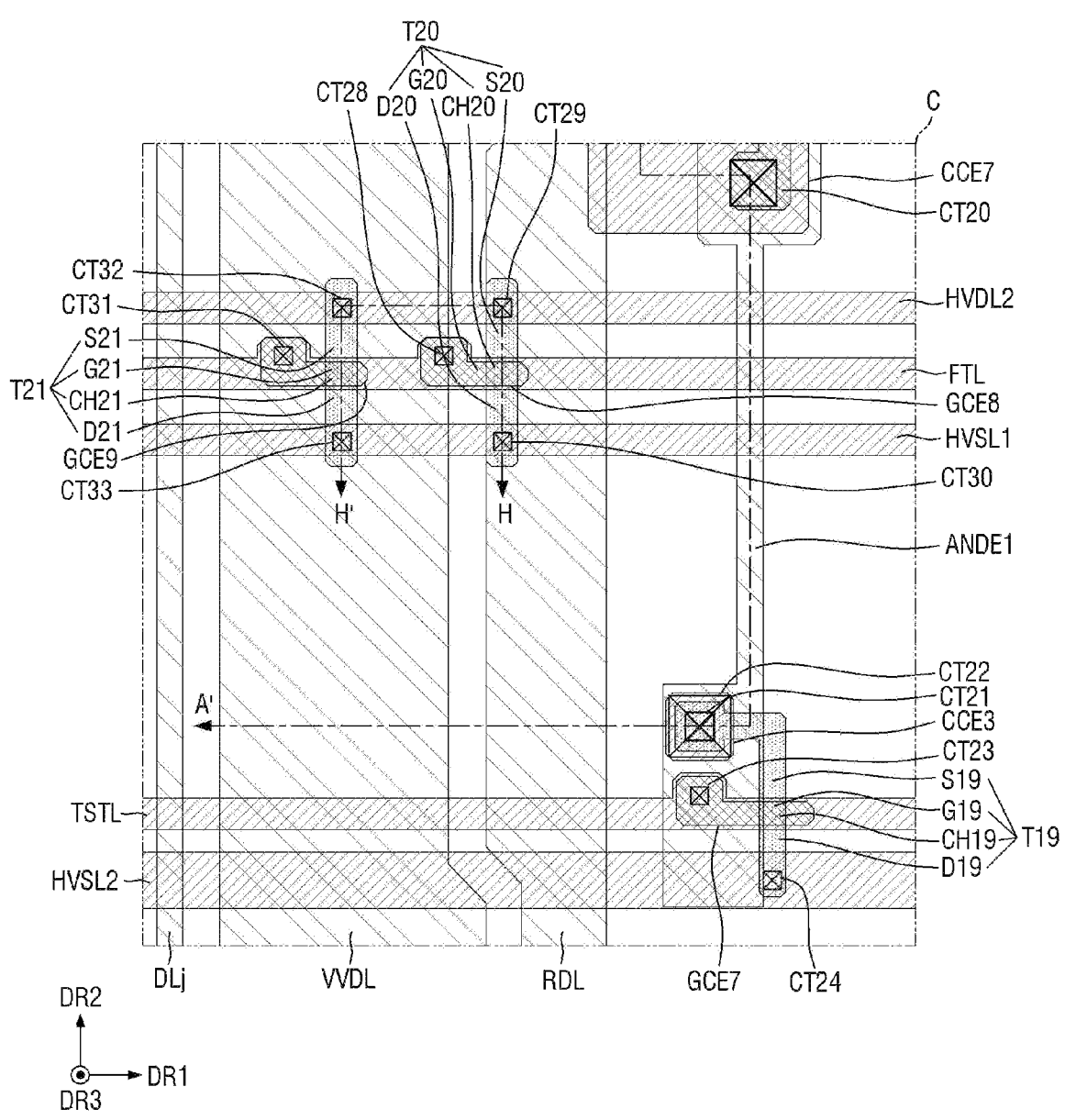
FIG. 37 is an enlarged layout diagram illustrating a region C of FIG. 36 in detail.
Figure 38:
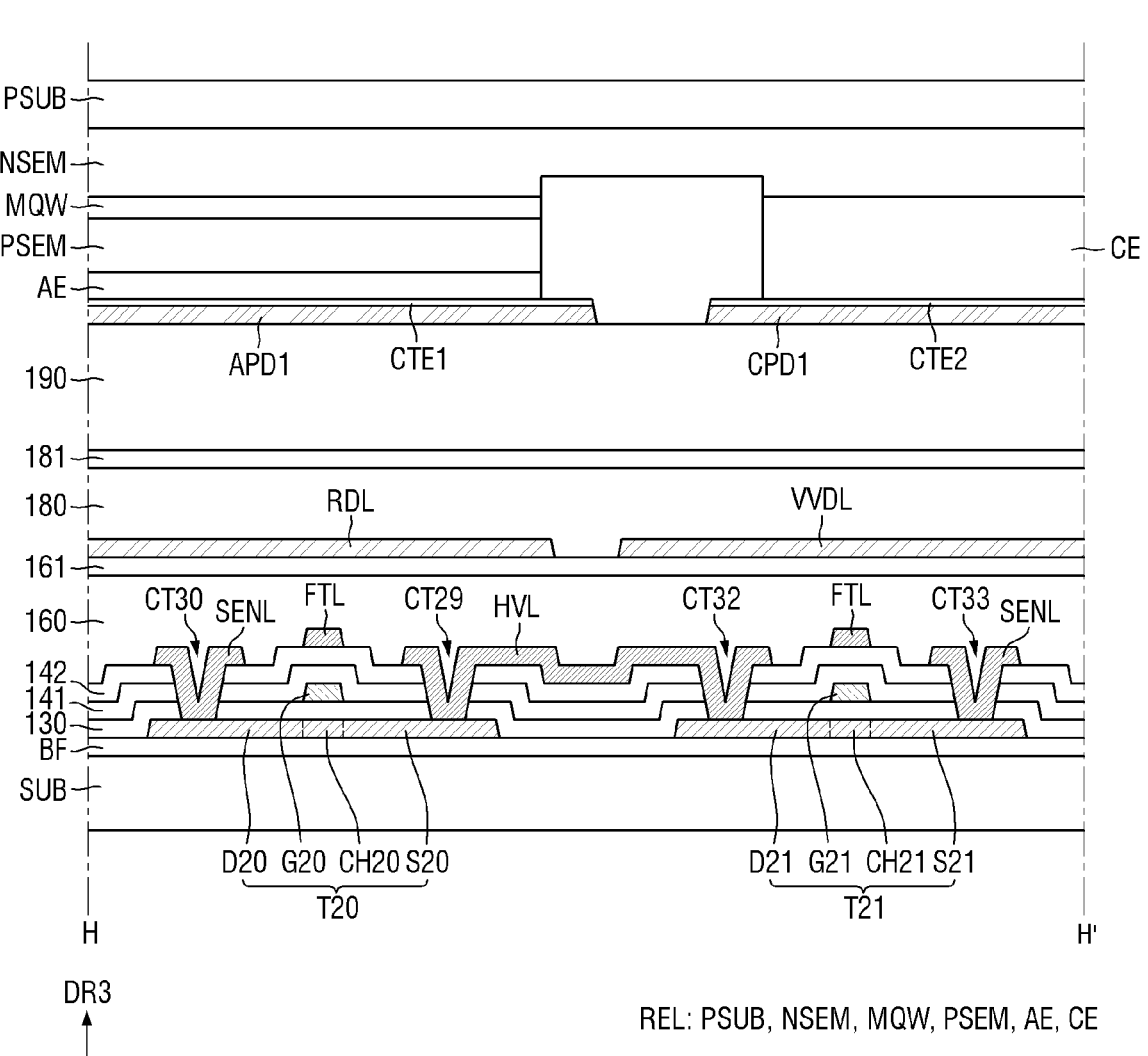
FIG. 38 is a cross-sectional view illustrating an example of the first sub-pixel taken along the line H-H' of FIGS. 36 and 37.

FIG. 35 is a circuit diagram illustrating the first sub-pixel according to one or more embodiments. FIG. 36 is a layout diagram illustrating the lower metal layer, the active layer, the first gate metal layer, the second gate metal layer, the first source metal layer, and the second source metal layer of the first sub-pixel according to one or more embodiments. FIG. 37 is an enlarged layout diagram illustrating a region C of FIG. 36 in detail. FIG. 38 is a cross-sectional view illustrating an example of the first sub-pixel taken along the line H-H' of FIGS. 36 and 37.

The embodiment of FIGS. 35 to 38 is different from the embodiment of FIGS. 4, 5, 11, and 13 in that the first and second dummy transistors DT1 and DT2 are disposed instead of the first and second test transistors T20 and T21. In the embodiment of FIGS. 35 to 38, descriptions overlapping those of the embodiment of FIGS. 4, 5, 11, and 13 will be omitted.

Referring to FIGS. 35 to 38, a first dummy transistor DT1 and the second dummy transistor DT2 may be substantially the same as the first test transistor T20 and the second test transistor T21 shown in FIGS. 4, 5, 11, and 13 except that their gate electrode is connected to a floating line FTL and not the inspection enable signal line IEL. The floating line FTL may be a line to which no signal or voltage is applied. In this case, the first dummy transistor DT1 and the second dummy transistor DT2 may maintain a turned-off state.

Alternatively, the gate electrode of the first dummy transistor DT1 and the gate electrode of the second dummy transistor DT2 may be connected to the gate-off voltage line VGHL instead of the floating line FTL. In this case, the first dummy transistor DT1 and the second dummy transistor DT2 may maintain a turned-off state.

Figure 39:
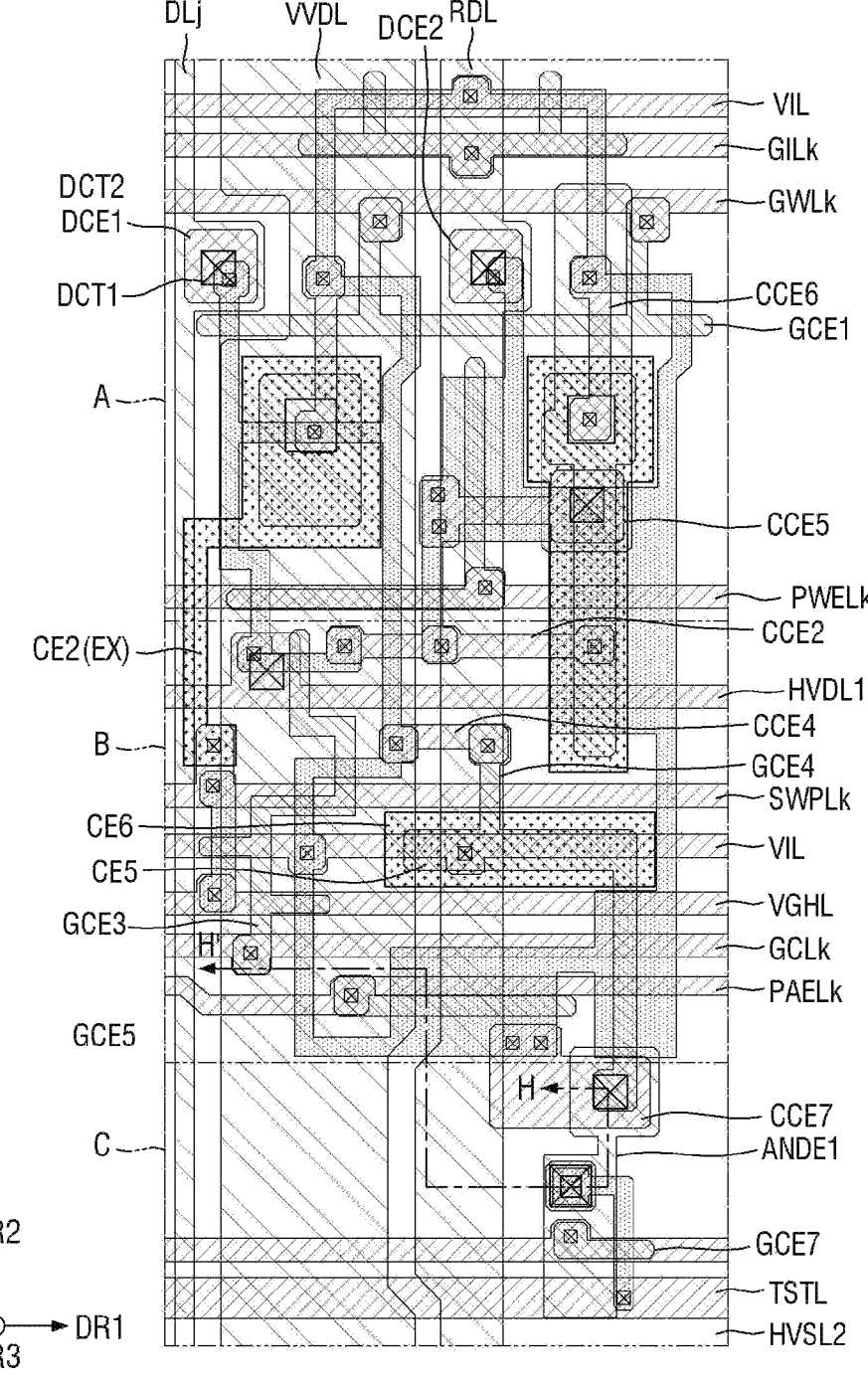
FIG. 39 is a layout diagram illustrating the lower metal layer, the active layer, the first gate metal layer, the second gate metal layer, the first source metal layer, and the second source metal layer of the first sub-pixel according to one or more embodiments.
Figure 40:
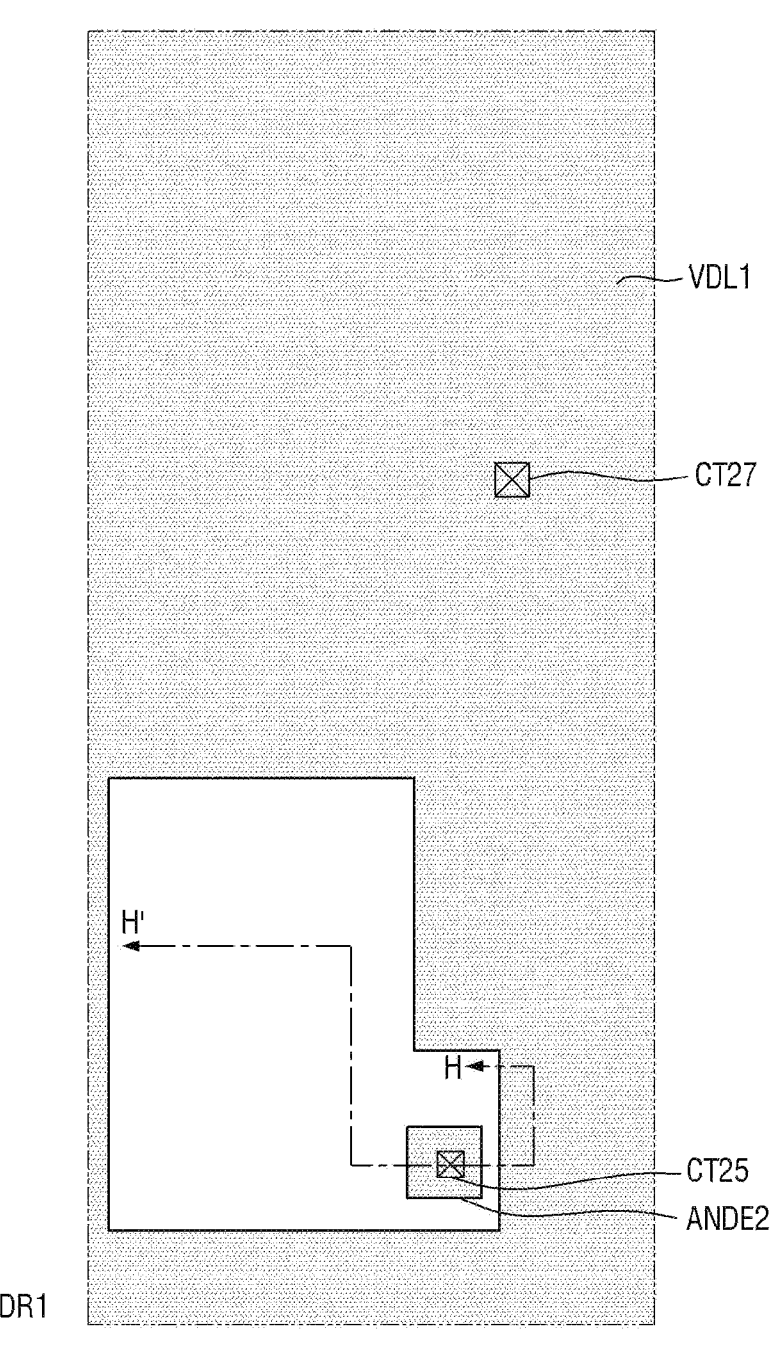
FIG. 40 is a layout diagram illustrating the third source metal layer of the first sub-pixel according to one or more embodiments.
Figure 41:
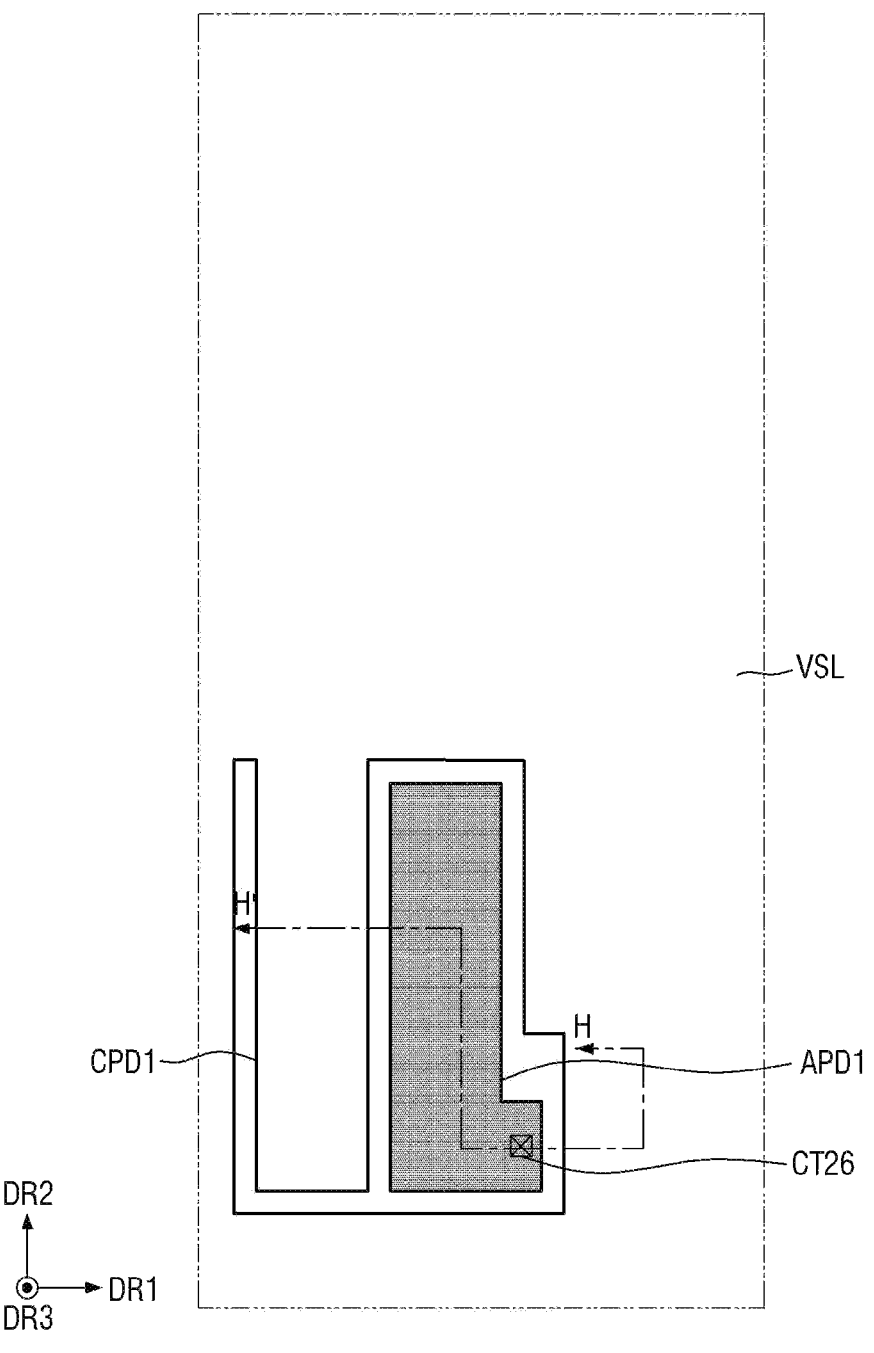
FIG. 41 is a layout diagram illustrating the fourth source metal layer of the first sub-pixel according to one or more embodiments.
Figure 42:
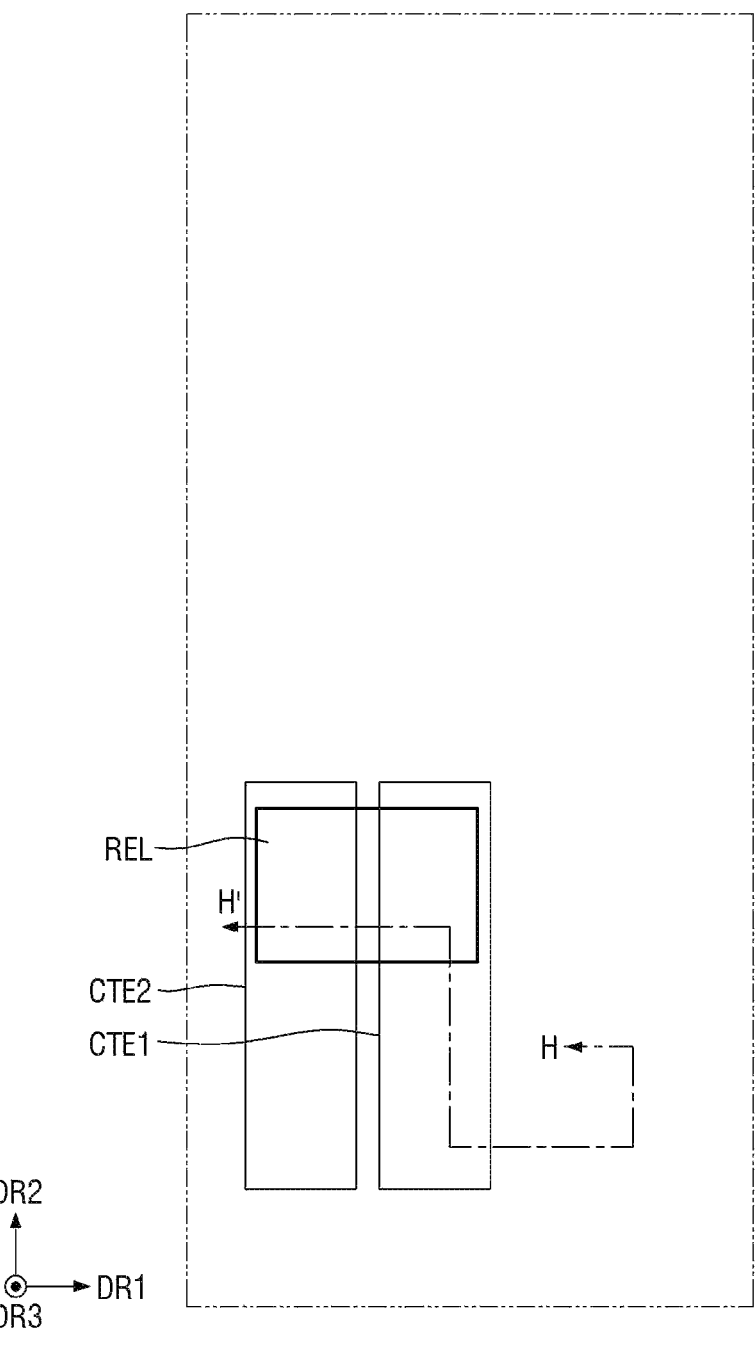
FIG. 42 is a layout diagram illustrating the transparent electrode layer of the first sub-pixel and the first light emitting device according to one or more embodiments.

FIG. 39 is a layout diagram illustrating the lower metal layer, the active layer, the first gate metal layer, the second gate metal layer, the first source metal layer, and the second source metal layer of the first sub-pixel according to one or more embodiments. FIG. 40 is a layout diagram illustrating the third source metal layer of the first sub-pixel according to one or more embodiments. FIG. 41 is a layout diagram illustrating the fourth source metal layer of the first sub-pixel according to one or more embodiments. FIG. 42 is a layout diagram illustrating the transparent electrode layer of the first sub-pixel and the first light emitting device according to one or more embodiments.

The embodiment of FIGS. 39 to 42 is different from the embodiment of FIGS. 5 to 8 in that the first and second test transistors T20 and T21 are deleted, and the first light emitting element REL overlaps some of the first to nineteenth transistors T1 to T19. In the embodiment of FIGS. 39 to 42, descriptions overlapping those of the embodiment of FIGS. 5 to 8 will be omitted.

Referring to FIGS. 39 to 42, the first light emitting element REL may overlap some of the first to nineteenth transistors T1 to T19, for example, the seventh transistor T7 and the sixteenth transistor T16, the seventeenth transistor T17, and the eighteenth transistor T18. Also, the first pad electrode CTE1 and the third pad connection electrode APD1 may overlap the seventh transistor T7 and the seventeenth transistor T17. The second pad electrode CTE2 and the fourth pad connection electrode CPD1 may overlap the sixteenth transistor T16 and the eighteenth transistor T18.

Figure 43:
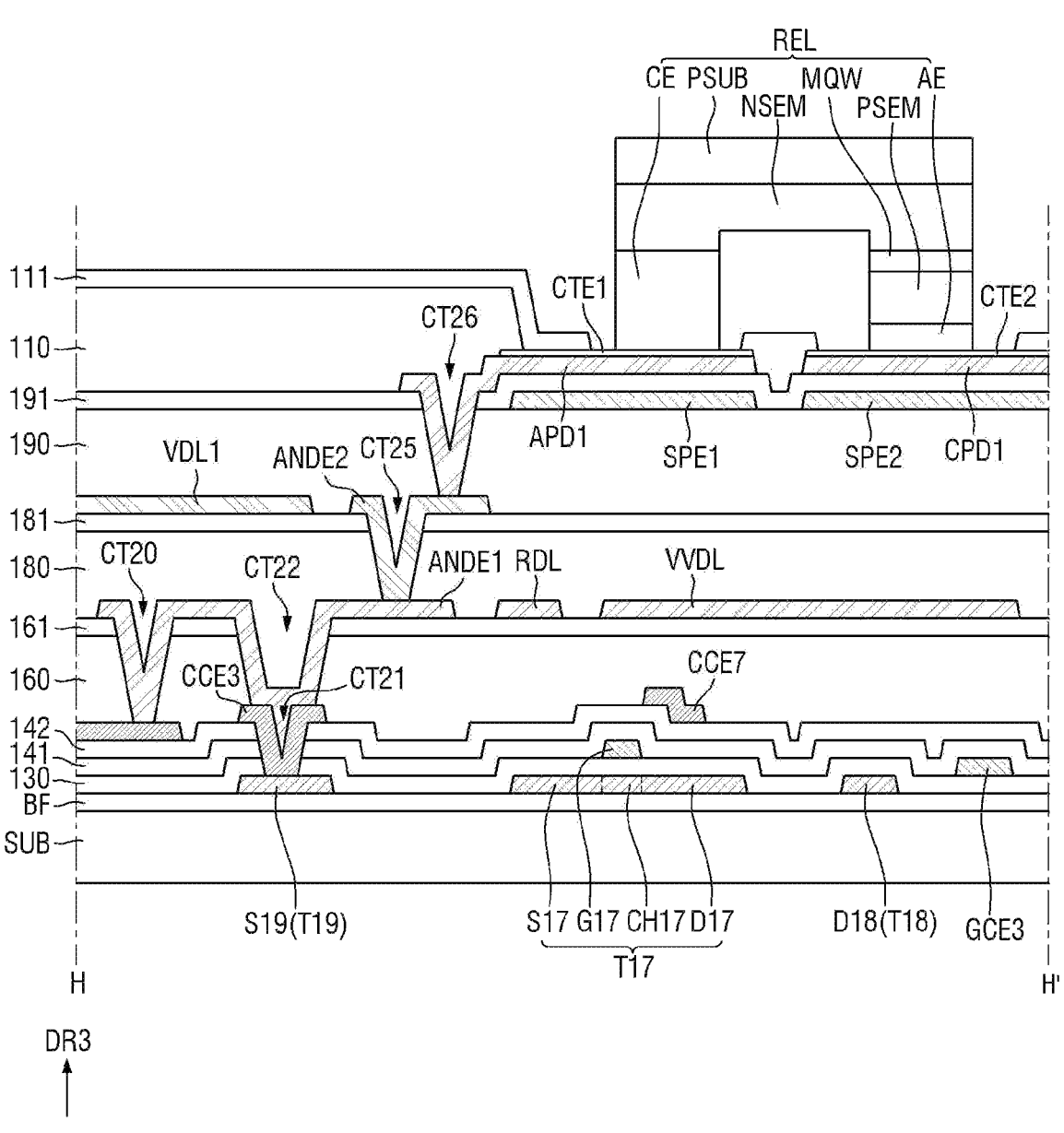
FIG. 43 is a cross-sectional view illustrating an example of the first sub-pixel taken along the line H-H' of FIGS. 39 to 42.

FIG. 43 is a cross-sectional view illustrating an example of the first sub-pixel taken along the line H-H' of FIGS. 39 to 42.

Referring to FIG. 43, a fifth source metal layer may be disposed on a third inorganic insulating layer 191. A first reinforcing electrode SPE1 and a second reinforcing electrode SPE2 may be disposed in the fifth source metal layer. The first reinforcing electrode SPE1 may be overlapped with the first pad electrode CTE1 and the third pad connection electrode APD1 in the third direction DR3, and the second reinforcing electrode SPE2 may be overlapped with the second pad electrode CTE2 and the fourth pad connection electrode CPD1.

The third inorganic insulating layer 191 may be disposed between the first reinforcing electrode SPE1 and the third pad connecting electrode APD1 and between the second reinforcing electrode SPE2 and the fourth pad connecting electrode CPD1. The third inorganic insulating layer 191 may be formed of the inorganic layer, for example, the silicon nitride layer, the silicon oxynitride layer, the silicon oxide layer, the titanium oxide layer, or the aluminum oxide layer.

When a sufficient pressure (e.g., a predetermined pressure) is applied to the first light emitting element REL to attach the first light emitting element REL to the first pad electrode CTE1, the third planarization layer 190 and the third inorganic insulating layer 191 supporting the first pad electrode CTE1, the second pad electrode CTE2, the third pad connection electrode APD1, and the fourth pad connection electrode CPD1 may collapse. Because the first reinforcing electrode SPE1 and the second reinforcing electrode SPE2 are electrically floating, the third planarization layer 190 and the third inorganic insulating layer 191 collapse due to the pressure applied to the first light emitting element REL. As a result, the third pad connection electrode APD1 is short-circuited with the first reinforcing electrode SPE1 and the fourth pad connection electrode CPD1 is short-circuited with the second reinforcing electrode SPE2, but light emitted from the first light emitting element REL emits light may not be affected.

In addition, when the first reinforcing electrode SPE1 and the second reinforcing electrode SPE2 press the first light emitting element REL, it is possible to prevent the transistors overlapping the first light emitting element REL from being damaged. Because the first reinforcing electrode SPE1 and the second reinforcing electrode SPE2 serve to support the first anode pad electrode APD1 and the first cathode pad electrode CPD1.

Figure 44:
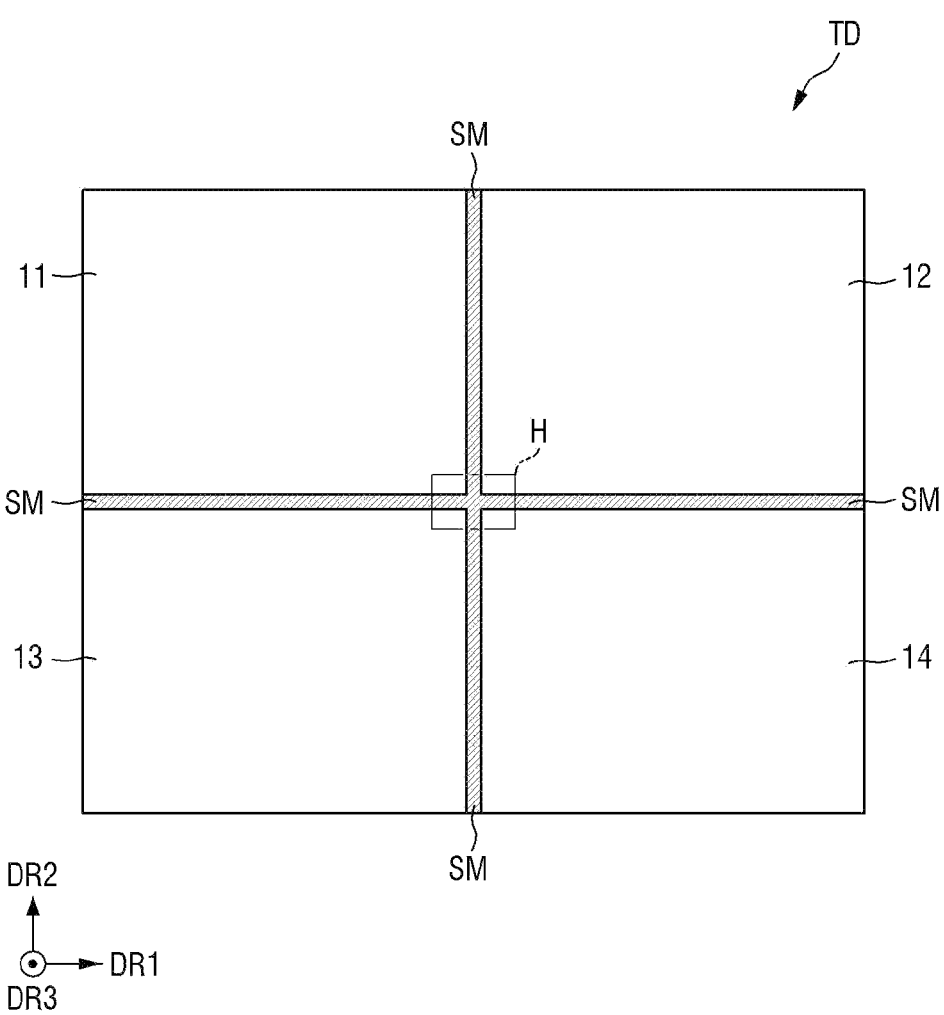
FIG. 44 is a diagram illustrating a front surface of a tiled display device according to one or more embodiments.

FIG. 44 is a diagram illustrating a front surface of a tiled display device according to one or more embodiments.

Referring to FIG. 44, a tiled display device TD according to one or more embodiments may include a plurality of display devices 11, 12, 13, and 14, and a connection member (or a seam) SM. For example, the tiled display device TD may include a first display device 11, a second display device 12, a third display device 13, and a fourth display device 14.

The plurality of display devices 11, 12, 13, and 14 may be arranged in the matrix form in M (M is a positive integer) number of rows and N (N is a positive integer) number of columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TD are not limited to those illustrated in FIG. 44. The number and arrangement of the display devices 11, 12, 13, and 14 in the tiled display device TD may be determined in response to the size of the display device 10 and the tiled display device TD, and the shape of the tiled display device TD.

The plurality of display devices 11, 12, 13, and 14 may have the same size as each other, but embodiments of the present disclosure are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be disposed such that the long sides or the short sides thereof are connected to each other. Some or all of the plurality of display devices 11, 12, 13, and 14 may be disposed at the edge of the tiled display device TD, and may be disposed one side of the tiled display device TD. At least one of the plurality of display devices 11, 12, 13, and 14 may be disposed at least one corner of the tiled display device TD, and may be formed two adjacent sides of the tiled display device TD. At least one of the plurality of display devices 11, 12, 13, and 14 may be surrounded by other display devices.

Each of the plurality of display devices 11, 12, 13, and 14 may be substantially the same as the display device 100 described with reference to FIG. 1. Therefore, a description of each of the plurality of display devices 11, 12, 13, and 14 will be omitted.

The connection member SM may include a coupling member or an adhesive member. In this case, the plurality of display devices 11, 12, 13, and 14 may be connected to each other by the coupling member or the adhesive member of the connection member SM. The connection member SM may be disposed between the first display device 11 and the second display device 12, between the first display device 11 and the third display device 13, between the second display device 12 and the fourth display device 14, and between the third display device 13 and the fourth display device 14.

Figure 45:
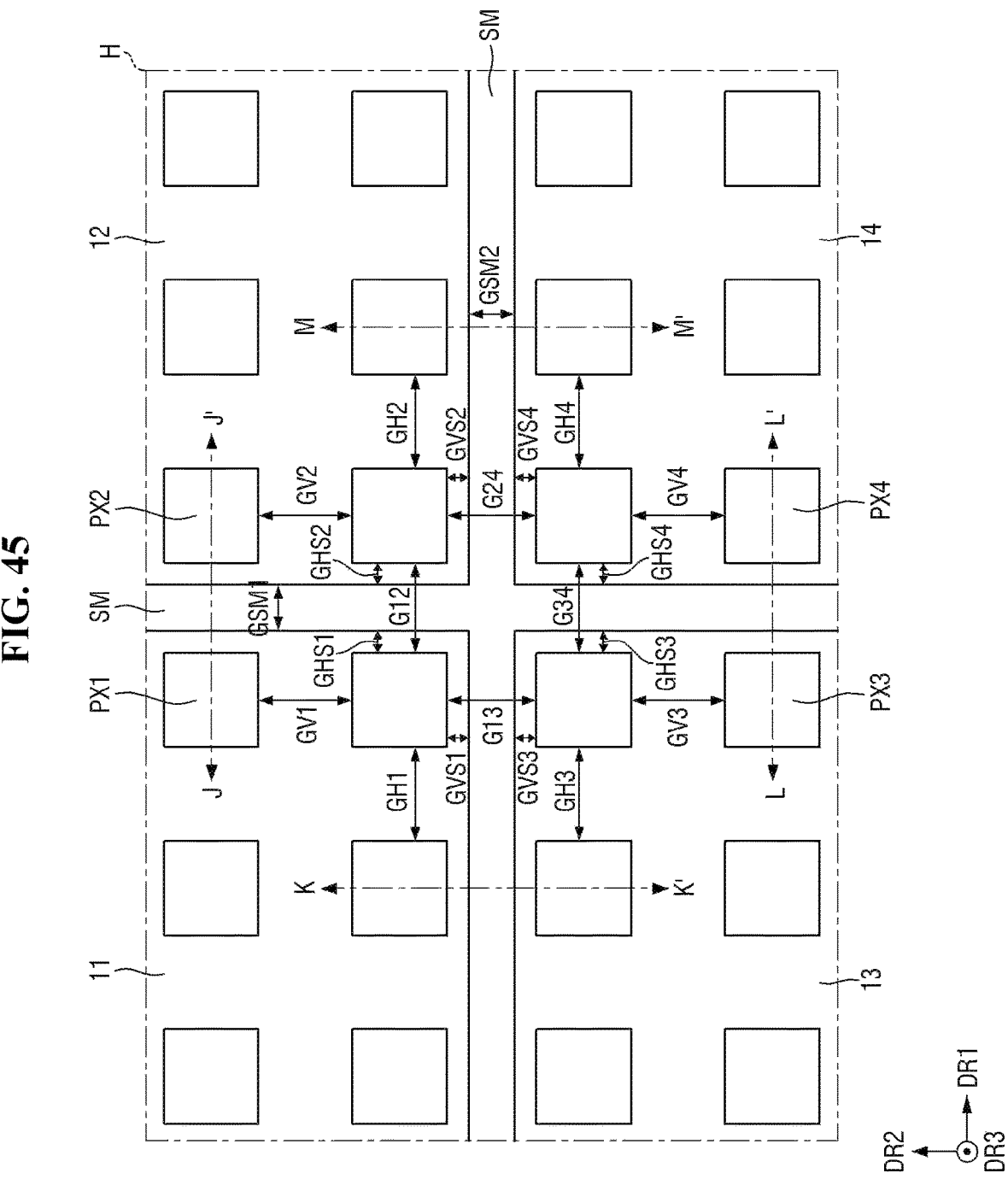
FIG. 45 is an enlarged layout diagram illustrating the H area of FIG. 44 in detail.

FIG. 45 is an enlarged layout diagram illustrating the H area of FIG. 44 in detail.

Referring to FIG. 45, the connection member SM may have a planar shape of a cross, or a plus sign in a central area of the device TD in which the first display device 11, the second display device 12, the third display device 13, and the fourth display device 14 are adjacent to each other. The connection member SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in the matrix form along the first direction DR1 and the second direction DR2 to display the image. The second display device 12 may include second pixels PX2 arranged in the matrix form along the first direction DR1 and the second direction DR2 to display the image. The third display device 13 may include third pixels PX3 arranged in the matrix form along the first direction DR1 and the second direction DR2 to display the image. The fourth display device 14 may include fourth pixels PX4 arranged in a matrix form along the first direction DR1 and the second direction DR2 to display the image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The connection member SM may be disposed between the first pixel PX1 and the second pixel PX2 adjacent in the first direction DR1. A minimum distance G12 between the first pixels PX1 and the second pixels PX2 adjacent in the first direction DR1 may be the sum of a minimum distance GHS1 between the first pixel PX1 and the connection member SM in the first direction DR1, a minimum distance GHS2 between the second pixel PX2 and the connection member SM in the first direction DR1 and a width GSM1 of the connection member SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the connection member SM in the first direction DR1 may be smaller than the first horizontal separation distance GH1, and the minimum distance GHS2 between the second pixel PX2 and the connection member SM in the first direction DR1 may be smaller than the second horizontal separation distance GH2. Further, the width GSM1 of the connection member SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The connection member SM may be disposed between a third pixel PX3 and a fourth pixel PX4 adjacent in the first direction DR1. A minimum distance G34 between the third pixel PX3 and the fourth pixel PX4 adjacent in the first direction DR1 may be the sum of a minimum distance GHS3 between the third pixel PX3 and the connection member SM in the first direction DR1, a minimum distance GHS4 between the fourth pixel PX4 and the connection member SM in the second direction DR1, and the width GSM1 of the connection member SM in the second direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the connection member SM in the first direction DR1 may be smaller than the third horizontal separation distance GH3, and the minimum distance GHS4 between the fourth pixel PX4 and the connection member SM in the first direction DR1 may be smaller than the fourth horizontal separation distance GH4. Further, in the first direction DR1, the width GSM1 of the connection member SM may be smaller than the third horizontal separation distance GH3 or the fourth horizontal separation distance GH4.

The minimum distance between the first pixels PX1 adjacent in the second direction DR2 may be defined as a first vertical separation distance GV1, and the minimum distance between the third pixels PX3 adjacent in the second direction DR2 may be defined as a third vertical separation distance GV3. The first vertical separation distance GV1 and the third vertical separation distance GV3 may be substantially the same.

The connection member SM may be disposed between the first pixel PX1 and the third pixel PX3 adjacent in the second direction DR2. A minimum distance G13 between the first pixel PX1 and the third pixel PX3 adjacent in the second direction DR2 may be the sum of a minimum distance GVS1 between the first pixel PX1 and the connection member SM in the second direction DR2, a minimum distance GVS3 between the third pixel PX3 and the connection member SM in the second direction DR2, and a width GSM2 of the connection member SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the connection member SM in the second direction DR2 may be smaller than the first vertical separation distance GV1, and the minimum distance GVS3 between the third pixel PX3 and the connection member SM in the second direction DR2 may be smaller than the third vertical separation distance GV3. Further, in the second direction DR2, the width GSM2 of the connection member SM may be smaller than the first vertical separation distance GV1 or the third vertical separation distance GV3.

The minimum distance between the adjacent second pixels PX2 in the second direction DR2 may be defined as a second vertical separation distance GV2, and the minimum distance between the fourth pixels PX4 adjacent in the second direction DR2 may be defined as a fourth vertical separation distance GV4. The second vertical separation distance GV2 and the fourth vertical separation distance GV4 may be substantially the same.

The connection member SM may be disposed between the second pixel PX2 and the fourth pixel PX4 adjacent in the second direction DR2. The minimum distance G24 between the second pixel PX2 and the fourth pixel PX4 adjacent in the second direction DR2 may be the sum of the minimum distance GVS2 between the second pixel PX2 and the connection member SM in the second direction DR2, the minimum distance GVS4 between the fourth pixel PX4 and the connection member SM in the second direction DR2, and the width GSM2 of the connection member SM in the second direction DR2.

A minimum distance G24 between the second pixel PX2 and the fourth pixel PX4 adjacent in the second direction DR2, a second vertical separation distance GV2, and a fourth vertical separation distance GV4 may be substantially the same. To this end, a minimum distance GVS2 between the second pixel PX2 and the connection member SM in the second direction DR2 may be smaller than the second vertical separation distance GV2, and a minimum distance GVS4 between the fourth pixel PX4 and the connection member SM in the second direction DR2 may be smaller than the fourth vertical separation distance GV4. Further, in the second direction DR2, the width GSM2 of the connection member SM may be smaller than the second vertical separation distance GV2 or the fourth vertical separation distance GV4.

As shown FIG. 45, in order to prevent the connection member SM from being recognized between images displayed by the plurality of display devices 11, 12, 13, and 14, the minimum distance between pixels of adjacent display devices may be substantially equal to the minimum distance between each of the pixels.

Figure 46:
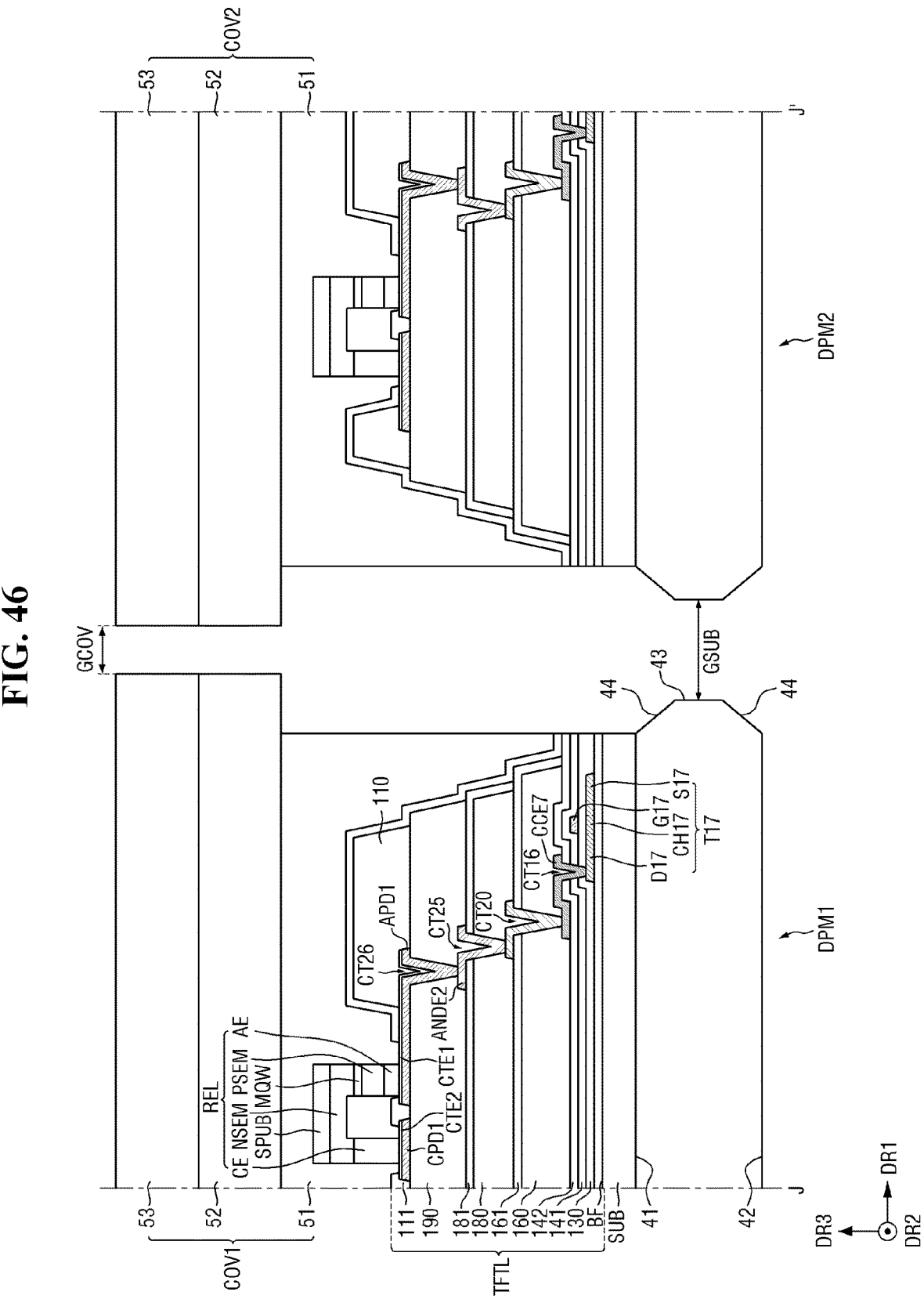
FIG. 46 is a cross-sectional view illustrating an example of a tiled display device taken along the line J-J' of FIG. 45.

FIG. 46 is a cross-sectional view illustrating an example of a tiled display device taken along the line J-J' of FIG. 45.

Referring to FIG. 46, the first display device 11 includes a first display module DPM1 and a first front cover COV1. The second display device 12 includes a second display module DPM2 and a second front cover COV2.

Each of the first display module DPM1 and the second display module DPM2 includes the substrate SUB, a thin film transistor layer TFTL, and a light emitting device layer EML. The thin film transistor layer TFTL and the light emitting device layer EML have already been described in detail with reference to FIGS. 12 to 13. In FIG. 46, a description overlapping with the embodiment of FIGS. 12 to 13 will be omitted.

The substrate SUB may include a first surface 41 on which the thin film transistor layer TFTL is disposed, a second surface 42 opposite the first surface 41, and a first side surface 43 disposed between the first surface 41 and the second surface 42. The first surface 41 may be a front surface or an upper surface of the substrate SUB, and the second surface 42 may be a bottom surface or a lower surface of the substrate SUB.

In addition, the substrate SUB may further include a chamfer surface 44 disposed between the first surface 41 and the first side surface 43 and between the second surface 42 and the first side surface 43. The thin film transistor layer TFTL and the light emitting device layer EML may not be disposed on the chamfer surface 44. Due to the chamfer surface 44, it is possible to prevent damage from the collision of the substrate SUB of the first display device 11 and the substrate of the second display device 12.

The chamfer surface 44 may be disposed between each of the other side surfaces except the first surface 41 and the first side surface 43 and each of the other side surfaces except the second surface 42 and the first side surface 43. For example, when the first display device 11 and the second display device 12 have a rectangular planar shape as shown in FIG. 44, the substrate SUB may be disposed between the first surface 41 and each of the second surface 42, a third surface, and a fourth surface, and between the second surface 42 and each of the first surface 41, the third surface, and the fourth surface.

The first front cover COV1 may be disposed on the chamfer surface 44 of the substrate SUB. That is, the first front cover COV1 may protrude more than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to attach the light emitting device layer EML of the first display module DPM1 to the first front cover COV1. The adhesive member 51 of the second front cover COV2 serves to attach a light emitting device layer EML of the second display module DPM2 to the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent deterioration of image visibility by reflecting external light as it is. Accordingly, the contrast ratio of images displayed by the first display device 10 and the second display device 20 may be increased due to the anti-glare layer 53.

The light transmittance control layer 52 may be designed to reduce transmittance of external light or light reflected from the first display module DPM1 and the second display module DPM2. Accordingly, a gap GSUB between the substrate SUB of the first display module DPM1 and the substrate SUB of the second display module DPM2 may be prevented from being visually recognized from the outside.

The anti-glare layer 53 may be implemented as a polarizing plate, and a light transmittance adjusting layer 52 may be implemented as a phase delay layer, but embodiments of the present specification are not limited thereto.

Because an example of a tiled display device cut along the lines K-K', L-L', and M-M' of FIG. 45 is substantially the same as an example of a tiled display device cut along the line J-J' described in connection with FIG. 46, a description thereof will be omitted.

Figure 47:
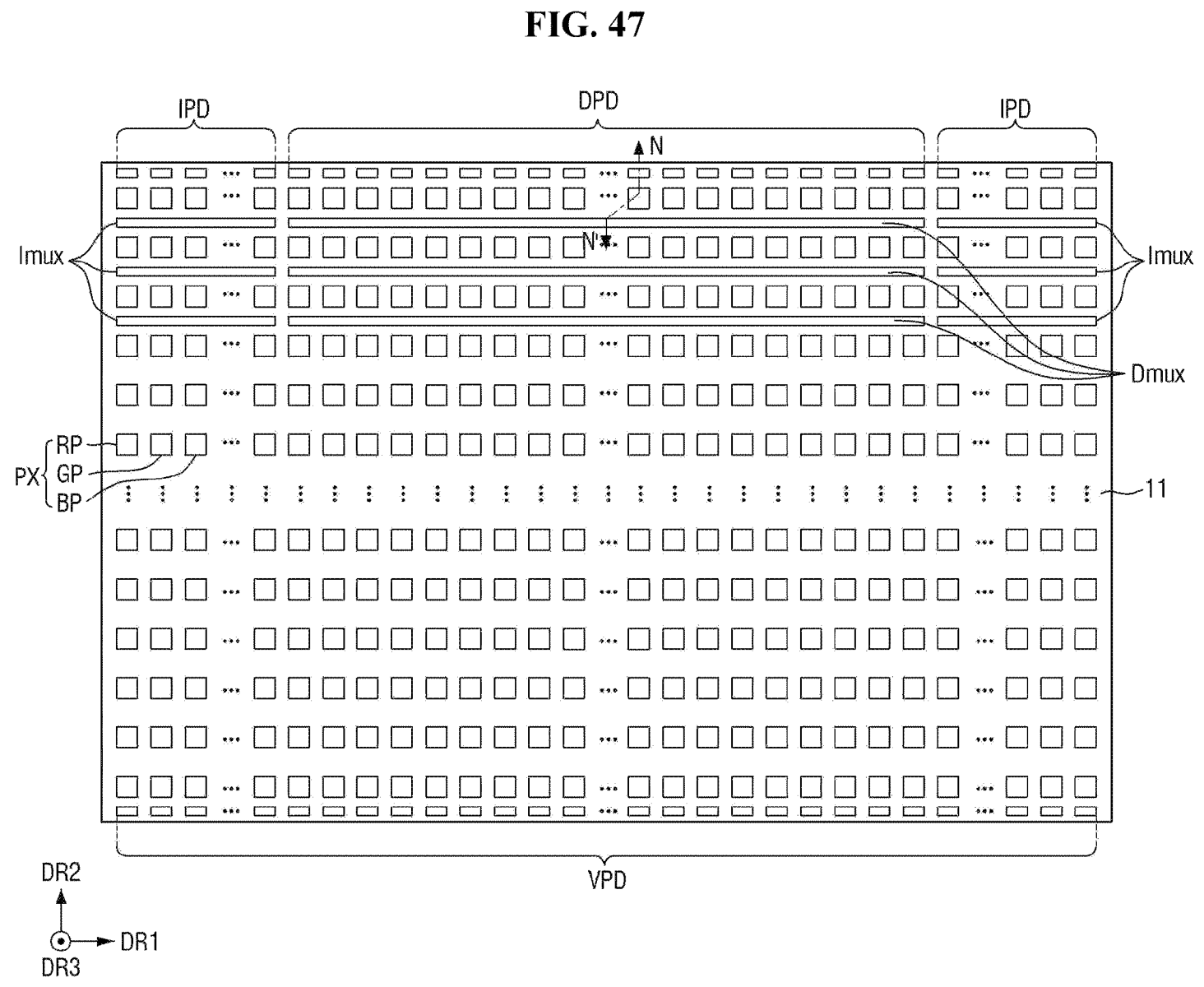
Figure 48:
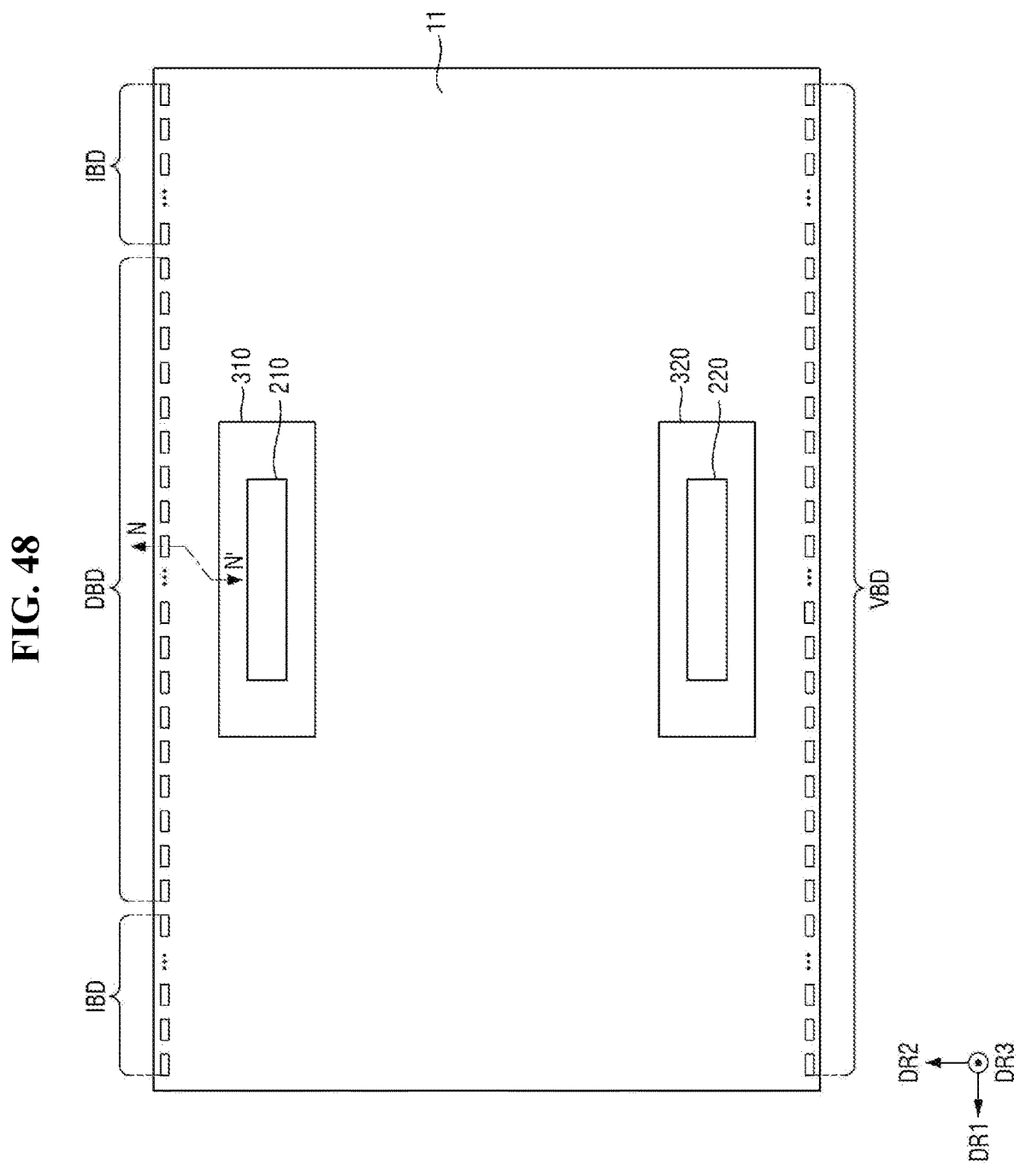
Figure 49:
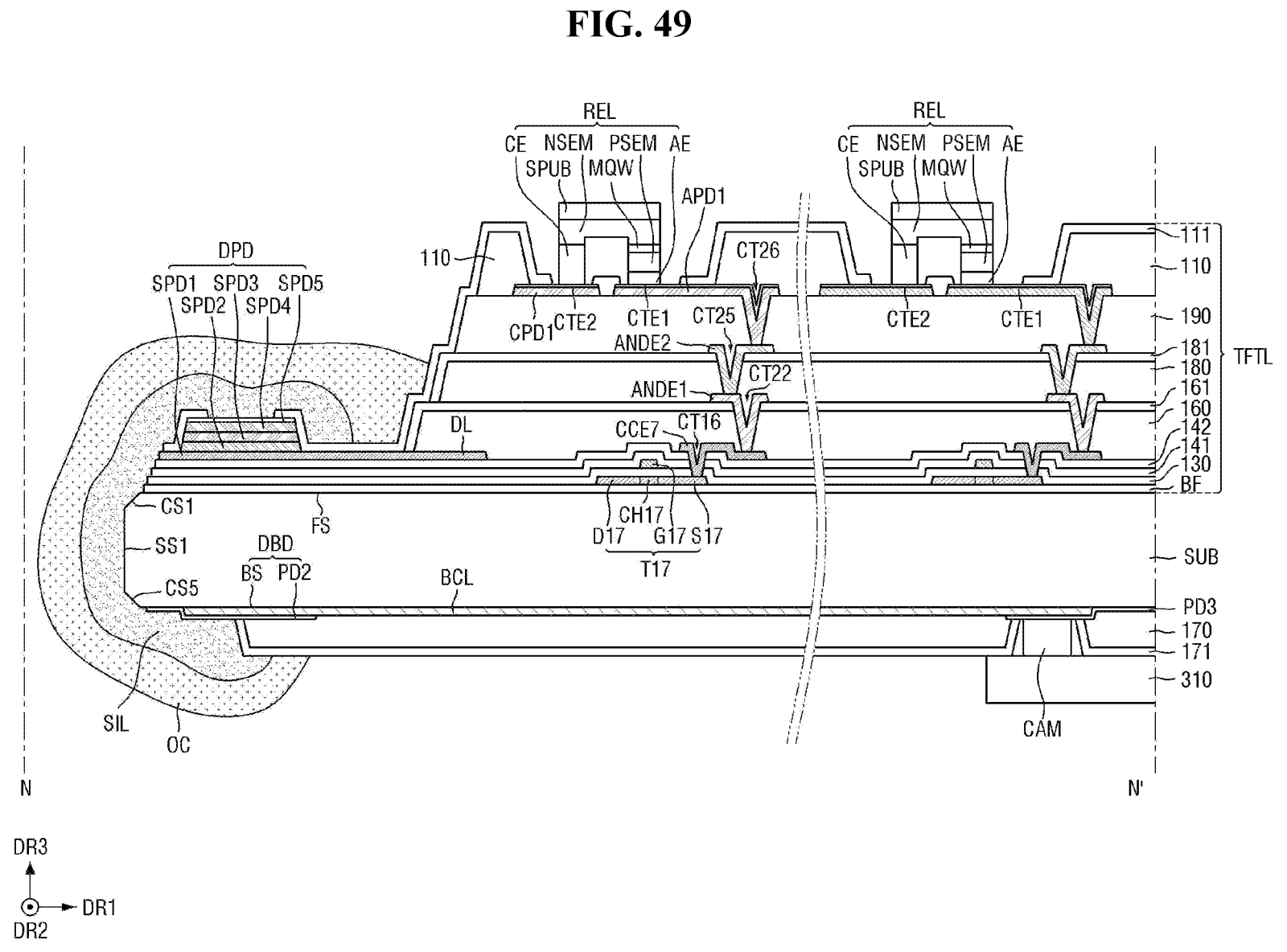

FIG. 47 is a view illustrating a front surface of a first display device according to one or more embodiments. FIG. 48 is a view illustrating a bottom surface of the first display device according to one or more embodiments. FIG. 49 is a cross-sectional view illustrating an example of the first display device taken along the line N-N' of FIGS. 47 and 48.

Referring to FIGS. 47 and 48, the front display pads DPD, the front inspection pads IPD, and the front power pads VPD may be front pads disposed on the front surface of the substrate SUB. The front display pads DPD and the front inspection pads IPD may be disposed on an upper edge of the substrate SUB, and the front power pads VPD may be disposed on a lower edge of the substrate SUB. The front inspection pads IPD may be disposed closer to left and right corners than the front display pads DPD. That is, some of the front inspection pads IPD may be disposed closer to a left edge than the front display pads DPD, and others may be disposed closer to a right edge than the front display pads DPD.

The bottom display pads DBD, the bottom inspection pads IBD, and the bottom power pads VBD may be bottom pads disposed on the bottom surface of the substrate SUB. The bottom display pads DBD and the bottom inspection pads IBD may be disposed on the upper edge of the substrate SUB, and the bottom power pads VBD may be disposed on the lower edge of the substrate SUB. The bottom inspection pads IBD may be disposed closer to left and right corners than the bottom display pads DBD. That is, some of the bottom inspection pads IBD may be disposed closer to the left edge than the bottom display pads DBD, and others may be disposed closer to the right edge than the bottom display pads DBD.

An inspection multiplexer Imux may be disposed between the front inspection pads IPD, the sensing enable signal lines IEL, IEL1, IEL2, the front inspection pads IPD and the sensing lines SENL, SENL1, and SENL2. The inspection multiplexer Imux may connect the front inspection pads IPD and the sensing enable signal lines IEL, IEL1, IEL2 in 1:P (P is an integer greater than or equal to 2), and may connect the front inspection pads IPD and the sensing lines SENL, SENL1, and SENL2 in a 1:P manner. Due to the inspection multiplexer Imux, the number of the front inspection pads IPD may be reduced or minimized.

A display multiplexer Dmux may be disposed between the front display pads DPD and the sub-pixels RP, GP, and BP. The display multiplexer Dmux may connect the data lines DL connected to the front display pads DPD1 and the sub-pixels RP, GP, and BP in 1:Q (Q is an integer greater than or equal to 2). Due to the display multiplexer Dmux, the number of front display pads DPD may be reduced or minimized.

Each of the front display pads DPD may include the first to fifth sub pads SPD1, SPD2, SPD3, SPD4, and SPD5. The front inspection pads IPD and the front power pads VPD may also include first to fifth sub pads SPD1, SPD2, SPD3, SPD4, and SPD5, respectively.

The first source metal layer further may include a first sub pad SPD1, the second source metal layer may further include a second sub pad SPD2, and the third source metal layer may further include a third sub pad SPD3, the fourth source metal layer may further include a fourth sub pad SPD4, and the transparent metal layer may further include a fifth sub pad SPD5.

The second sub pad SPD2 may be disposed on the first sub pad SPD1, and the third sub pad SPD3 may be disposed on the second sub pad SPD2. The fourth sub pad SPD4 may be disposed on the third sub pad SPD3, and the fifth sub pad SPD5 may be disposed on the fourth sub pad SPD4. An upper surface of the first sub pad SPD1 may contact a lower surface of the second sub pad SPD2 and an upper surface of the second sub pad SPD2 may contact a lower surface of the third sub pad SPD3. An upper surface of the third sub pad SPD3 may contact a lower surface of the fourth sub pad SPD4 and an upper surface of the fourth sub pad SPD4 may contact a lower surface of the fifth sub pad SPD5.

A bottom connection line BCL may be disposed on the bottom surface of the substrate SUB. The bottom connection line BCL may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

A second pad PD2 of each of the bottom display pads DBD, the bottom inspection pads IBD, and the bottom power pads VBD is disposed at one end of the bottom connection line BCL, and a third pad PD3 may be disposed at the other end of the bottom connection line BCL. The second pad PD2 and the third pad PD3 may be formed of a transparent conductive oxide such as indium tin oxide (ITO) and indium zinc oxide (IZO).

A fifth planarization layer 170 may be disposed on the bottom surface of the bottom connection line BCL and the substrate SUB. The fifth planarization film 170 may be formed of the organic film such as acrylic resin, epoxy resin, phenolic resin, polyamide resin, polyimide resin, etc. The fifth planarization layer 170 may be referred to as the organic insulating layer.

A fifth inorganic insulating layer 171 may be disposed on the fifth planarization layer 170. The fifth inorganic insulating layer 171 may be formed of the inorganic layer, for example, the silicon nitride layer, the silicon oxynitride layer, the silicon oxide layer, the titanium oxide layer, or the aluminum oxide layer.

A side line SIL may be disposed on a first surface FS, a first chamfered surface CS1, a first side SS1, a fifth chamfered surface CS5, and a second surface BS of the substrate SUB. The side line SIL may be connected to a front display pad DPD disposed on the front display pad DPD disposed on the edge of the first surface FS of the substrate SUB. The side line SIL may be connected to the second pad PD2 disposed on the second pad PD2 disposed on the edge of the second surface BS of the substrate SUB. The side line SIL may contact the first chamfered surface CS1, the first side SS1, and the fifth chamfered surface CS5 of the substrate SUB.

An overcoat layer OC may be disposed on the first surface FS, the first chamfered surface CS1, the first side surface SS1, the fifth chamfered surface CS5, and the second surface BS of the substrate SUB. The overcoat layer OC may be formed to cover the side line SIL. The overcoat layer OC may be formed of the organic film such as acryl resin, epoxy resin, phenolic resin, polyamide resin, polyimide resin, etc.

A first circuit board 310 and a second circuit board 320 may be disposed on the bottom surface of the substrate SUB. The first circuit board 310 may be disposed close to the upper edge of the substrate SUB, and the second circuit board 320 may be disposed close to the lower edge of the substrate. Each of the first circuit board 310 and the second circuit board 320 may be connected to the third pad PD3 of the bottom connection line BCL that is not covered but exposed by the fifth planarization layer 170 and the fifth inorganic insulating layer 171 through the conductive adhesive member CAM. The conductive adhesive member CAM may be the anisotropic conductive film or the anisotropic conductive paste.

A first driving circuit 210 may be mounted on the first circuit board 310, and a second driving circuit 220 may be mounted on the second circuit board 320. The first driving circuit 210 and the second driving circuit 220 may be integrated circuits.

The first driving circuit 210 may output the data voltages to the data lines DL through the first circuit board 310, the bottom connection line BCL, a bottom display pad DBD, the side line SIL, a front display pad DPD, and the display multiplexer Dmux. In addition, the first driving circuit 210 may output the inspection enable signals to the sensing enable signal lines IEL, IEL1, and IEL2 through the first circuit board 310, the bottom connection line BCL, a bottom inspection pad IBD, the side line SIL, a front inspection pad IPD, and an inspection multiplexer Imux, and may sense the sensing voltages of the sensing lines SENL, SENL1, and SENL2.

The second driving circuit 220 may output the first power voltage to the first power supply line VDL1, the second power voltage to the second power supply line VSL, and the second power supply voltage to the third power supply line VDL2, the initialization voltage to the initialization voltage line VIL, and the gate-off voltage to the gate-off voltage line VGHL through the second circuit board 320, the bottom connection line BCL, a bottom power pad VBD, the side line SIL, and a front power pad VPD. The second driving circuit 220 may be a direct current-direct current converter.

Figure 50:
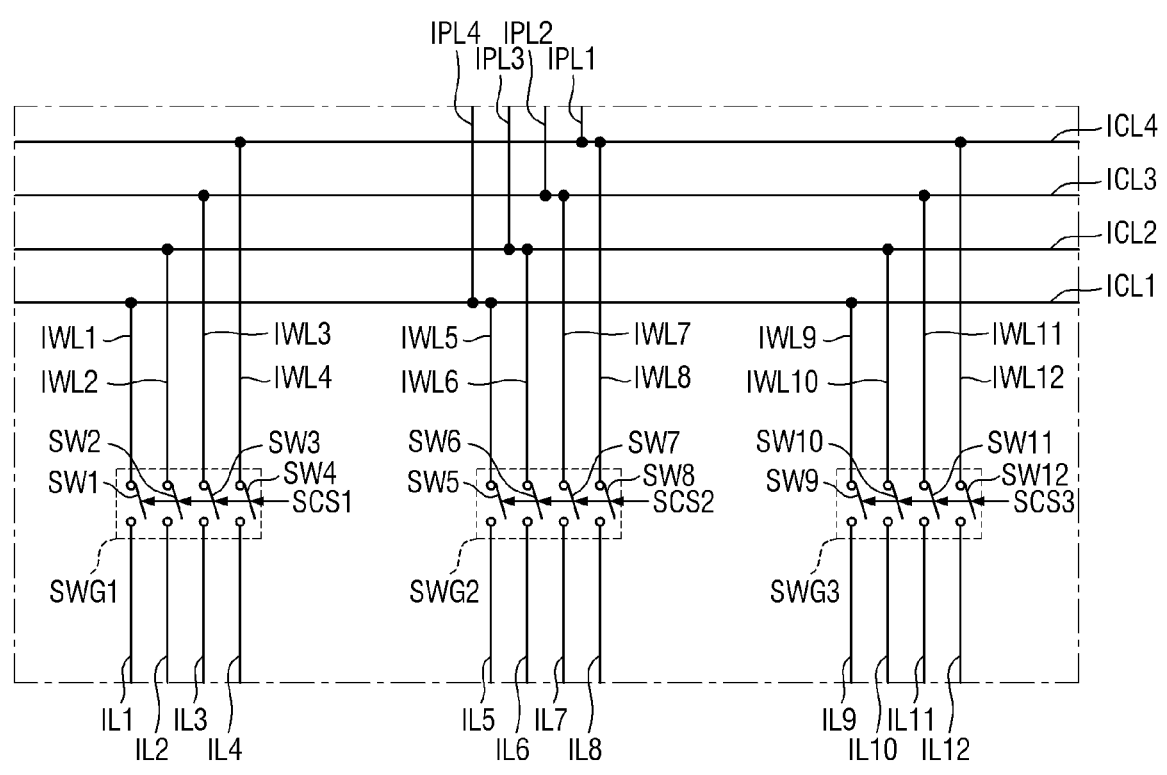
FIG. 50 is a diagram illustrating an example of a test multiplexer according to one or more embodiments.

FIG. 50 is a diagram illustrating an example of a test multiplexer according to one or more embodiments.

Referring to FIG. 50, the inspection multiplexer Imux includes inspection pad lines IPL1, IPL2, IPL3, IPL4, inspection connection lines ICL1, ICL2, ICL3, ICL4, inspection switch lines IWL1 to IWL12, and inspection lines IL1 to IL12. Also, the inspection multiplexer Imux includes a first switch group SWG1, a second switch group SWG2, and a third switch group SWG3. In FIG. 50 illustrates that the inspection multiplexer Imux connects the front inspection pads IPD and the inspection lines IL1 to IL12 in a 1:3 ratio, but embodiments of the present specification is not limited thereto. The inspection lines IL1 to IL12 may correspond to the inspection enable signal lines IEL, IEL1, and IEL2 or may correspond to the sensing lines SENL, SENL1, and SENL2.

The inspection pad lines IPL1, IPL2, IPL3, and IPL4 may be extended in the second direction DR2. The inspection pad lines IPL1, IPL2, IPL3, and IPL4 may be one-to-one connected to the front inspection pads IPD and the inspection connection lines ICL1, ICL2, ICL3, and ICL4. That is, the inspection pad lines IPL1, IPL2, IPL3, and IPL4 may be respectively connected to the front inspection pads IPD and the inspection connection lines ICL1, ICL2, ICL3, and ICL4.

The inspection connection lines ICL1, ICL2, ICL3, and ICL4 may be extended in the first direction DR1. The inspection connection lines ICL1, ICL2, ICL3, and ICL4 may be connected to the inspection switch lines IWL1 to IWL12. A first inspection connection line ICL1 may be connected to a 4 k-3$^{th}$ (k is a positive integer) inspection switch line. For example, the first inspection connection line ICL1 may be connected to a first inspection switch line IWL1, a fifth inspection switch line IWL5, and a ninth inspection switch line IWL9. A second inspection connection line ICL2 may be connected to the 4 k-2$^{th}$ inspection switch line. The second inspection connection line ICL2 may be connected to a second inspection switch line IWL2, a sixth inspection switch line IWL6, and a tenth inspection switch line IWL10. A third inspection connection line ICL3 may be connected to the 4 k-1$^{th}$ inspection switch line. The third inspection connection line ICL3 may be connected to a third inspection switch line IWL3, a seventh inspection switch line IWL7, and a eleventh inspection switch line IWL11. A fourth inspection connection line ICL4 may be connected to the 4 k inspection switch line. The fourth inspection connection line ICL4 may be connected to a fourth inspection switch line IWL4, an eighth inspection switch line IWL8, and a twelfth inspection switch line IWL12.

The first switch group SWG1 may connect the first to fourth inspection lines IL1 to IL4 to the first to fourth inspection pad lines IPL1 to IPL4 through a first switch control signal SCS1. Accordingly, the first to fourth inspection lines IL1 to IL4 may be connected to the first to fourth inspection pad lines IPL1 to IPL4 through the first switch group SWG1.

The first switch group SWG1 may include the first to fourth switches SW1 to SW4. The first switch SW1 may be disposed between a first inspection line IL1 and the first inspection switch line IWL1. The second switch SW2 may be disposed between a second inspection line IL2 and the second inspection switch line IWL2. The third switch SW3 may be disposed between a third inspection line IL3 and the third inspection switch line IWL3. The fourth switch SW4 may be disposed between a fourth inspection line IL4 and the fourth inspection switch line IWL4.

The second switch group SWG2 may connect the fifth to eighth inspection lines IL5 to IL8 to the first to fourth inspection pad lines IPL1 to IPL4 through a second switch control signal SCS2. Accordingly, the fifth to eighth inspection lines IL5 to IL8 may be connected to the first to fourth inspection pad lines IPL1 to IPL4 through the second switch group SWG2.

The second switch group SWG2 may include the fifth to eighth switches SW5 to SW8. The fifth switch SW5 may be disposed between a fifth inspection line IL5 and the fifth inspection switch line IWL5. The sixth switch SW6 may be disposed between a sixth inspection line IL6 and the sixth inspection switch line IWL6. The seventh switch SW7 may be disposed between a seventh inspection line IL7 and the seventh inspection switch line IWL7. The eighth switch SW8 may be disposed between an eighth inspection line IL8 and the eighth inspection switch line IWL8.

The third switch group SWG3 may connect the ninth to twelfth inspection lines IL9 to IL12 to the first to fourth inspection pad lines IPL1 to IPL4 through the third switch control signal SCS3. Accordingly, the ninth to twelfth inspection lines IL9 to IL12 may be connected to the first to fourth inspection pad lines IPL1 to IPL4 through the third switch group SWG3.

The third switch group SWG3 may include the ninth to twelfth switches SW9 to SW12. The ninth switch SW9 may be disposed between a ninth inspection line IL9 and the ninth inspection switch line IWL9. The tenth switch SW10 may be disposed between a tenth inspection line IL10 and the tenth inspection switch line IWL10. The eleventh switch SW11 may be disposed between an eleventh inspection line IL11 and the eleventh inspection switch line IWL11. The twelfth switch SW12 may be disposed between a twelfth inspection line IL12 and the twelfth inspection switch line IWL12.

A period in which the first to fourth switches SW1 to SW4 of the first switch group SWG1 are turned-on through the first switch control signal SCS1, and the fifth to eighth switches SW5 to SW8 of the second switch group SWG2 are turned-on through the second switch control signal SCS2, and the ninth to twelfth switches SW9 to SW12 of the third switch group SWG3 are turned-on through the third switch control signal SCS3 may be different from each other. For this reason, the inspection pad lines IPL1 to IPL4 may be connected to the first to fourth inspection lines IL1 to IL4 through the first switch group SWG1, and may be connected to the fifth to eighth inspection lines IL5 to IL8 through the second switch group SWG2, and may be connected to the ninth to twelfth inspection lines IL9 to IL12 through the third switch group SWG3. Therefore, the inspection pad lines IPL1 to IPL4 may be sequentially connected to the first to fourth inspection lines IL1 to IL4, the fifth to eighth inspection lines IL5 to IL8, and the ninth to twelfth inspection lines IL9 to IL12 through the first to third switch groups SWG1, SWG2, and SWG3. That is, the inspection multiplexer Imux may connect the front inspection pads IPD and the inspection lines IL1 to IL12 in a 1:3 ratio.

Because the display multiplexer Dmux may be implemented similarly to the inspection multiplexer Imux described with reference to FIG. 50, a detailed description of the display multiplexer Dmux will be omitted.

Figure 51:
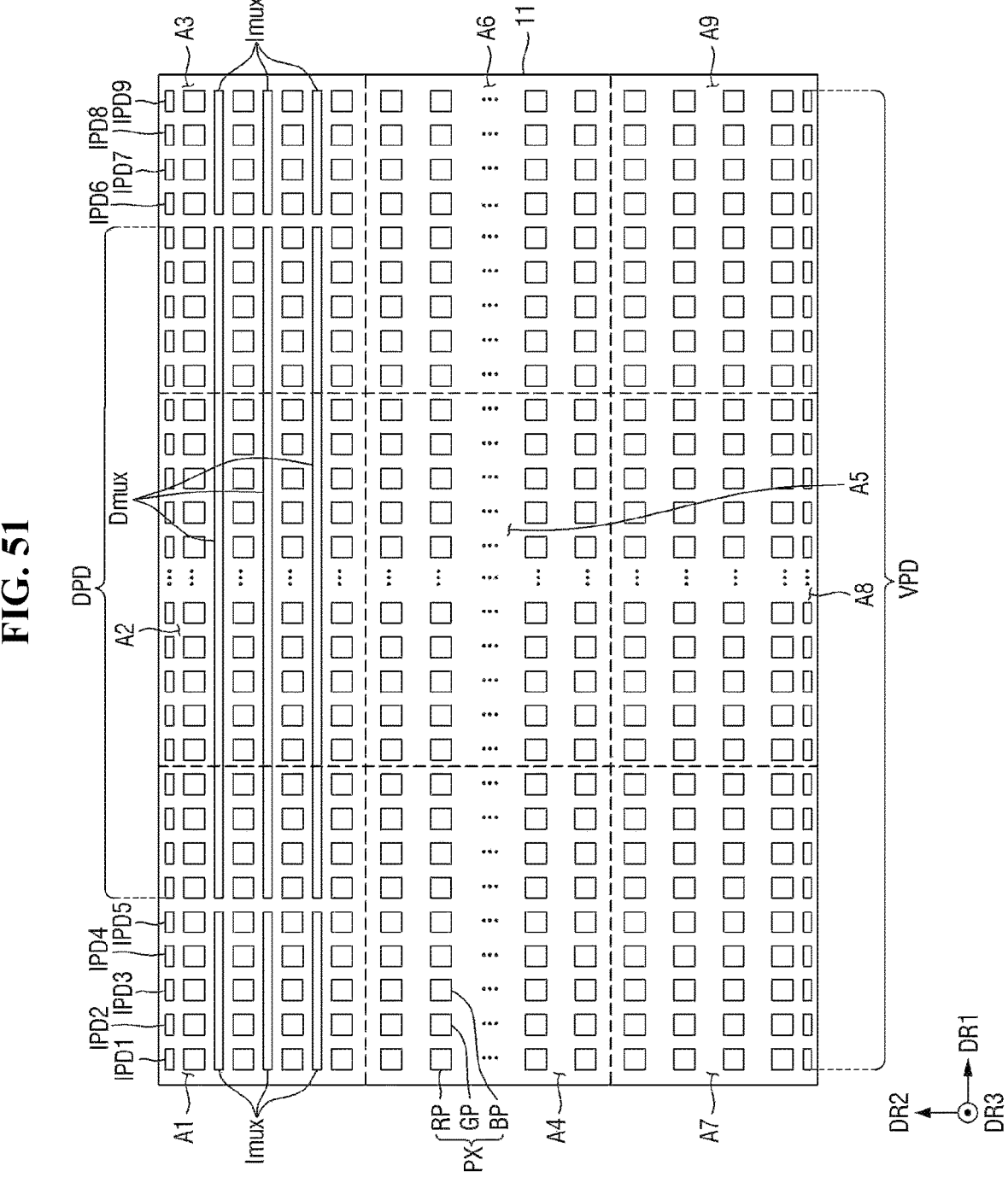
FIG. 51 is a plan view illustrating the front surface of the first display device according to one or more embodiments.

FIG. 51 is a view illustrating the front surface of the first display device according to one or more embodiments.

Referring to FIG. 51, the front surface of the first display device 11 may be divided into a plurality of areas A1 to A9. For example, the first display device 11 may be divided into nine areas A1 to A9. The plurality of areas A1 to A9 may have a uniform area. The plurality of areas A1 to A9 may include the same number of pixels PX.

In each of the plurality of areas A1 to A9, the inspection lines (or the sensing lines SENL, SENL1, and SENL2) may be connected to one of the front inspection pads among the front inspection pads IPD1 to IPD9. For example, the inspection lines of the first area A1 may be connected to the first front inspection pad IPD1, the inspection lines of the second area A2 may be connected to the second front inspection pad IPD2, the inspection lines of the third area A3 may be connected to the third front inspection pad IPD3, the inspection lines of the fourth area A4 may be connected to the fourth front inspection pad IPD4, and the inspection lines of the fifth area A5 may be connected to the fifth front inspection pad IPD5. In addition, the inspection lines of the sixth area A6 may be connected to the sixth front inspection pad IPD6, the inspection lines of the seventh area A7 may be connected to the seventh front inspection pad IPD7, the inspection lines of the eighth area A8 may be connected to the eighth front inspection pad IPD8, and the inspection lines of the ninth area A9 may be connected to the ninth front inspection pad IPD9.

In this case, it may be determined whether at least one of the light emitting devices of all sub-pixels RP, GP, and BP in each of the plurality of areas A1 to A9 is short-circuited with another electrode or wiring. That is, it may be determined in which area the light emitting device of the sub-pixel is short-circuited with another electrode or wiring while reducing or minimizing the number of front inspection pads.

Figure 52:
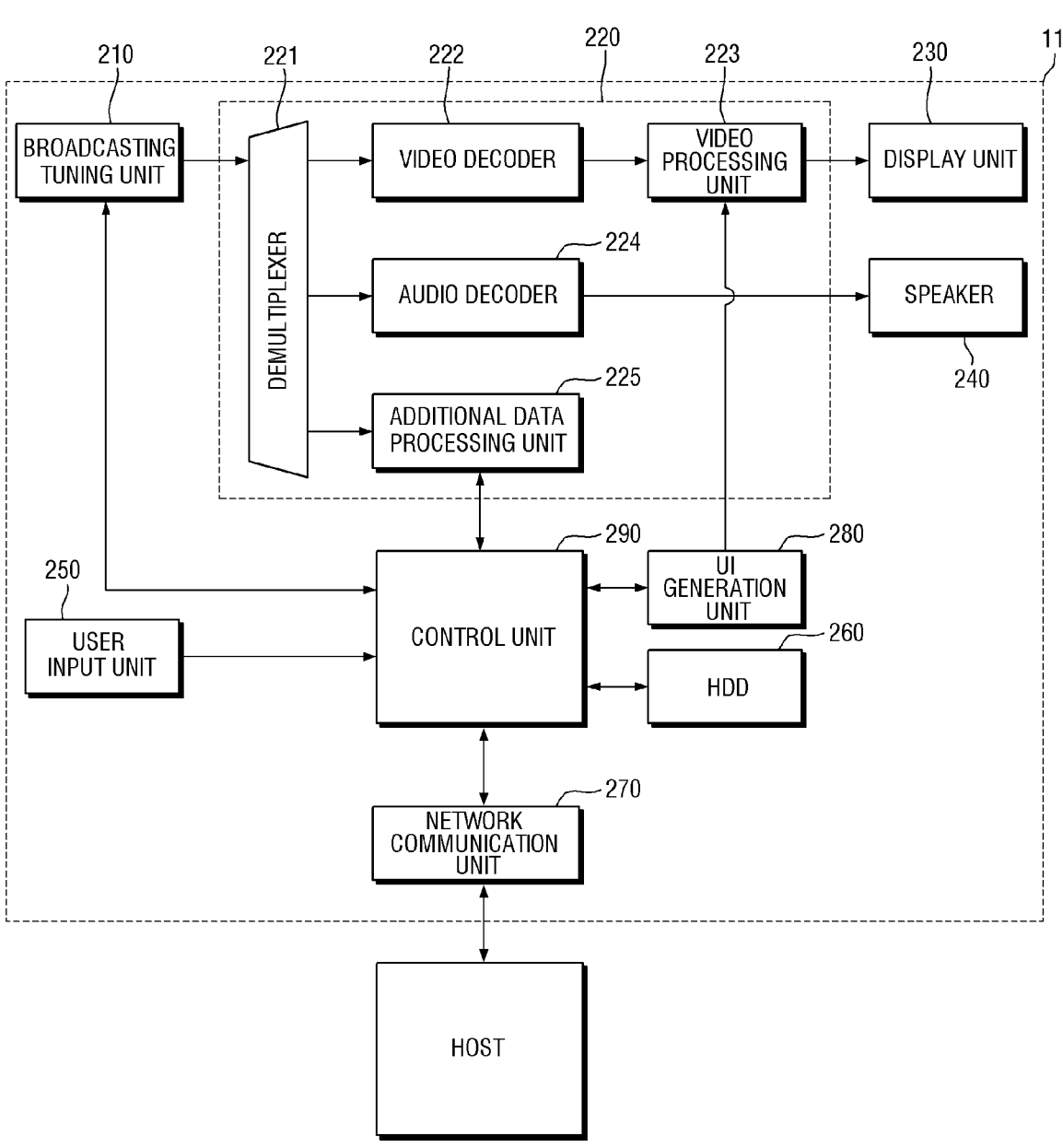
FIG. 52 is a block diagram illustrating a tiled display device according to one or more embodiments.
Figure 53:
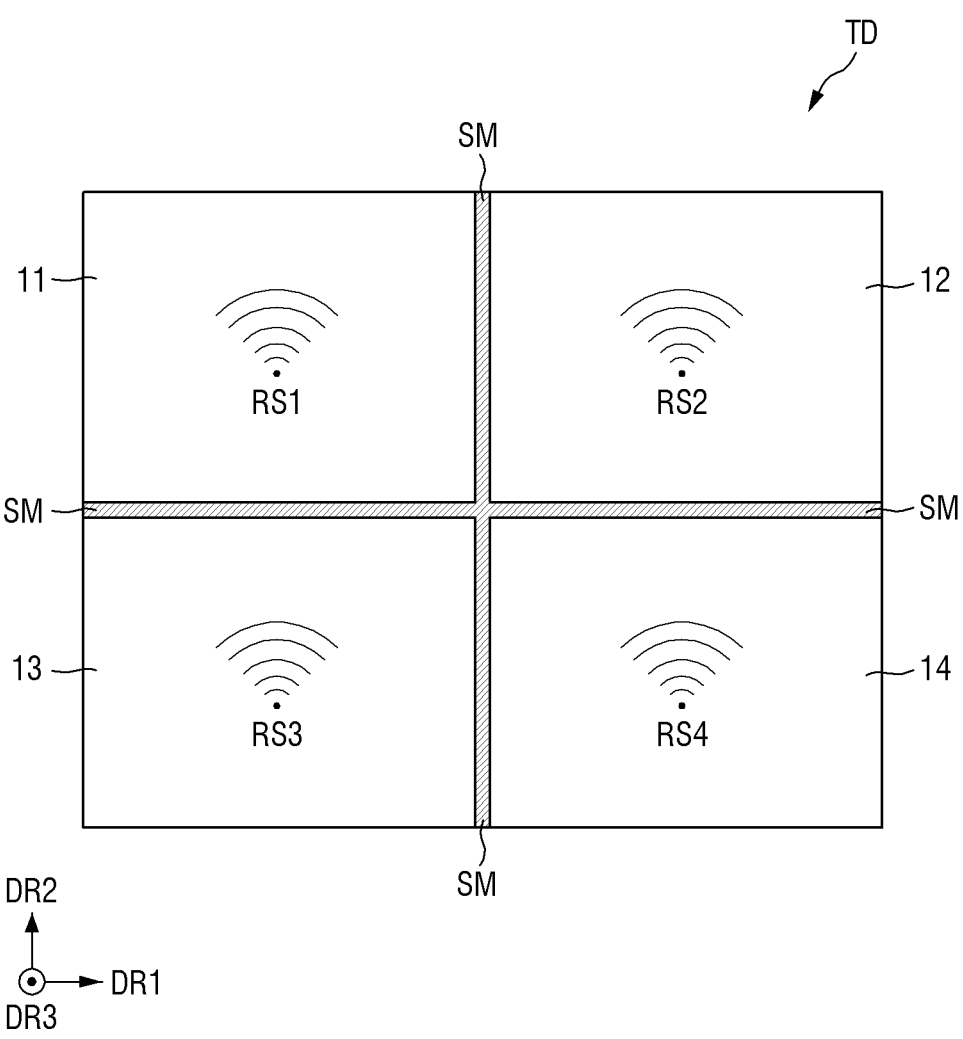
FIG. 53 is a diagram illustrating wireless communication between a plurality of display devices of a tiled display device according to one or more embodiments.

FIG. 52 is a block diagram illustrating a tiled display device according to one or more embodiments. FIG. 53 is a diagram illustrating wireless communication between a plurality of display devices of a tiled display device according to one or more embodiments.

In FIG. 52, the first display device 11 and a host system HOST are illustrated for convenience of description.

Referring to FIGS. 52 and 53, the tiled display device TD according to one or more embodiments may include the host system HOST, a broadcast tuning unit 210, a signal processing unit 220, a display unit 230, a speaker 240, and a user input unit 250, an HDD 260, a network communication unit 270, a UI generating unit 280, and a control unit 290.

The host system HOST may be implemented as one of a television system, a home theater system, a set-top box, a navigation system, a DVD player, a Blu-ray player, a personal computer PC, a mobile phone system, and a tablet.

A user's command may be input to the host system HOST in various formats. For example, the host system HOST may receive a command by a user's touch input. Alternatively, the user's command may be input to the host system HOST by a keyboard input or a button input of a remote controller.

The host system HOST may receive an original video data corresponding to the original image from the outside. The host system HOST may divide the original video data by the number of display devices. For example, the host system HOST corresponds to the first display device 11, the second display device 12, the third display device 13, and the fourth display device 14, so that the original video data may be divided into a first video data corresponding to a first image, a second video data corresponding to a second image, a third video data corresponding to a third image, and a fourth video data corresponding to a fourth image. The host system HOST may transmit the first video data to the first display device 11, the second video data to the second display device 12, the third video data to the third display device 13, and the fourth video data to the fourth display device 14.

The first display device 11 may display the first image according to the first video data, and the second display device 12 may display the second image according to the second video data. Also, the third display device 13 may display the third image according to the third video data, and the fourth display device 14 may display the fourth image according to the fourth video data. Accordingly, a user may view the original image in which the first to the fourth images displayed on the first to fourth display devices 11, 12, 13, and 14 are combined.

The first display device 11 may include a broadcast tuning unit 210, a signal processing unit 220, a display unit 230, a speaker 240, a user input unit 250, an HDD 260, a network communication unit 270, a UI generator 280, and a controller 290.

The broadcast tuning unit 210 may receive a broadcast signal of the corresponding channel through an antenna by tuning a suitable channel frequency (e.g., a predetermined channel frequency) under the control of the controller 290. The broadcast tuning unit 210 may include a channel detection module and an RF demodulation module.

The broadcast signal demodulated by the broadcast tuning unit 210 is processed by the signal processing unit 220 and output to the display unit 230 and the speaker 240. The signal processing unit 220 may include a demultiplexer 221, a video decoder 222, a video processing unit 223, an audio decoder 224, and an additional data processing unit 225.

The demultiplexer 221 separates the demodulated broadcast signal into a video signal, an audio signal, and additional data. The separated video signal, audio signal, and additional data are restored by the video decoder 222, the audio decoder 224, and the additional data processing unit 225, respectively. In this case, the video decoder 222, the audio decoder 224, and the additional data processing unit 225 restore a decoding format corresponding to the encoding format when the broadcast signal is transmitted.

On the other hand, the decoded video signal is converted by the video processing unit 223 into vertical frequency, resolution, aspect ratio, etc. that meet the output standard of the display unit 230, and the decoded audio signal is output to the speaker 240.

The display unit 230 includes a display panel 100 on which an image is displayed and a panel driver controlling driving of the display panel 100.

The user input unit 250 may receive a signal transmitted by the host system HOST. The user input unit 250 allows the user to select not only data related to channel selection and User Interface (UI) menu selection and manipulation of a channel transmitted by the host system HOST, but also commands related to communication with other display devices 11, 12, 13 and 14. Also, the user input unit 250 allows data for input to be entered.

The storage unit 260 stores various software programs including OS programs, recorded broadcast programs, moving pictures, photos, and other data. The storage unit 260 may be made of a storage medium such as a hard disk or non-volatile memory.

The network communication unit 270 is for short-distance communication with the host system HOST and other display devices 11, 12, 13, and 14. The network communication unit 270 may be implemented a communication module including an antenna pattern that may implement mobile communication, data communication, Bluetooth, RF, Ethernet, etc.

The network communication unit 270 may transmit and receive wireless signals to and from at least one of a base station, an external terminal, and a server on a mobile communication network constructed according to technical standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.).

The network communication unit 270 may transmit and receive wireless signals in a communication network according to wireless Internet technologies. The wireless Internet technologies include, for example, WLAN (Wireless LAN), Wi-Fi (Wireless-Fidelity), Wi-Fi (Wireless Fidelity) Direct, DLNA (Digital Living Network Alliance), WiBro (Wireless Broadband), WiMAX (World Interoperability for Microwave Access), High Speed Downlink Packet Access (HSDPA), High Speed Uplink Packet Access (HSUPA), Long Term Evolution (LTE), Long Term Evolution-Advanced (LTE-A), etc. The antenna electrodes AE transmit and receive data according to at least one wireless Internet technology within a range including even Internet technologies not listed above.

Further, each of the first to fourth display devices 11, 12, 13, and 14 may include antenna electrodes AE as shown in FIG. 31, thereby transmitting and receiving wireless signals to and from each other. The first display device 11 may transmit a first wireless signal RS1, and the second to fourth display devices 12, 13, and 14 may receive the first wireless signal RS1. Also, the second display device 12 may transmit a second wireless signal RS2, and the first, third, and fourth display devices 11, 13, and 14 may receive the second wireless signal RS2. In addition, the third display device 13 may transmit a third wireless signal RS3, and the first, second, and fourth display devices 11, 12, and 14 receive the third wireless signal RS3. Also, the fourth display device 14 may transmit a fourth wireless signal RS4, and the first to third display devices 11, 12, and 13 may receive the fourth wireless signal RS4.

The UI generator 280 that generates a UI menu for wireless communication with the host system HOST and the second to fourth display devices 12, 13, and 14 may be implemented by an algorithm code and an OSD IC. The UI menu for communication with the host system HOST and the second to fourth display devices 12, 13, and 14 may be a menu for designating a counterpart digital TV for communication and selecting a desired function.

The control unit 290 is responsible for overall control of the first display device 11 and responsible for communication control of the host system HOST and the second through fourth display devices 12 through 14. In the control unit 290, a corresponding algorithm code stores for control and the corresponding algorithm code may be implemented by a micro controller unit (MCU).

According to the input and selection of the user input unit 250, the control unit 290 controls to transmit the corresponding control command and data to the host system HOST and the second to fourth display devices 12, 13, and 14 through the network communication unit 270. When a suitable control command (e.g., a predetermined control command) and data are received from the host system HOST and the second to fourth display devices 12, 13, and 14, the control unit 290 performs an operation according to the control command.

What is claimed is:

1. A display device comprising:
a plurality of sub-pixels,
wherein a sub-pixel of the plurality of sub-pixels comprises:
    a first pad electrode and a second pad electrode on a substrate and spaced from each other in a plan view;
    a light emitting device on the first pad electrode and the second pad electrode; and
    a first inspection transistor overlapping the first pad electrode in a thickness direction of the substrate,
    wherein the first inspection transistor overlaps the light emitting device in the thickness direction of the substrate,
    wherein the sub-pixel further comprises a second inspection transistor overlapping the second pad electrode in the thickness direction of the substrate, and
    wherein the second inspection transistor overlaps the light emitting device in the thickness direction of the substrate.

2. The display device of claim 1, wherein a gate electrode of the first inspection transistor and a gate electrode of the second inspection transistor are connected to an inspection enable signal line.

3. The display device of claim 1, wherein a gate electrode of the first inspection transistor is connected to a first inspection enable signal line, and the gate electrode of the second inspection transistor is connected to a second inspection enable signal line.

4. The display device of claim 1, wherein a first electrode of the first inspection transistor and a first electrode of the second inspection transistor are connected to a first horizontal power supply line configured to receive a first power voltage.

5. The display device of claim 4, further comprising:
a first data line connected to the sub-pixel and configured to receive a first data voltage; and
a second data line connected to the sub-pixel and configured to receive a second data voltage;
wherein the sub-pixel further comprises:
a first pixel driver comprising a first transistor configured to control a control current according to the first data voltage of the first data line;
a second pixel driver comprising a second transistor configured to control a driving current flowing from a first power supply line configured to receive the first power voltage to the light emitting device according to the second data voltage of the second data line; and
a third pixel driver comprising a third transistor configured to adjust a period in which the driving current is applied to the light emitting device according to the control current of the first pixel driver.

6. The display device of claim 1, wherein a second electrode of the first inspection transistor and a second electrode of the second inspection transistor are connected to a second horizontal power supply line configured to receive a second power voltage.

7. The display device of claim 6, wherein a first electrode of the light emitting device is connected to the first pad electrode, a second electrode of the light emitting device is connected to the second pad electrode, and the second pad electrode is connected to a second power supply line configured to receive the second power voltage.

8. The display device of claim 1, wherein a first electrode of the first inspection transistor is connected to a horizontal voltage line, and a second electrode of the first inspection transistor is connected to a sense line.

9. The display device of claim 8, wherein the horizontal voltage line is configured to receive a predetermined voltage.

10. The display device of claim 8, wherein a first electrode of the second inspection transistor is connected to the horizontal voltage line, and a second electrode is connected to the sensing line.

11. The display device of claim 10, wherein the light emitting device is a flip chip type micro light emitting diode device.

12. A display device comprising:
a plurality of sub-pixels,
wherein a sub-pixel of the plurality of sub-pixels comprises:
    a first pad electrode and a second pad electrode on a substrate and spaced from each other in a plan view;
    a light emitting device on the first pad electrode and the second pad electrode; and
    a first resistor unit overlapping the first pad electrode in a thickness direction of the substrate,
    wherein the first resistor unit overlaps the light emitting device in the thickness direction of the substrate.

13. The display device of claim 12, further comprising:
a first horizontal voltage line connected to one end of the first resistor unit; and
a first sensing line connected to other end of the first resistor unit.

14. The display device of claim 13, wherein the sub-pixel further comprises a second resistor unit overlapping the second pad electrode in the thickness direction of the substrate, and
wherein the second resistor unit overlaps the light emitting device in the thickness direction of the substrate.

15. The display device of claim 14, further comprising:
a second horizontal voltage line connected to one end of the second resistor unit; and
a second sensing line connected to other end of the second resistor unit.

16. The display device of claim 15, wherein a same voltage is supplied to the first horizontal voltage line and the second horizontal voltage line.

17. The display device of claim 12, wherein the sub-pixel further comprises an inspection transistor overlapping the second pad electrode in the thickness direction of the substrate, and
wherein the inspection transistor overlaps the light emitting device in the thickness direction of the substrate.

18. The display device of claim 17, wherein a gate electrode of the inspection transistor is connected to an inspection enable signal line, and a first electrode of the inspection transistor is connected to a horizontal voltage line, and a second electrode of the inspection transistor is connected to a sense line.

19. A display device comprising:

a plurality of sub-pixels, wherein a sub-pixel of the plurality of sub-pixels comprises:

a first pad electrode and a second pad electrode on a substrate and spaced from each other in a plan view;

a light emitting device on the first pad electrode and the second pad electrode; and a first dummy transistor overlapping the first pad electrode in a thickness direction of the substrate, wherein the first dummy transistor overlaps the light emitting device in the thickness direction of the substrate, and wherein a gate electrode of the first dummy transistor is connected to a floating line or a gate-off voltage line configured to receive a gate-off voltage.

20. The display device of claim 19, wherein the sub-pixel further comprises a second dummy transistor overlapping the second pad electrode in the thickness direction of the substrate, and wherein the second dummy transistor overlaps the light emitting device in the thickness direction of the substrate.

21. The display device of claim 20, wherein a gate electrode of the second dummy transistor is connected to the floating line or the gate-off voltage line.

22. The display device of claim 19, wherein the light emitting device is a flip chip type micro light emitting diode device.

23. A tiled display device comprising:

a plurality of display devices; and a connection member between the plurality of display devices;

wherein a first display device from among the plurality of display devices comprises a plurality of sub-pixels, wherein a sub-pixel of the plurality of sub-pixels comprises, a first pad electrode and a second pad electrode on a substrate and spaced from each other in a plan view;

a light emitting device on the first pad electrode and the second pad electrode;

a first thin film transistor overlapping the first pad electrode in a thickness direction of the substrate; and a second thin film transistor overlapping the second pad electrode in the thickness direction of the substrate, wherein each of the first thin film transistor and the second thin film transistor overlaps the light emitting device in the thickness direction of the substrate.

24. The tiled display device of claim 23, wherein the light emitting device is a flip chip type micro light emitting diode device.

25. The tiled display device of claim 23, wherein the first display device further comprises:

a board;

a pad on a first surface of the substrate; and a side line on the first surface of the substrate, a second surface opposite to the first surface, and one side between the first surface and the second surface, and connected to the pad.

26. The tiled display device of claim 25, wherein the substrate comprises glass.

27. The tiled display device of claim 25, wherein the first display device further comprises:

a connection line on the second surface of the substrate; and a flexible film connected to the connection line through a conductive adhesive member, wherein the side line is connected to the connection line.

28. The tiled display device of claim 25, wherein the plurality of display devices are arranged in a matrix in M (M is a positive integer) number of rows and N (N is a positive integer) number of columns.

* * * * *